(12) United States Patent
Kang et al.

(10) Patent No.: US 11,923,362 B2
(45) Date of Patent: Mar. 5, 2024

(54) INTEGRATED CIRCUIT (IC) DEVICE

(71) Applicant: SAMSUNG ELECTRONICS CO., LTD., Suwon-si (KR)

(72) Inventors: Myung-gil Kang, Suwon-si (KR); Beom-jin Park, Hwaseong-si (KR); Geum-jong Bae, Suwon-si (KR); Dong-won Kim, Seongnam-si (KR); Jung-gil Yang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/314,569

(22) Filed: May 9, 2023

(65) Prior Publication Data
US 2023/0282642 A1  Sep. 7, 2023

Related U.S. Application Data

(63) Continuation of application No. 17/886,530, filed on Aug. 12, 2022, now Pat. No. 11,676,964, which is a
(Continued)

(30) Foreign Application Priority Data

Sep. 10, 2018 (KR) .................. 10-2018-0107892

(51) Int. Cl.
*H01L 27/088* (2006.01)
*H01L 21/308* (2006.01)
(Continued)

(52) U.S. Cl.
CPC ...... *H01L 27/0886* (2013.01); *H01L 21/3086* (2013.01); *H01L 21/823431* (2013.01);
(Continued)

(58) Field of Classification Search
CPC ............ H01L 27/0886; H01L 29/0673; H01L 29/0847; H01L 29/66545; H01L 29/66795;
(Continued)

(56) References Cited

U.S. PATENT DOCUMENTS 6,921,700 B2  7/2005  Orlowski et al.
7,176,041 B2  2/2007  Lee et al.
(Continued)

FOREIGN PATENT DOCUMENTS

CN         104126228 A     10/2014
CN         108511524 A      9/2018
KR   10-2007-0068736 A      7/2007

OTHER PUBLICATIONS

CN Communication dated Jul. 14, 2023 from the Chinese Patent Office in CN Patent Application No. 201910572864.3.

*Primary Examiner* — Nathan W Ha
(74) *Attorney, Agent, or Firm* — Sughrue Mion, PLLC

(57) ABSTRACT

An integrated circuit (IC) device includes: a fin-type active area protruding from a substrate and extending in a first horizontal direction; a first nanosheet disposed above an upper surface of the fin-type active area with a first separation space therebetween; a second nanosheet disposed above the first nanosheet with a second separation space therebetween; a gate line extending on the substrate in a second horizontal direction intersecting the first horizontal direction, at least a portion of the gate line being disposed in the second separation space; and a bottom insulation structure disposed in the first separation space.

20 Claims, 54 Drawing Sheets

Related U.S. Application Data continuation of application No. 17/150,712, filed on Jan. 15, 2021, now Pat. No. 11,444,081, which is a continuation of application No. 16/358,118, filed on Mar. 19, 2019, now Pat. No. 10,930,649.

(51) Int. Cl.
*H01L 21/8234* (2006.01)
*H01L 29/06* (2006.01)
*H01L 29/08* (2006.01)
*H01L 29/66* (2006.01)
*H01L 29/78* (2006.01)

(52) U.S. Cl.
CPC ........ *H01L 21/823437* (2013.01); *H01L 21/823468* (2013.01); *H01L 21/823481* (2013.01); *H01L 29/0673* (2013.01); *H01L 29/0847* (2013.01); *H01L 29/66545* (2013.01); *H01L 29/66795* (2013.01); *H01L 29/7851* (2013.01)

(58) Field of Classification Search
CPC ........... H01L 29/7851; H01L 21/3086; H01L 21/823431; H01L 21/823437
See application file for complete search history.

(56) References Cited

U.S. PATENT DOCUMENTS

| | | |
|---|---|---|
| 7,274,051 B2 | 9/2007 | Kim et al. |
| 7,374,986 B2 | 5/2008 | Kim et al. |
| 7,402,483 B2 | 7/2008 | Yun et al. |
| 8,685,823 B2 | 4/2014 | Bangsaruntip et al. |
| 8,785,981 B1 | 7/2014 | Chang et al. |
| 8,987,794 B2 | 3/2015 | Rachmady et al. |
| 8,994,081 B2 | 3/2015 | Leobandung |
| 9,224,808 B2 | 12/2015 | Cea et al. |
| 9,257,527 B2 | 2/2016 | Hashemi et al. |
| 9,515,138 B1 | 12/2016 | Doris et al. |
| 9,543,440 B2 | 1/2017 | Cheng et al. |
| 9,660,028 B1 | 5/2017 | Cheng et al. |
| 9,905,643 B1 | 2/2018 | Bergendahl et al. |
| 9,972,720 B2 | 5/2018 | Bae |
| 10,170,638 B1 | 1/2019 | Reznicek |
| 10,204,983 B2 | 2/2019 | Suk et al. |
| 10,229,971 B1 | 3/2019 | Cheng et al. |
| 10,332,985 B2 | 6/2019 | Wong et al. |
| 10,546,942 B2 | 1/2020 | Cheng et al. |
| 10,566,248 B1 | 2/2020 | Chanemougame et al. |
| 2010/0203712 A1 | 8/2010 | Coronel et al. |
| 2013/0341704 A1 | 12/2013 | Rachmady et al. |
| 2014/0001441 A1 | 1/2014 | Kim et al. |
| 2014/0042386 A1 | 2/2014 | Cea et al. |
| 2015/0035071 A1 | 2/2015 | Ching et al. |
| 2015/0108573 A1 | 4/2015 | Liu et al. |
| 2015/0228480 A1 | 8/2015 | Yin et al. |
| 2016/0204105 A1 | 7/2016 | Zeng |
| 2017/0092541 A1 | 3/2017 | Or-Bach et al. |
| 2017/0162583 A1 | 6/2017 | Lee et al. |
| 2017/0170331 A1 | 6/2017 | Liang et al. |
| 2017/0179299 A1 | 6/2017 | Bae |
| 2017/0263706 A1 | 9/2017 | Gardner et al. |
| 2019/0237336 A1 | 8/2019 | Wang et al. |
| 2020/0035563 A1 | 1/2020 | Zhang et al. |
| 2020/0044087 A1 | 2/2020 | Guha et al. |
| 2020/0051981 A1 | 2/2020 | Yang et al. |
| 2020/0058768 A1 | 2/2020 | Coquand et al. |
| 2020/0066725 A1 | 2/2020 | Bhuwalka et al. |
| 2020/0075716 A1 | 3/2020 | Wang et al. |
| 2020/0075770 A1 | 3/2020 | Kobrinsky et al. |

Y – Y'

X – X'

INTEGRATED CIRCUIT (IC) DEVICE

CROSS-REFERENCE TO THE RELATED PATENT APPLICATION

This is a Continuation of U.S. application Ser. No. 17/886,530 filed Aug. 12, 2022, which is a continuation of U.S. application Ser. No. 17/150,712 filed Jan. 15, 2021, which is a continuation of U.S. patent application Ser. No. 16/358,118, filed on Mar. 19, 2019, in the U.S. Patent and Trademark Office, which claims priority from Korean Patent Application No. 10-2018-0107892, filed on Sep. 10, 2018, in the Korean Intellectual Property Office, the disclosures of which are incorporated herein by reference in their entireties.

BACKGROUND

The inventive concept relates to integrated circuit (IC) devices, and more particularly, to an IC device including a horizontal nanosheet field-effect transistor.

As the sizes of IC devices decrease, the integration degrees of electric field-effect transistors on a substrate need to be increased, and accordingly, a horizontal nanosheet field-effect transistor hNSFET including a plurality of horizontal nanosheets stacked on a same layout area has been developed. However, as the integration degrees of semiconductor devices increase and the sizes of devices are reduced to an extreme state, electrical characteristics of nanosheet electric field-effect transistors may be degraded by unwanted parasitic transistors. Thus, nanosheet electric field-effect transistors need a new structure capable of improving the electrical characteristics thereof by suppressing formation of unwanted parasitic transistors.

SUMMARY

Exemplary embodiments of the inventive concept provide an integrated circuit (IC) device having a structure by which formation of an unwanted parasitic transistor may be suppressed and electrical characteristics may improve.

According to an aspect of the inventive concept, there is provided an IC device which may include: a fin-type active area protruding from a substrate and extending in a first horizontal direction; a first nanosheet disposed above an upper surface of the fin-type active area with a first separation space therebetween; a second nanosheet disposed above the first nanosheet with a second separation space therebetween; a gate line extending on the substrate in a second horizontal direction intersecting the first horizontal direction, at least a portion of the gate line being disposed in the second separation space; and a bottom insulation structure disposed in the first separation space.

According to another aspect of the inventive concept, there is provided an IC device which may include: a fin-type active area protruding from a substrate and extending in a first horizontal direction; a pair of source/drain regions disposed on the fin-type active area; a nanosheet stack structure facing an upper surface of the fin-type active area with a first separation space therebetween, the nanosheet stack structure including a plurality of nanosheets of which widths in the first horizontal direction are defined by the pair of source/drain regions; a gate line including at least one sub-gate portion which extends on the fin-type active area in a second horizontal direction intersecting the first horizontal direction and is disposed within a second separation space between the plurality of nanosheets; a gate dielectric layer interposed between the plurality of nanosheets and the gate line; and a bottom insulation structure filling the first separation space and having a thickness greater than a thickness of the gate dielectric layer.

According to another aspect of the inventive concept, there is provided an IC device which may include: a fin-type active area extending on a substrate in a first horizontal direction; at least one source/drain region disposed in a row on the fin-type active area in the first horizontal direction; at least one nanosheet stack structure disposed on the fin-type active area comprising a first nanosheet closest to the fin-type active area and a second nanosheet disposed above the first nanosheet; at least one gate line covering the nanosheet stack structure on the fin-type active area, and extending in a second horizontal direction intersecting the first horizontal direction; a gate dielectric layer disposed between the nanosheet stack structure and the gate line; and a bottom insulation structure interposed between the fin-type active area and the nanosheet stack structure, and integrally connected to the gate dielectric layer.

BRIEF DESCRIPTION OF THE DRAWINGS

Exemplary embodiments of the inventive concept will be more clearly understood from the following detailed description taken in conjunction with the accompanying drawings in which:

FIGS. 11 through 28B are cross-sectional views for explaining a method of manufacturing an IC device, according to embodiments, wherein FIGS. 11, 12A, 13A, 14A, 15A, 16A, 17-22, 23A, 24A, 25A, 26A, 27A, and 28A are cross-sectional views for explaining a method of manufacturing a portion of the IC device corresponding to the cross-section taken along line X-X' of FIG. 1, and FIGS. 12B, 13B, 14B, 15B, 16B, 23B, 24B, 25B, 26B, 27B, and 28B are cross-sectional views for explaining a method of manufacturing a portion of the IC device corresponding to the cross-section taken along line Y-Y' of FIG. 1;

DETAILED DESCRIPTION OF THE EXEMPLARY EMBODIMENTS

Figure 1:
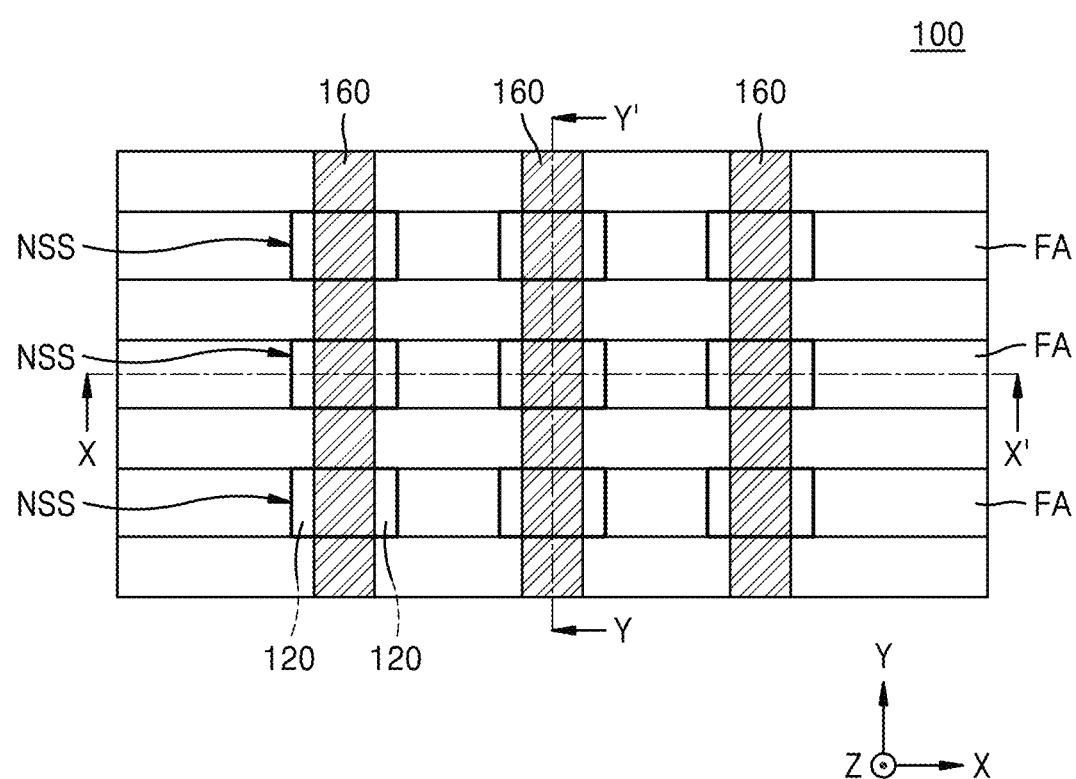
FIG. 1 is a plan view of an integrated circuit (IC) device according to embodiments.

Hereinafter, the inventive concept will be described more fully with reference to the accompanying drawings, in which embodiments of the inventive concept are shown. It is understood that all embodiments presented herein are exemplary, and do not restrict the scope of the inventive concept. Like reference numerals in the drawings denote like elements, and thus their description will be omitted. An embodiment provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 2A:
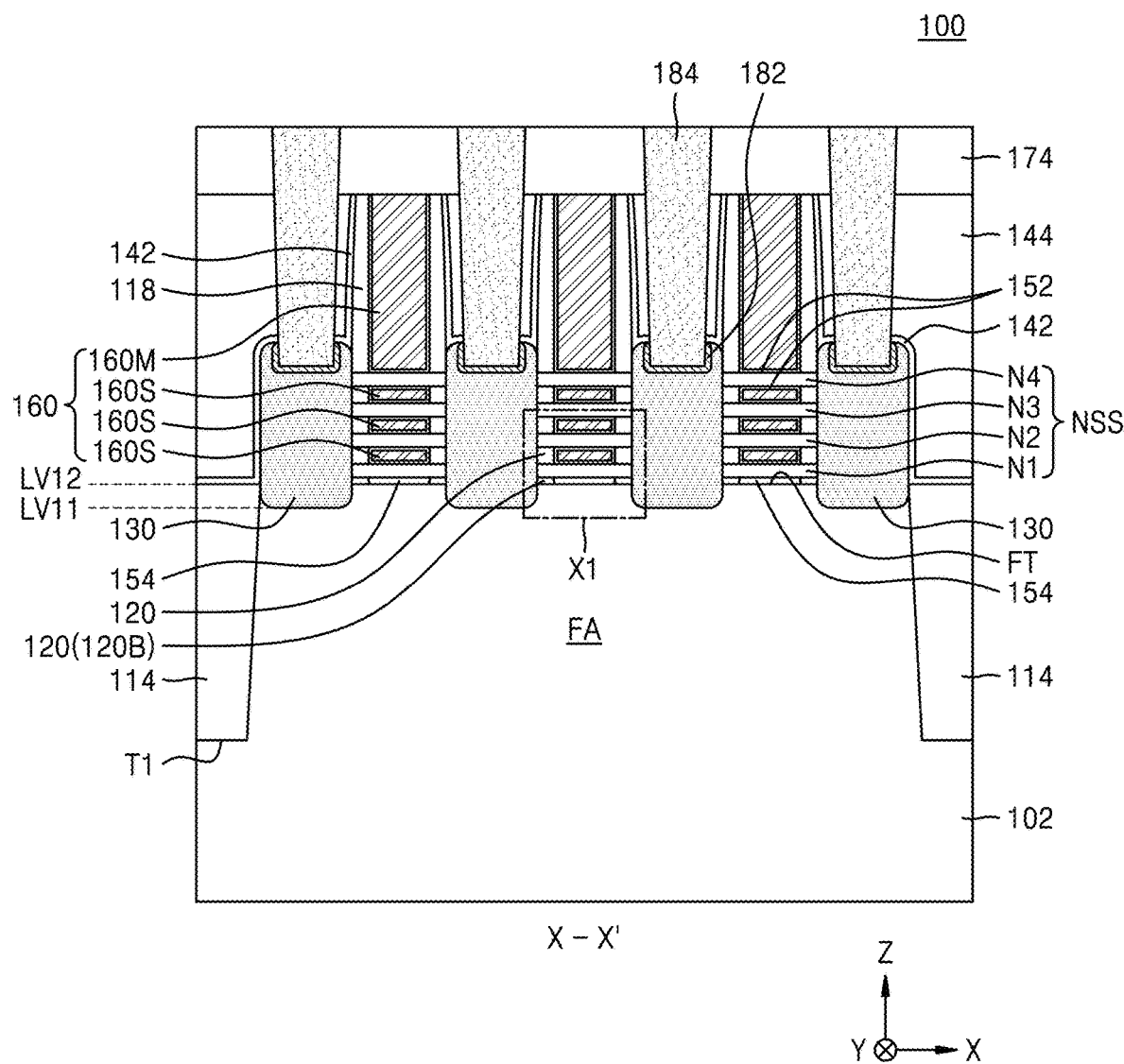
FIG. 2A is a cross-sectional view taken along line X-X' of FIG. 1.
Figure 2B:
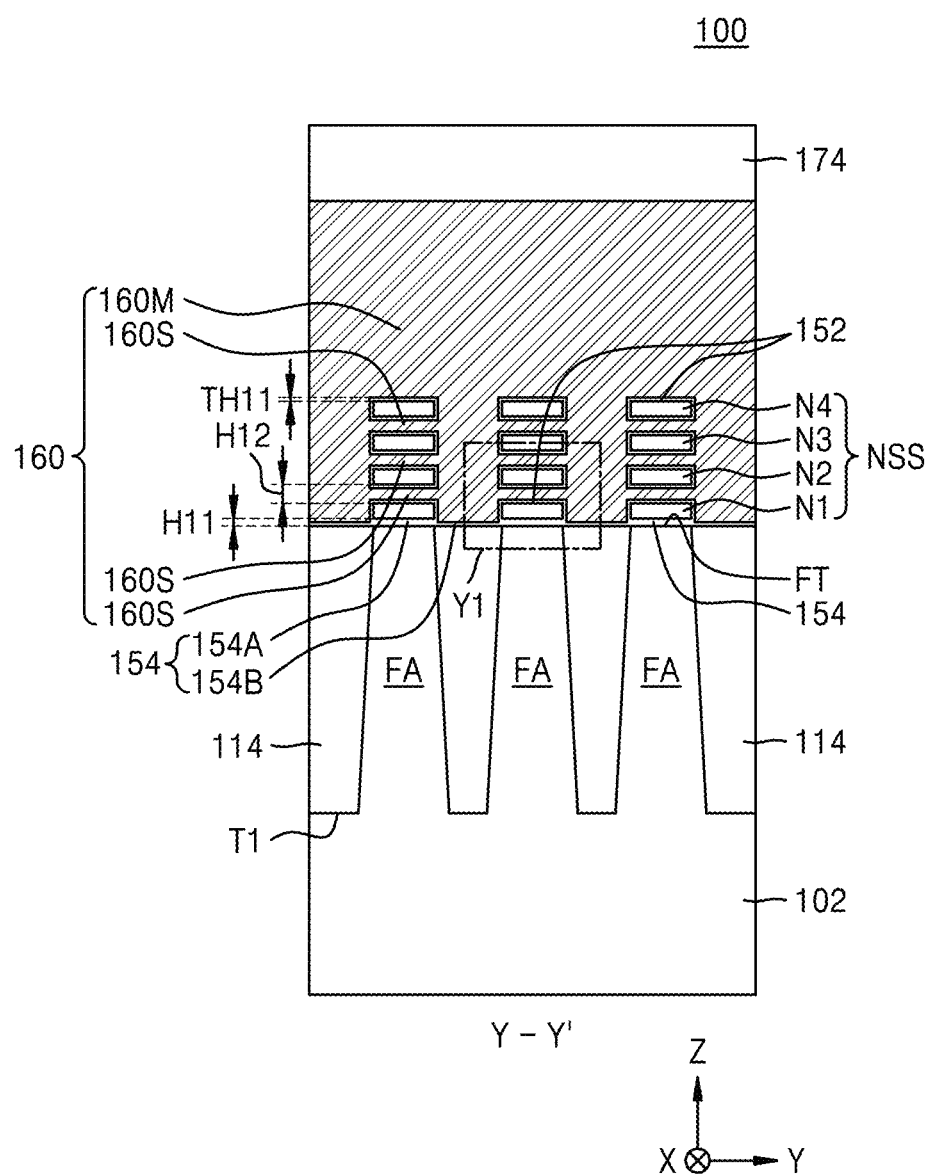
FIG. 2B is a cross-sectional view taken along line Y-Y' of FIG. 1.
Figure 3A:
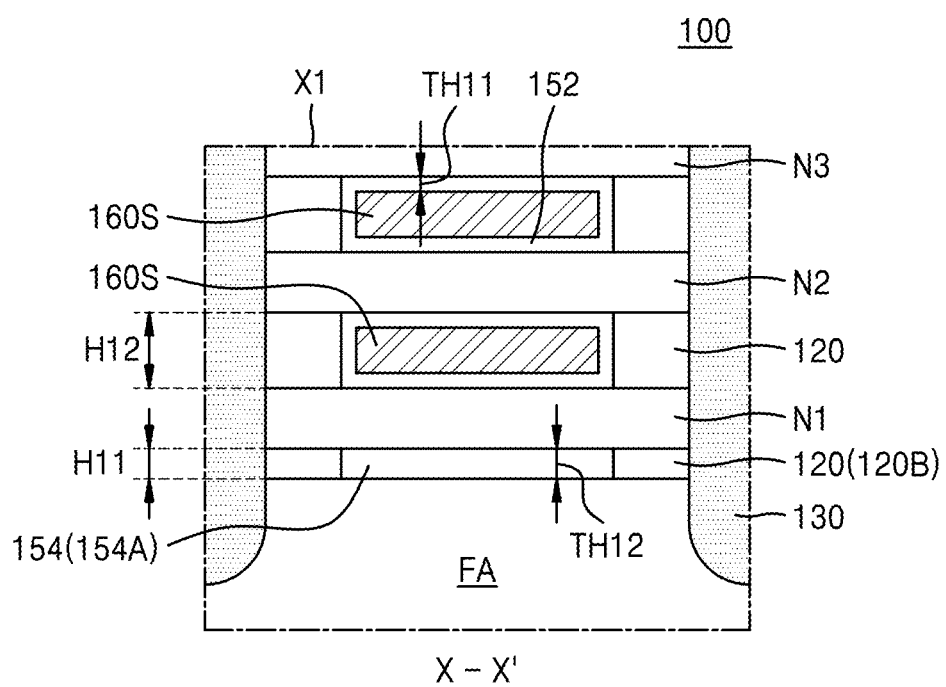
FIG. 3A is a magnified cross-sectional view of a local area indicated by "X1" of FIG. 2A.
Figure 3B:
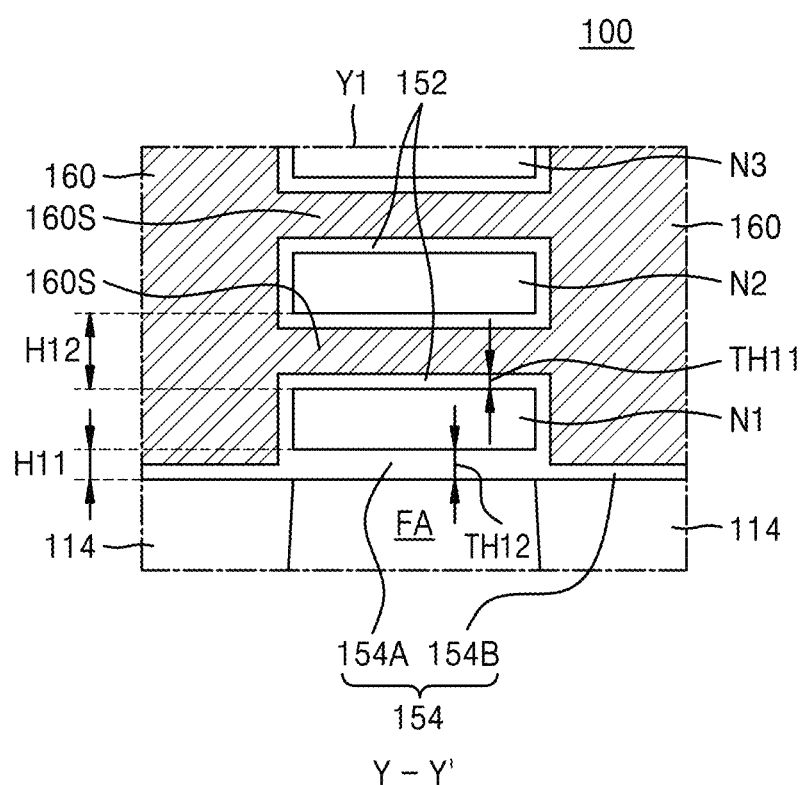
FIG. 3B is a magnified cross-sectional view of a local area indicated by "Y1" of FIG. 2B.

FIG. 1 is a plan view of an integrated circuit (IC) device 100 according to embodiments. FIG. 2A is a cross-sectional view taken along a line X-X' of FIG. 1, and FIG. 2B is a cross-sectional view taken along a line Y-Y' of FIG. 1. FIG. 3A is a magnified cross-sectional view of a local area indicated by "X1" of FIG. 2A, and FIG. 3B is a magnified cross-sectional view of a local area indicated by "Y1" of FIG. 2B.

Referring to FIGS. 1 through 3B, the IC device 100 includes a plurality of fin-type active areas FA each protruding from a substrate 102 and extending in a first horizontal direction (X direction), and a plurality of nanosheet stack structures NSS facing respective upper surfaces FT of the plurality of fin-type active areas FA at locations separated from the plurality of fin-type active areas FA.

The substrate 102 may include a semiconductor such as Si or Ge, or a compound semiconductor such as SiGe, SiC, GaAs, InAs, or InP. A trench T1 defining the plurality of fin-type active areas FA may be formed in the substrate 102, and may be filled with an isolation layer 114. The isolation layer 114 may be formed of an oxide layer, a nitride layer, or a combination thereof.

On the plurality of fin-type active areas FA, each of a plurality of gate lines 160 extend in a second horizontal direction (Y direction) perpendicular to the first horizontal direction (X direction).

In regions where the plurality of fin-type active areas FA intersect with the plurality of gate lines 160, a plurality of nanosheet stack structures NSS may be disposed on each of the respective upper surfaces FT of the plurality of fin-type active areas FA. The plurality of nanosheet stack structures NSS face the upper surface FT of the fin-type active area FA, and are separated from the upper surface FT of the fin-type active area FA by a separation space having a first height H11. The term "height" used herein means a size in a Z direction, namely, a thickness in a vertical direction, unless otherwise defined. Each of the plurality of nanosheet stack structures NSS may include a plurality of nanosheets N1, N2, N3, and N4 each extending parallel to the upper surface FT of the fin-type active area FA.

As shown in FIG. 1, on an X-Y plane on the substrate 102, each of the plurality of nanosheet stack structures NSS may have a plane area that is greater than a plane area of a region where each fin-type active area FA and each gate line 160 overlap each other. Although a planar shape of each nanosheet stack structure NSS is approximately rectangular in FIG. 1, embodiments are not limited thereto. Each nanosheet stack structure NSS may have various planar shapes according to a planar shape of each fin-type active area FA and that of each gate line 160.

The plurality of nanosheets N1, N2, N3, and N4 may include a first nanosheet N1, a second nanosheet N2, a third nanosheet N3, and a fourth nanosheet N4 sequentially stacked on the upper surface FT of the fin-type active area FA. The first nanosheet N1 closest to the fin-type active area FA from among the plurality of nanosheets N1, N2, N3, and N4 may face the upper surface FT of the fin-type active area FA, and may be separated from the upper surface FT with the separation space of the first height H11 disposed therebetween. The second nanosheet N2 may face the upper surface FT of the fin-type active area FA with the first nanosheet N1 disposed therebetween, and may be separated from the first nanosheet N1 with a separation space of a second height H12 that is greater than the first height H11. A height of a separation space between the second nanosheet N2 and the third nanosheet N3 and that of a separation space between the third nanosheet N3 and the fourth nanosheet N4 may each be equal to or similar to the second height H12.

The present embodiment illustrates a structure in which a plurality of nanosheet stack structures NSS and a plurality of gate lines 160 are formed on a single fin-type active area FA, and the plurality of nanosheet stack structures NSS are disposed in a row in the first horizontal direction (X direction) on the single fin-type active area FA. However, according to the inventive concept, the number of nanosheet stack structure NSS disposed on a single fin-type active area FA is not particularly limited. For example, one nanosheet stack structure NSS may be formed on one fin-type active area FA. Although the present embodiment illustrates a case where each of the plurality of nanosheet stack structures NSS includes four nanosheets N1, N2, N3, and N4, the inventive concept is not limited thereto. For example, each of the plurality of nanosheet stack structures NSS may include at least two nanosheets, and the number of nanosheets included in each nanosheet stack structure NSS is not particularly limited.

Each of the plurality of nanosheets N1, N2, N3, and N4 may have a channel region. A channel may be formed around an upper surface and a lower surface of each of the second through fourth nanosheets N2, N3, and N4 except for the first nanosheet N1 from among the plurality of nanosheets N1, N2, N3, and N4. A channel may be formed around an upper surface of the first nanosheet N1, but no channels are formed around a lower surface of the first nanosheet N1 that faces the fin-type active area FA.

According to some embodiments, each of the plurality of nanosheets N1, N2, N3, and N4 may have a thickness in a vertical direction that is within a range of about 4.5 nm to about 5.5 nm. According to some embodiments, the plurality of nanosheets N1, N2, N3, and N4 may have substantially the same thickness. The plurality of nanosheets N1, N2, N3, and N4 may be formed of the same material. According to some embodiments, the plurality of nanosheets N1, N2, N3, and N4 may be formed of the same material as that used to form the substrate 102.

The plurality of gate lines 160 may surround at least portions of the plurality of nanosheets N1, N2, N3, and N4 while covering the plurality of nanosheet stack structures NSS over the fin-type active area FA. Each of the plurality of gate lines 160 may include a main gate portion 160M covering the upper surface of each nanosheet stack structure NSS and extending in the second horizontal direction (Y direction), and a plurality of sub-gate portions 160S integrally connected to the main gate portion 160M and disposed within the separation spaces between the plurality of nanosheets N1, N2, N3, and N4. In a vertical direction (Z direction), a thickness of each of the plurality of sub-gate portions 160S may be less than that of the main gate portion 160M. The plurality of gate lines 160 do not extend to a space between the fin-type active area FA and the first nanosheet N1, and accordingly, each of the plurality of gate lines 160 does not have a sub-gate portion disposed between the fin-type active area FA and the first nanosheet N1. Accordingly, as shown in FIGS. 2B and 3B, as viewed from a cross-section in the Y direction, the second through fourth nanosheets N2, N3, and N4 except for the first nanosheet N1 from among the plurality of nanosheets N1, N2, N3, and N4 may have a gate-all-around (GAA) structure that is completely surrounded by a gate line 160. On the contrary, the first nanosheet N1 may not have the GAA structure. In more detail, the lower surface of the first nanosheet N1 that faces the fin-type active area FA may not be covered by the gate line 160, and only the upper surface of the first nanosheet N1 that faces the second nanosheet N2 and both sidewalls thereof in the Y direction may be covered by the gate line 160. Accordingly, a region around the upper surface of the first nanosheet N1 facing the second nanosheet N2 and regions around the both sidewalls of the first nanosheet N1 in the Y direction may be used as a channel region, but a region around the lower surface of the first nanosheet N1 that faces the fin-type active area FA may not be used as a channel region. A space between the first nanosheet N1 and the fin-type active area FA may be filled with a comparatively thick bottom insulation structure, and thus the first nanosheet N1 may constitute a fully depleted device.

The gate line 160 may be formed of metal, metal nitride, metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may be TiAlC.

A gate dielectric layer 152 is formed between the nanosheet stack structure NSS and the gate line 160. The gate dielectric layer 152 may cover a surface of each of the plurality of nanosheets N1, N2, N3, and N4 to have a first thickness TH11. The first thickness TH11 of the gate dielectric layer 152 may be less than the first height H11 of the separation space between the fin-type active area FA and the first nanosheet N1. According to some embodiments, the first thickness TH11 may be less than the first height H11 and may be less than or equal to ½ of the first height H11. According to embodiments, the first thickness TH11 may be greater than ½ of the first height H11.

According to some embodiments, the gate dielectric layer 152 may be a stack of an interfacial layer and high-k dielectric layer. The interfacial layer may be formed of a low dielectric material layer having a dielectric constant of about 9 or less, for example, a silicon oxide layer, a silicon oxynitride layer, or a combination thereof. According to some embodiments, the interfacial layer may not be formed. The high-k dielectric layer may include a material having a dielectric constant that is greater than that of a silicon oxide layer. For example, the high-k dielectric layer may have a dielectric constant of about 10 to about 25. The high-k dielectric layer may be, but is not limited to, formed of hafnium oxide.

As shown in FIGS. 2B and 3B, as viewed from a cross-section in the Y direction, the second through fourth nanosheets N2, N3, and N4 except for the first nanosheet N1 from among the plurality of nanosheets N1, N2, N3, and N4 may be completely surrounded by the gate dielectric layer 152. Only the upper surface of the first nanosheet N1 facing the second nanosheet N2, and the both sidewalls of the first nanosheet N1 in the Y direction may be covered by the gate dielectric layer 152.

A plurality of source/drain regions 130 may be formed on the fin-type active area FA. As shown in FIGS. 2A and 3A, both sidewalls of each of the plurality of nanosheets N1, N2, N3, and N4 in the X direction may contact source/drain regions 130. A width of each of the plurality of nanosheets N1, N2, N3, and N4 in the X direction may be defined by a pair of source/drain regions 130 existing at both sides of the plurality of nanosheets N1, N2, N3, and N4. A lower surface level LV11 of each of the plurality of source/drain regions 130 may be lower than a level LV12 of the upper surface FT of the fin-type active area FA. The plurality of source/drain regions 130 may be formed of an epitaxially-grown semiconductor layer. For example, the plurality of source/drain regions 130 may be formed of an Si layer, an SiGe layer, or an SiC layer.

The separation space between the lower surface of the first nanosheet N1 and the fin-type active area FA may be filled with a bottom insulation structure 154. The bottom insulation structure 154 may have a structure integrally connected with the gate dielectric layer 152. At least a portion of the bottom insulation structure 154 may include the same material as that included in the gate dielectric layer 152. For example, the bottom insulation structure 154 may include a silicon oxide layer, a high-k dielectric layer having a higher dielectric constant than a dielectric constant of the silicon oxide layer, an air gap, or a combination thereof. The term "air" used herein may mean the atmospheric air, or other gases that may exist during a manufacturing process.

The bottom insulation structure 154 may include a first insulation portion 154A that fills the separation space between the lower surface of the first nanosheet N1 and the fin-type active area FA, and a second insulation portion 154B extending from the first insulation portion 154A in the second horizontal direction (Y direction) and interposed between the isolation layer 114 and the gate line 160. The second insulation portion 154B may be formed at both sides of the first insulation portion 154A in the Y direction. A thickness of the second insulation portion 154B in the vertical direction may be less than that of the first insulation portion 154A in the vertical direction. The first insulation portion 154A may have a second thickness TH12 that is greater than the first thickness TH11 of the gate dielectric layer 152. The second thickness TH12 may be substantially equal to the first height H11. The thickness of the second insulation portion 154B may be substantially equal to the first thickness TH11 of the gate dielectric layer 152. As shown in FIGS. 2B and 3B, the bottom insulation structure 154 may extend in the Y direction between the substrate 102 and the gate line 160, and may have a variable thickness in the Y direction.

A metal silicide layer 182 may be formed on an upper surface of each of the plurality of source/drain regions 130. The metal silicide layers 182 may be formed of titanium silicide, but embodiments are not limited thereto. The metal silicide layers 182 may not be formed.

A plurality of first insulation spacers 118 covering sidewalls of the gate lines 160 are formed on the plurality of nanosheet stack structures NSS. The plurality of first insulation spacers 118 and the plurality of source/drain regions 130 may be covered by a protective insulation layer 142. The first insulation spacers 118 and the protective insulation layer 142 may cover sidewalls of the main gate portions 160M. Each of the first insulation spacers 118 and the protective insulation layer 142 may be formed of SiN, SiCN, SiBN, SiON, SiOCN, SiBCN, SiOC, $SiO_2$, or a combination thereof. According to some embodiments, the protective insulation layer 142 may not be formed.

Second insulation spacers 120 that contact the source/drain regions 130 are formed in spaces between the plurality of nanosheets N1, N2, N3, and N4. Some of the second insulation spacers 120 may be interposed between the sub-gate portions 160S and the source/drain regions 130. As shown in FIG. 2A, both sidewalls of each of the three sub-gate portions 160S in the IC device 100 may be covered by the second insulation spacers 120 with the gate dielectric layer 152 disposed therebetween. Both sidewalls of the first insulation portion 154A of the bottom insulation structure 154 in the X direction may be covered by second insulation spacers 120B closest to the fin-type active area FA from among the second insulation spacers 120. The second insulation spacers 120B may be interposed between the bottom insulation structure 154 and the source/drain regions 130. A thickness of each of the second insulation spacers 120B in the vertical direction may be less than that of each of the other second insulation spacers 120 in the vertical direction.

A width of the bottom insulation structure 154 in the X direction may be defined by a pair of second insulation spacers 120B covering both sidewalls of the bottom insulation structure 154. The width of the bottom insulation structure 154 in the X direction may be less than that of each of the plurality of nanosheets N1, N2, N3, and N4 in the X direction.

According to some embodiments, the first insulation spacers 118 and the second insulation spacers 120 may be formed of the same material. According to embodiments, the first insulation spacers 118 and the second insulation spacers 120 may be formed of different materials. According to some embodiments, the second insulation spacers 120 may be formed of SiN, SiCN, SiBN, SiON, SiOCN, SiBCN, SiOC, $SiO_2$, or a combination thereof. According to embodiments, the second insulation spacers 120 may include air gaps.

As shown in FIG. 2A, an inter-gate insulation layer 144 and an interlayer insulation layer 174 are sequentially formed on the plurality of source/drain regions 130. The inter-gate insulation layer 144 and the interlayer insulation layer 174 may each be formed of a silicon oxide layer.

A plurality of contact plugs 184 may be connected to the plurality of source/drain regions 130 via the plurality of metal silicide layers 182. The plurality of contact plugs 184 may penetrate through the interlayer insulation layer 174, the inter-gate insulation layer 144, and the protective insulation layer 142, and may be connected to the plurality of metal silicide layers 182. The plurality of contact plugs 184 may each be formed of metal, conductive metal nitride, or a combination thereof. For example, the plurality of contact plugs 184 may each be formed of W, Cu, Al, Ti, Ta, TiN, TaN, an alloy thereof, or a combination thereof.

In the IC device 100 described above with reference to FIGS. 1 through 3B, the space between the first nanosheet N1 closest to the fin-type active area FA from among the plurality of nanosheets N1, N2, N3, and N4 and the fin-type active area FA is filled with the bottom insulation structure 154, and no sub-gate portions are formed between the first nanosheet N1 and the fin-type active area FA. Accordingly, formation of an unwanted channel around the upper surface FT of the fin-type active area FA facing the lower surface of the first nanosheet N1 may be suppressed, and no unwanted parasitic transistors may be formed around the upper surface FT of the fin-type active area FA. Accordingly, degradation of electrical characteristics that may occur due to a parasitic transistor, such as a parasitic capacitance increase, a leakage current increase, and a subthreshold swing increase, may be prevented.

Figure 4A:
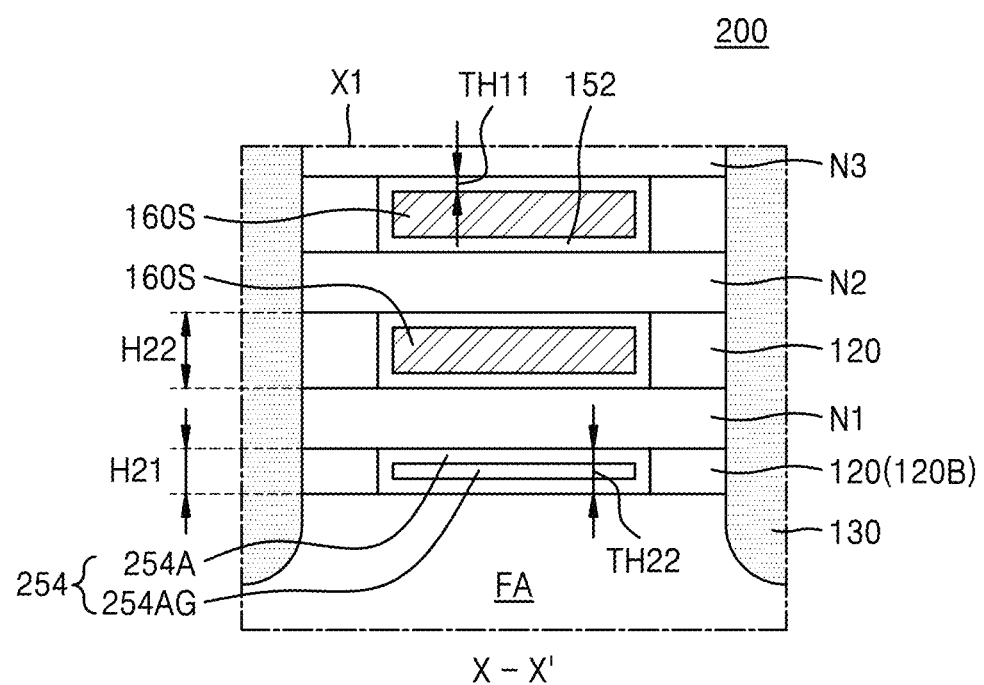
FIGS. 4A and 4B are cross-sectional views for explaining an IC device according to embodiments.
Figure 4B:
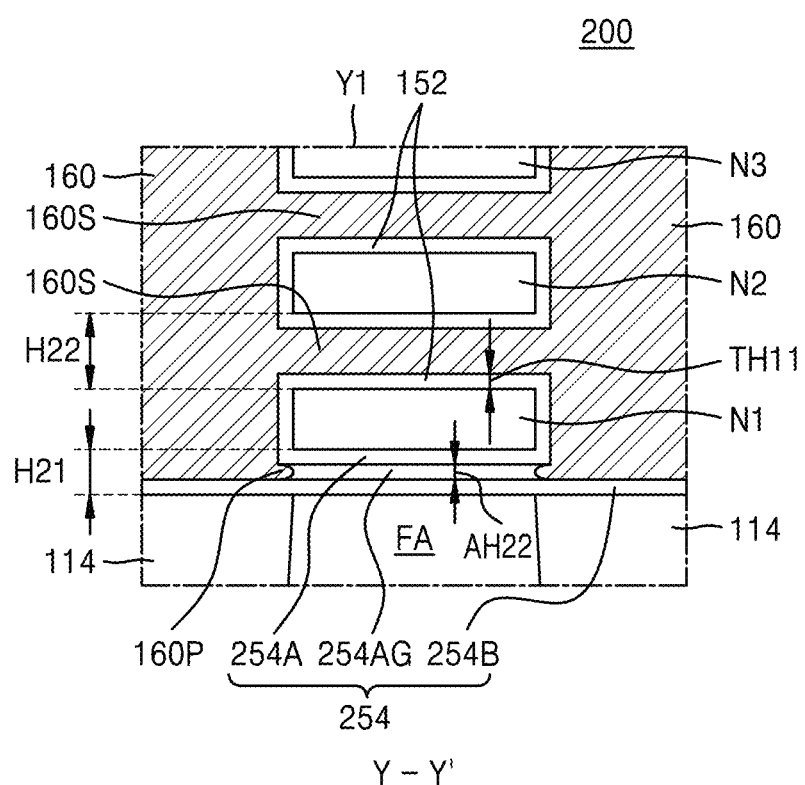

FIGS. 4A and 4B are cross-sectional views for explaining an IC device 200 according to embodiments. FIG. 4A is a magnified cross-sectional view of an area corresponding to the local area indicated by "X1" of FIG. 2A, and FIG. 4B is a magnified cross-sectional view of an area corresponding to the local area indicated by "Y1" of FIG. 2B. The same reference characters and numerals in FIGS. 4A and 4B as those in FIGS. 1 through 3B denote the same elements, and thus their description will be omitted herein.

Referring to FIGS. 4A and 4B, the IC device 200 has almost the same structure as that of the IC device 100 described above with reference to FIGS. 1 through 3B. However, the IC device 200 includes a bottom insulation structure 254 instead of the bottom insulation structure 154. The bottom insulation structure 254 may include an air gap 254AG existing within a separation space between the first nanosheet N1 and the fin-type active area FA, a first insulation portion 254A disposed within the separation space and defining the air gap 254AG, and a second insulation portion 254B extending from both sides of the first insulation portion 254A in the Y direction. An upper limit and a lower limit of the air gap 254AG may be defined by the first insulation portion 254A.

In the IC device 200, a separation space between the lower surface of the first nanosheet N1 and the fin-type active area FA may have a first height H21. The second nanosheet N2 may be separated from the first nanosheet N1 with a separation space of a second height H22 that is greater than the first height H21. The first height H21 may be greater than twice of the first thickness TH11 of the gate dielectric layer 152.

The first insulation portion 254A may have a second thickness TH22 that is greater than the first thickness TH11 of the gate dielectric layer 152. The second thickness TH22 may be substantially equal to the first height H21. A height AH22 of the air gap 254AG may be less than or equal to the first thickness TH11 of the gate dielectric layer 152. The second insulation portion 254B may be interposed between the isolation layer 114 and the gate line 160. The first insulation portion 254A may be integrally connected with the gate dielectric layer 152.

The gate line 160 may include a protrusion 160P that protrudes toward the air gap 254AG of the bottom insulation structure 254. A width of the air gap 254AG in the Y direction may be defined by the protrusion 160P of the gate line 160. A detailed description of the bottom insulation structure 254 is mostly the same as that of the bottom insulation structure 154 made above with reference to FIGS. 1 through 3B.

Figure 5A:
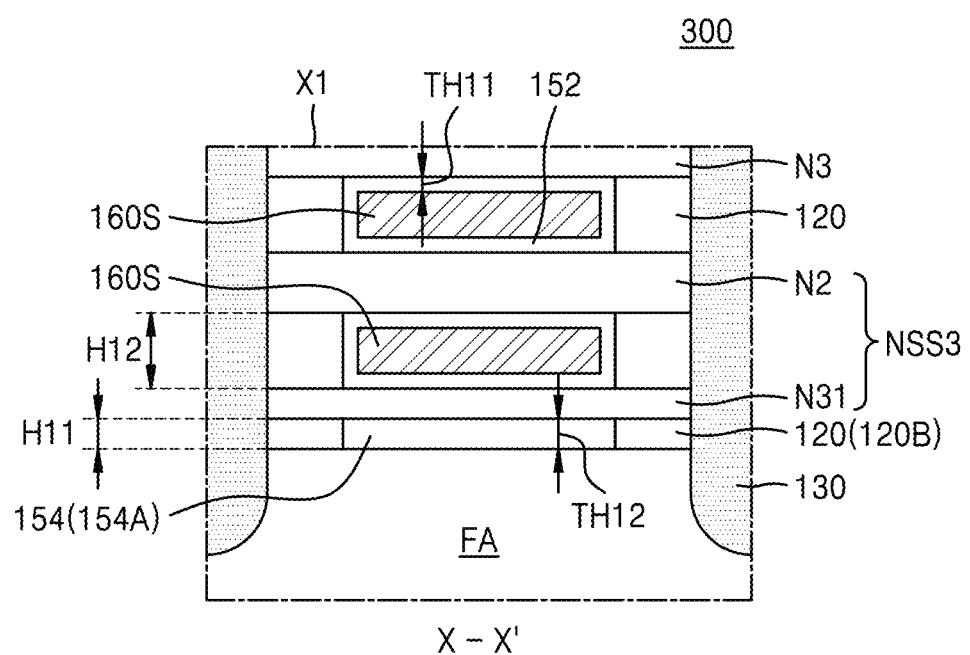
FIGS. 5A and 5B are cross-sectional views for explaining an IC device according to embodiments.
Figure 5B:
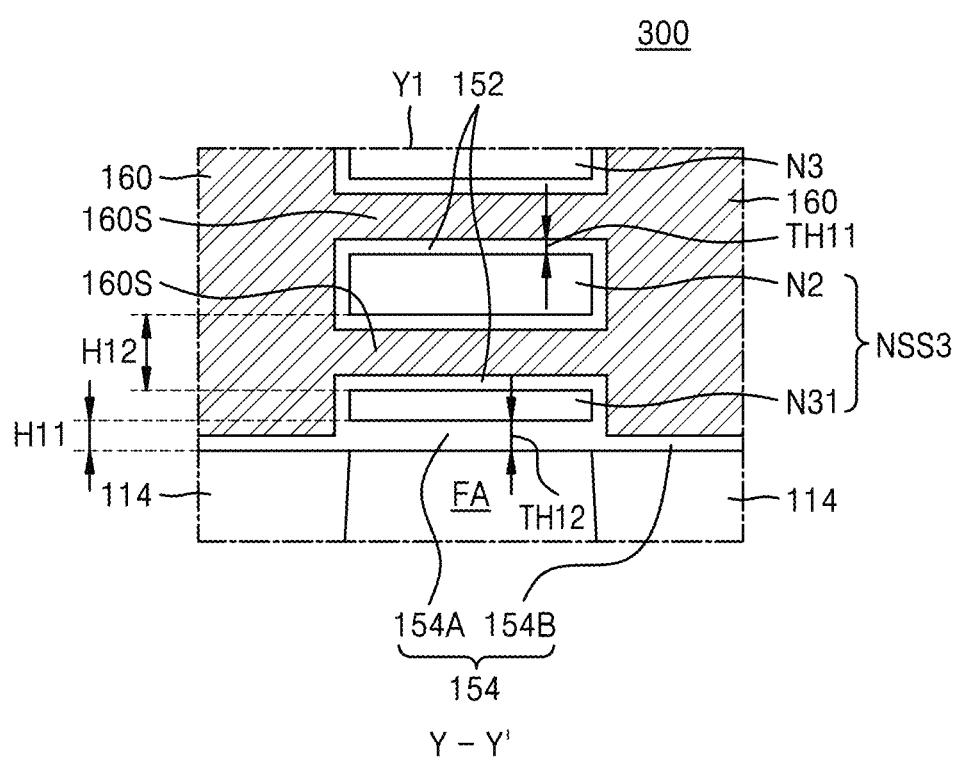

FIGS. 5A and 5B are cross-sectional views for explaining an IC device 300 according to embodiments. FIG. 5A is a magnified cross-sectional view of an area corresponding to the local area indicated by "X1" of FIG. 2A, and FIG. 5B is a magnified cross-sectional view of an area corresponding to the local area indicated by "Y1" of FIG. 2B. The same reference characters and numerals in FIGS. 5A and 5B as those in FIGS. 1 through 3B denote the same elements, and thus their description will be omitted herein.

Referring to FIGS. 5A and 5B, the IC device 300 has almost the same structure as that of the IC device 100 described above with reference to FIGS. 1 through 3B. However, the IC device 300 includes a nanosheet stack structure NSS3 instead of the nanosheet stack structure NSS. The nanosheet stack structure NSS3 may include a plurality of nanosheets N31, N2, N3, and N4. At least some of the plurality of nanosheets N31, N2, N3, and N4 may have different thicknesses. For example, a thickness in a vertical direction of the first nanosheet N31 closest to the fin-type active area FA from among the plurality of nanosheets N31, N2, N3, and N4 may be less than that of each of the second through fourth nanosheets N2, N3, and N4. For example, the first nanosheet N31 may have a thickness in a vertical direction which is within a range of about 1 nm to about 3 nm. A detailed description of the first nanosheet N31 is mostly the same as that of the first nanosheet N1 made above with reference to FIGS. 1 through 3B.

Figure 6:
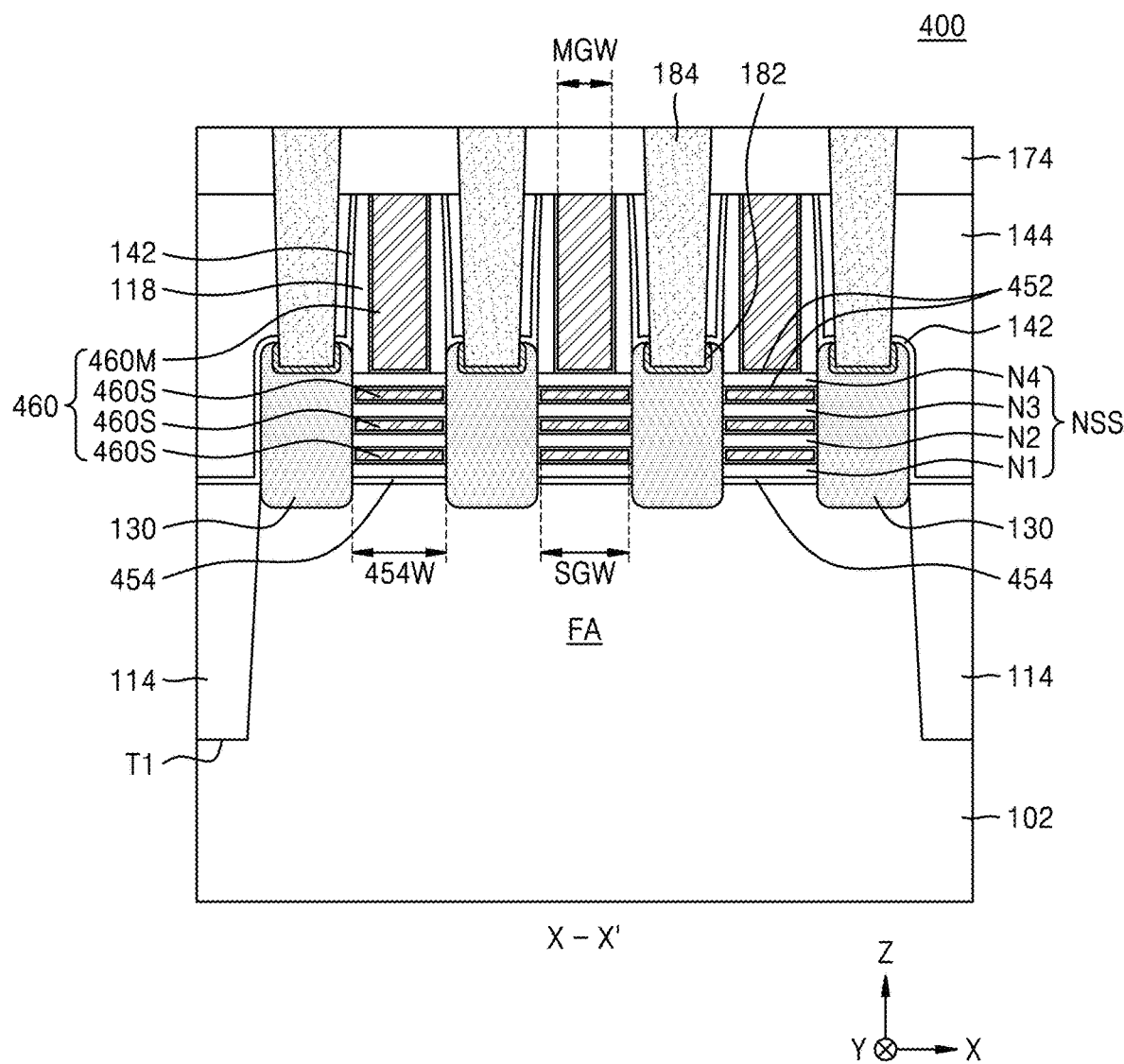
FIGS. 6 through 10 are cross-sectional views for explaining IC devices according to embodiments, respectively.

FIG. 6 is a cross-sectional view for explaining an IC device 400 according to embodiments. FIG. 6 illustrates a cross-sectional structure of a portion of the IC device 400 corresponding to the cross-section taken along the line X-X' of FIG. 1. The same reference characters and numerals in FIG. 6 as those in FIGS. 1 through 3B denote the same elements, and thus their description will be omitted herein.

Referring to FIG. 6, the IC device 400 has almost the same structure as that of the IC device 100 described above with reference to FIGS. 1 through 3B. However, the IC device 400 does not include the second insulation spacers 120 included in the IC device 100, and includes a plurality of gate lines 460 instead of the plurality of gate lines 160 and includes a gate dielectric layer 452 instead of the gate dielectric layer 152.

Each of the plurality of gate lines 460 may include a main gate portion 460M covering the upper surface of each of the nanosheet stack structures NSS and extending in the Y direction, and a plurality of sub-gate portions 460S integrally connected to the main gate portion 460M and disposed within the separation spaces between the plurality of nanosheets N1, N2, N3, and N4. In the vertical direction, a thickness of each of the plurality of sub-gate portions 460S may be less than that of the main gate portion 460M. Each of the plurality of gate lines 460 does not include a sub-gate portion disposed between the fin-type active area FA and the first nanosheet N1.

In the X direction, a width SGW of each of the plurality of sub-gate portions 460S may be greater than a width MGW of the main gate portion 460M. Each of the plurality of sub-gate portions 460S may be separated from source/drain regions 130 with the gate dielectric layer 452 disposed therebetween.

A space between the lower surface of the first nanosheet N1 and the fin-type active area FA may be filled with a bottom insulation structure 454. The bottom insulation structure 454 may have a structure integrally connected with the gate dielectric layer 452. A width of the bottom insulation structure 454 in the X direction may be equal to or similar to that of each of the plurality of nanosheets N1, N2, N3, and N4 in the X direction. In the X direction, both sidewalls of the bottom insulation structure 454 may contact a pair of source/drain regions 130 disposed at both sides of a gate line 460. A width 454W of the bottom insulation structure 454 in the X direction may be defined by a pair of source/drain regions 130. The width 454W of the bottom insulation structure 454 in the X direction may be greater than the width SGW of each of the plurality of sub-gate portions 460S. Detailed descriptions of the gate lines 460, the gate dielectric layer 452, and the bottom insulation structure 454 are mostly the same as those of the gate lines 160, the gate dielectric layer 152, and the bottom insulation structure 154 made above with reference to FIGS. 1 through 3B.

Figure 7:
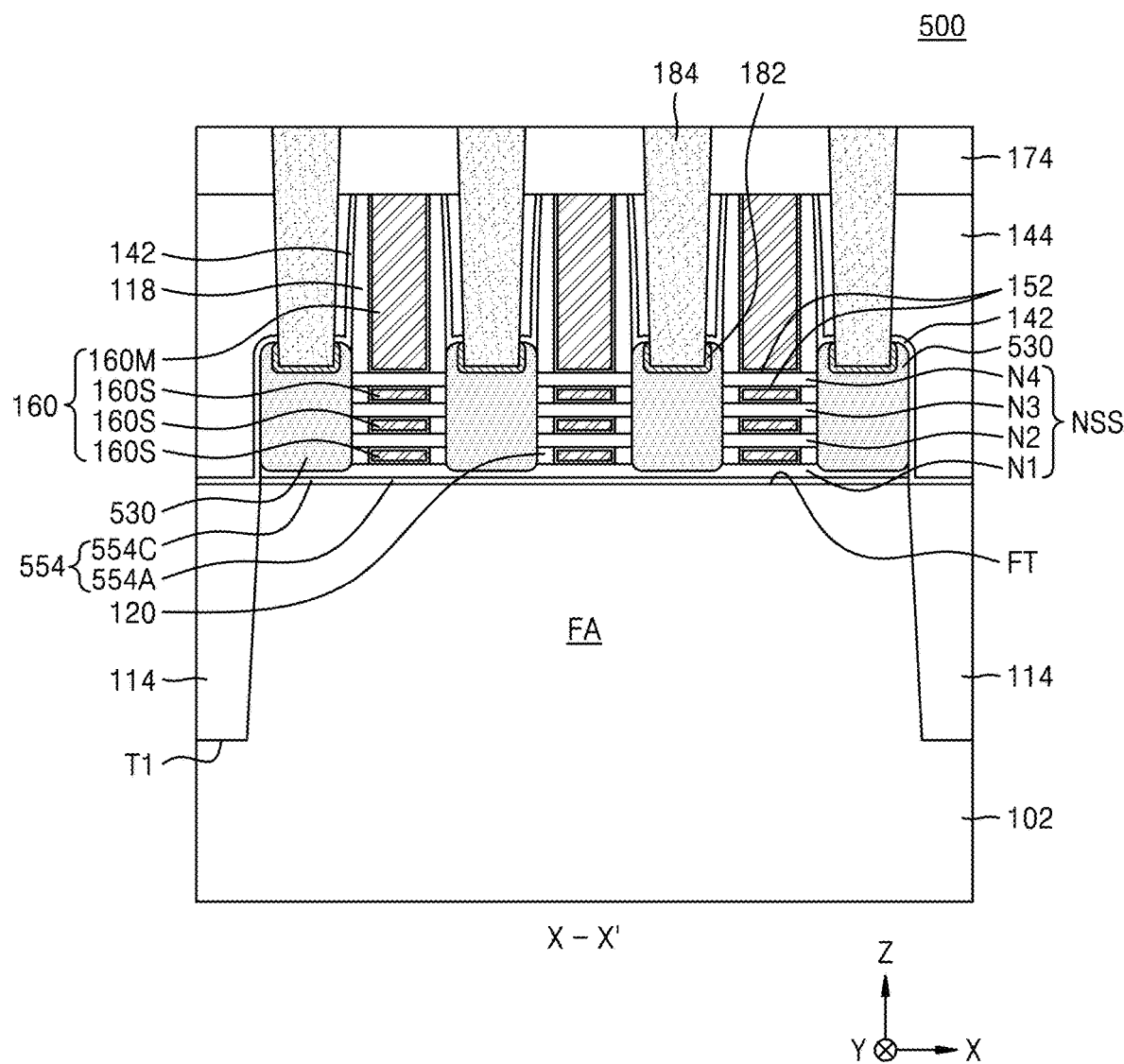

FIG. 7 is a cross-sectional view for explaining an IC device 500 according to embodiments. FIG. 7 illustrates a cross-sectional structure of a portion of the IC device 500 corresponding to the cross-section taken along the line X-X' of FIG. 1. The same reference characters and numerals in FIG. 7 as those in FIGS. 1 through 3B denote the same elements, and thus their description will be omitted herein.

Referring to FIG. 7, the IC device 500 has almost the same structure as that of the IC device 100 described above with reference to FIGS. 1 through 3B. However, in the IC device 500, a plurality of source/drain regions 530 are formed on the fin-type active area FA.

Both sidewalls of each of the second through fourth nanosheets N2, N3, and N4 from among the plurality of nanosheets N1, N2, N3, and N4 included in each nanosheet stack structure NSS may contact a plurality of source/drain region 530. An upper surface of the first nanosheet N1 may contact a lower surface of each of the plurality of source/drain regions 530. The first nanosheet N1 may include portions that are vertically overlapped by the plurality of source/drain region 530. A thickness of the portions of the first nanosheet N1 that are vertically overlapped by the plurality of source/drain region 530 may be less than that of portions of the first nanosheet N1 that are vertically overlapped by each gate line 160. According to some embodiments, a thickness of the first nanosheet N1 may be different from that of each of the second through fourth nanosheets N2, N3, and N4. For example, the thickness of the first nanosheet N1 may be less than that of each of the second through fourth nanosheets N2, N3, and N4. For example, each of the second through fourth nanosheets N2, N3, and N4 may have a thickness that is within a range of about 4.5 nm to about 5.5 nm, and the first nanosheet N1 may have a thickness that is within a range of about 1 nm to about 3 nm. According to embodiments, the thickness of the first nanosheet N1 may be substantially equal to or similar to that of each of the second through fourth nanosheets N2, N3, and N4.

The IC device 500 may include a bottom insulation structure 554 extending in the X direction on the upper surface FT of the fin-type active area FA. The bottom insulation structure 554 may include a first insulation portion 554A that fills a space between the first nanosheet N1 and the fin-type active area FA, a second insulation portion 154B (see FIG. 2B) extending from both sides of the first insulation portion 554A in the Y direction and interposed between the isolation layer 114 and the gate line 160, and a third insulation portion 554C extending from both sides of the first insulation portion 554A in the X direction and interposed between the fin-type active area FA and source/drain regions 530. The first insulation portion 554A and the third insulation portion 554C may be integrally connected to each other, and may have substantially the same thickness as each other. A thickness of each of the first insulation portion 554A and the third insulation portion 554C may be greater than that of the second insulation portion 154B (see FIG. 2B), and may be greater than that of the gate dielectric layer 152. The bottom insulation structure 554 may have a structure integrally connected with the gate dielectric layer 152.

A lower surface level of each of the plurality of source/drain regions 530 may be higher than an upper surface level of the bottom insulation structure 554. The bottom insulation structure 554 may be separated from the source/drain regions 530 with the first nanosheet N1 disposed therebetween. One bottom insulation structure 554 may be disposed on one fin-type active area FA, and a plurality of nanosheet stack structures NSS, a plurality of gate lines 160, and a plurality of source/drain regions 530 may be disposed on the single bottom insulation structure 554 on the single fin-type active area FA. Reference may be made to the descriptions of the bottom insulation structure 154 and the source/drain regions 130 made above with reference to FIGS. 1 through 3B in order to describe materials used to form the bottom insulation structure 554 and the source/drain regions 530.

Similar to the IC device 100 described above with reference to FIGS. 1 through 3B, the IC device 500 may include second insulation spacers 120 that are formed in spaces between the plurality of nanosheets N1, N2, N3, and N4 and contact the source/drain regions 530. However, in contrast with the IC device 100, the IC device 500 may not include the second insulation spacers 120B disposed between the fin-type active area FA and the first nanosheet N1.

Figure 8:
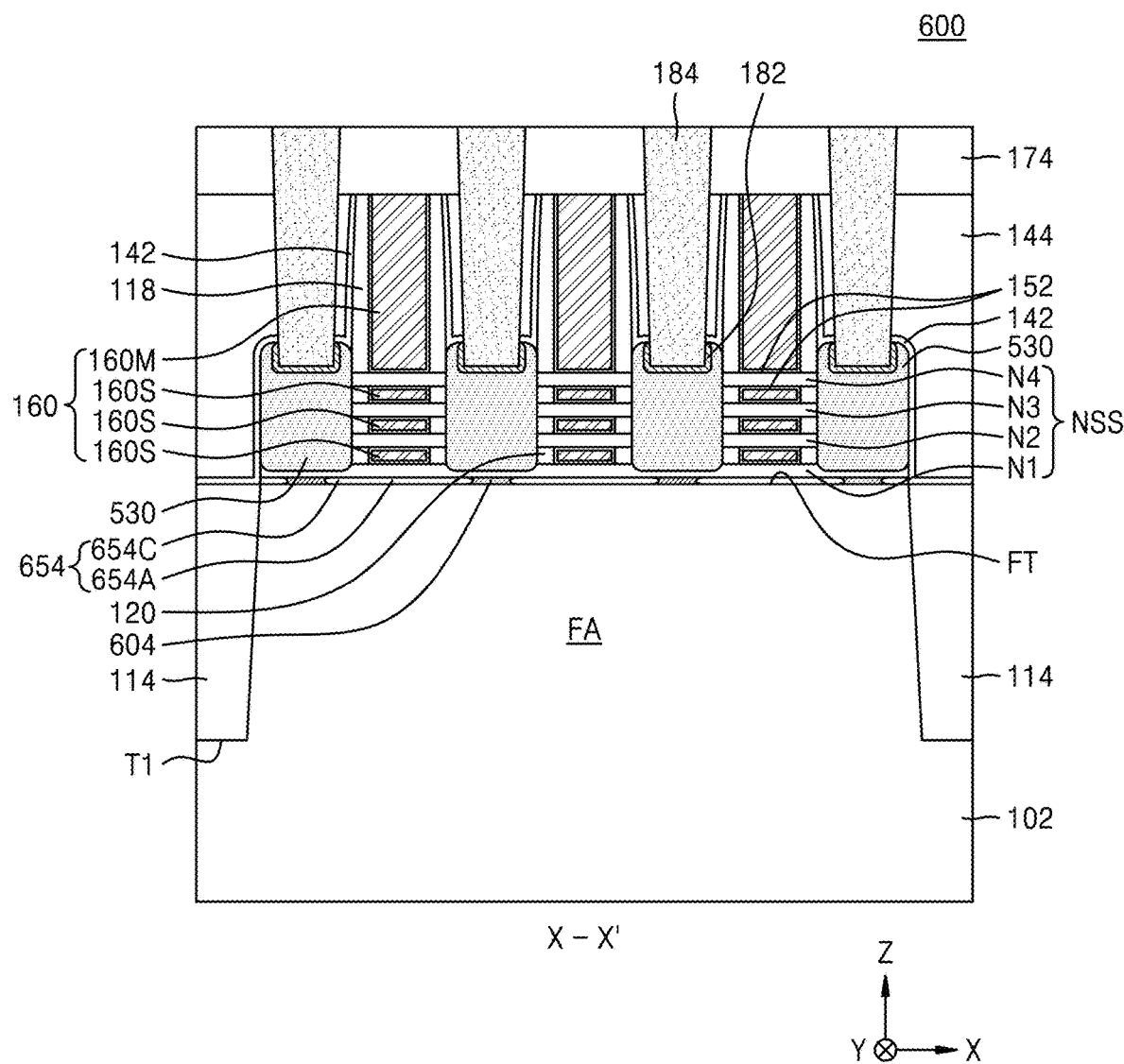

FIG. 8 is a cross-sectional view for explaining an IC device 500 according to embodiments. FIG. 8 illustrates a cross-sectional structure of a portion of the IC device 600 corresponding to the cross-section taken along the line X-X' of FIG. 1. The same reference characters and numerals in FIG. 8 as those in FIGS. 1 through 3B denote the same elements, and thus their description will be omitted herein.

Referring to FIG. 8, the IC device 600 has almost the same structure as that of the IC device 500 described above with reference to FIG. 7. However, the IC device 600 may include a bottom insulation structure 654. The bottom insulation structure 654 may include a first insulation portion 654A that fills a space between the first nanosheet N1 and the fin-type active area FA, a second insulation portion 154B (see FIG. 2B) extending from both sides of the first insulation portion 654A in the Y direction and interposed between the isolation layer 114 and the gate line 160, and a third insulation portion 654C extending from both sides of the first insulation portion 654A in the X direction and interposed between the fin-type active area FA and source/drain regions 530. The first insulation portion 654A and the third insulation portion 654C may be integrally connected to each other, and may have substantially the same thickness as each other. A thickness of each of the first insulation portion 654A and the third insulation portion 654C may be greater than that of the second insulation portion 154B (see FIG. 2B), and may be greater than that of the gate dielectric layer 152. The bottom insulation structure 654 may have a structure integrally connected with the gate dielectric layer 152.

A lower surface level of each of the plurality of source/drain regions 530 may be higher than an upper surface level of the bottom insulation structure 654. The bottom insulation structure 654 may be separated from the source/drain regions 530 with the first nanosheet N1 disposed therebetween. A plurality of bottom insulation structures 654 may be disposed on a single fin-type active area FA. One nanosheet stack structure NSS and one gate line 160 may be disposed on a single bottom insulation structure 654 on the single fin-type active area FA. Reference may be made to the detailed description of the bottom insulation structure 154 made above with reference to FIGS. 1 through 3B, in order to describe a material used to form the bottom insulation structure 654.

A semiconductor pattern 604 may be interposed between the upper surface FT of the fin-type active area FA and the source/drain regions 530. A width of the bottom insulation structure 654 in the X direction may be defined by the semiconductor pattern 604. Each source/drain region 530 may be separated from the fin-type active area FA with the semiconductor pattern 604 and the first nanosheet N1 disposed therebetween. The semiconductor pattern 604 may be formed of a material that is different from that used to form the first nanosheet N1. According to some embodiments, the semiconductor pattern 604 may be formed of SiGe.

Figure 9:
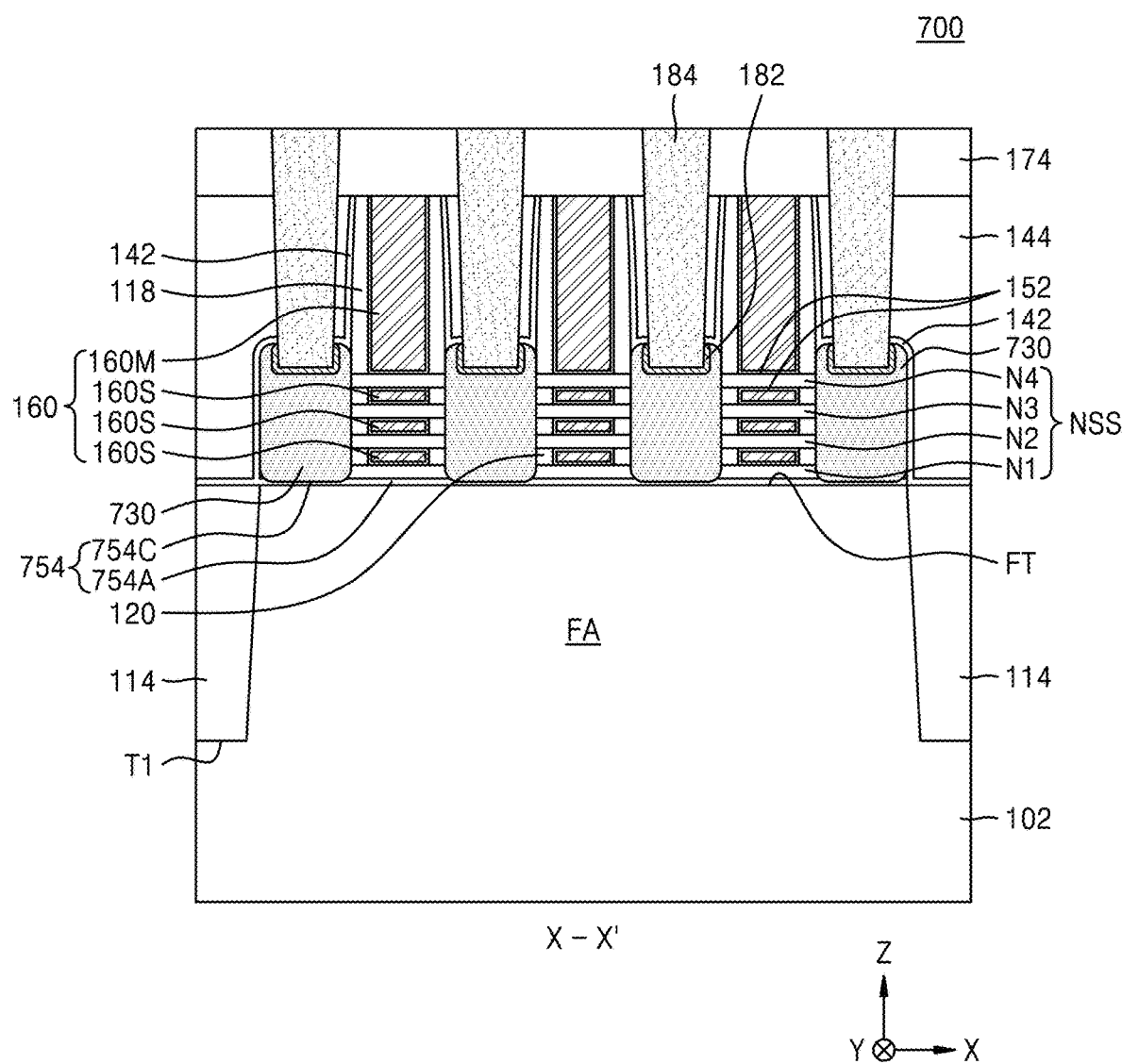

FIG. 9 is a cross-sectional view for explaining an IC device 700 according to embodiments. FIG. 9 illustrates a cross-sectional structure of a portion of the IC device 700 corresponding to the cross-section taken along the line X-X' of FIG. 1. The same reference characters and numerals in FIG. 9 as those in FIGS. 1 through 3B denote the same elements, and thus their description will be omitted herein.

Referring to FIG. 9, the IC device 700 has almost the same structure as that of the IC device 100 described above with reference to FIGS. 1 through 3B. However, in the IC device 700, a plurality of source/drain regions 730 are formed on the fin-type active area FA. Both sidewalls of each of the plurality of nanosheets N1, N2, N3, and N4 may contact the plurality of source/drain regions 730.

According to some embodiments, a thickness of the first nanosheet N1 may be different from that of each of the second through fourth nanosheets N2, N3, and N4. For example, the thickness of the first nanosheet N1 may be less than that of each of the second through fourth nanosheets N2, N3, and N4. According to embodiments, the thickness of the first nanosheet N1 may be substantially equal to or similar to that of each of the second through fourth nanosheets N2, N3, and N4.

The IC device 700 may include a bottom insulation structure 754 extending in the X direction on the upper surface FT of the fin-type active area FA. The bottom insulation structure 754 may include a first insulation portion 754A that fills a space between the first nanosheet N1 and the fin-type active area FA, a second insulation portion 154B (see FIG. 2B) extending from both sides of the first insulation portion 754A in the Y direction and interposed between the isolation layer 114 and the gate line 160, and a third insulation portion 754C extending from both sides of the first insulation portion 754A in the X direction and interposed between the fin-type active area FA and source/drain regions 730. The first insulation portion 754A and the third insulation portion 754C may be integrally connected to each other, and a thickness of the third insulation portion 754C may be less than that of the first insulation portion 754A. The bottom insulation structure 754 may have a structure integrally connected with the gate dielectric layer 152.

An upper surface of the bottom insulation structure 754 may contact a lower surface of each of the plurality of source/drain regions 730. A thickness of portions of the bottom insulation structure 754 that are vertically overlapped by the plurality of source/drain region 730 may be less than that of portions of the bottom insulation structure 754 that are vertically overlapped by each gate line 160. A lower surface level of each of the plurality of source/drain regions 730 may be higher than the level of the upper surface FT of the fin-type active area FA. One bottom insulation structure 754 may be disposed on one fin-type active area FA, and a plurality of nanosheet stack structures NSS, a plurality of gate lines 160, and a plurality of source/drain regions 730 may be disposed on the single bottom insulation structure 754 on the single fin-type active area FA. Reference may be made to the descriptions of the bottom insulation structure 154 and the source/drain regions 130 made above with reference to FIGS. 1 through 3B in order to describe materials used to form the bottom insulation structure 754 and the source/drain regions 730.

Similar to the IC device 100 described above with reference to FIGS. 1 through 3B, the IC device 700 may include second insulation spacers 120 that are formed in spaces between the plurality of nanosheets N1, N2, N3, and N4 and contact the source/drain regions 730. However, in contrast with the IC device 100, the IC device 700 may not include the second insulation spacers 120B disposed between the fin-type active area FA and the first nanosheet N1.

Figure 10:
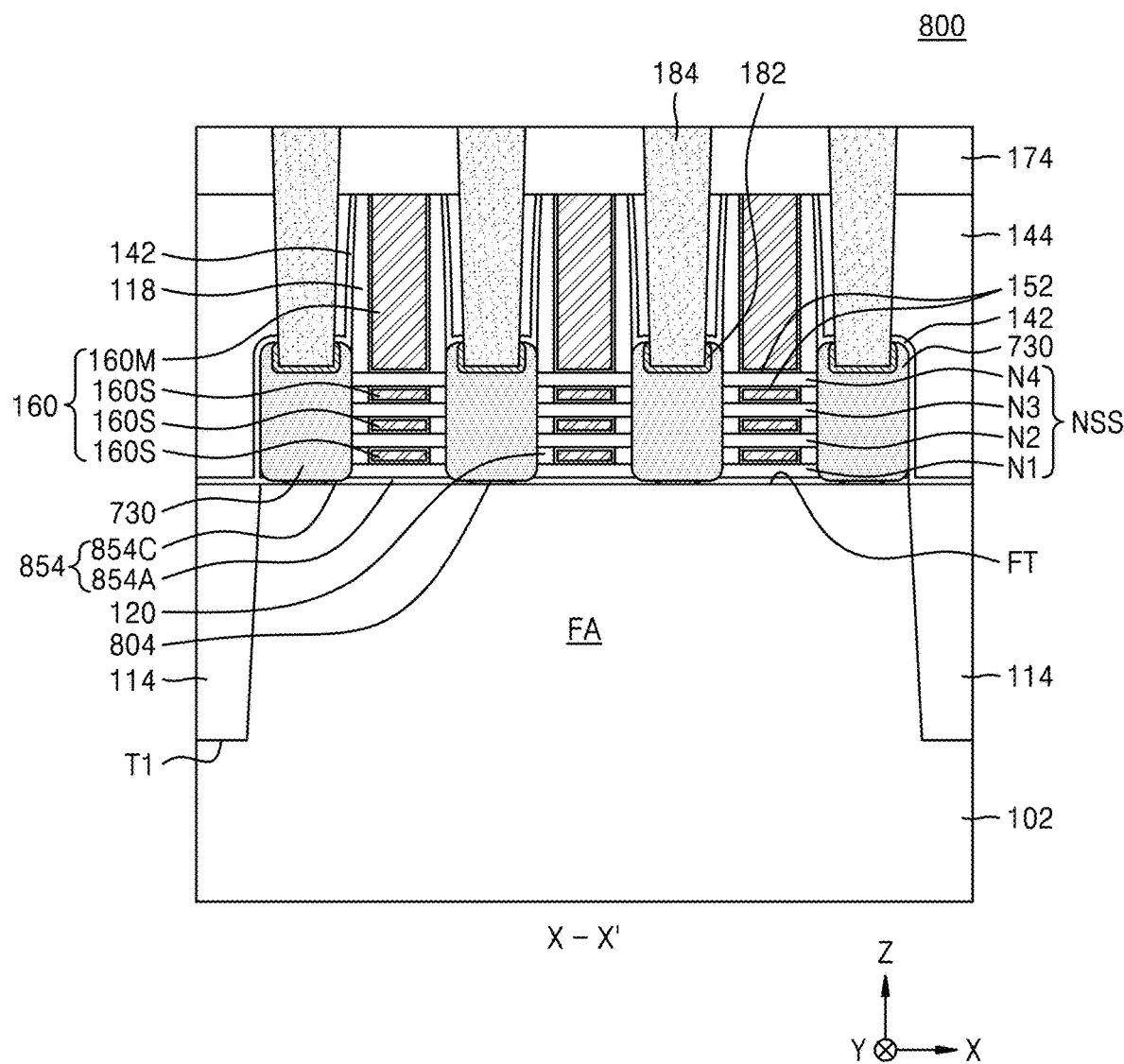

FIG. 10 is a cross-sectional view for explaining an IC device 800 according to other embodiments. FIG. 10 illustrates a cross-sectional structure of a portion of the IC device 800 corresponding to the cross-section taken along the line X-X' of FIG. 1. The same reference characters and numerals in FIG. 10 as those in FIGS. 1 through 3B denote the same elements, and thus their description will be omitted herein.

Referring to FIG. 10, the IC device 800 has almost the same structure as that of the IC device 700 described above with reference to FIG. 9. However, the IC device 800 may include a bottom insulation structure 854 extending in the X direction on the upper surface FT of the fin-type active area FA. The bottom insulation structure 854 may include a first insulation portion 854A that fills a space between the first nanosheet N1 and the fin-type active area FA, a second insulation portion 154B (see FIG. 2B) extending from both sides of the first insulation portion 854A in the Y direction and interposed between the isolation layer 114 and the gate line 160, and a third insulation portion 854C extending from both sides of the first insulation portion 854A in the X direction and interposed between the fin-type active area FA and source/drain regions 730. The first insulation portion 854A and the third insulation portion 854C may be integrally connected to each other, and a thickness of the third insulation portion 854C may be less than that of the first insulation portion 854A. The bottom insulation structure 854 may have a structure integrally connected with the gate dielectric layer 152.

A lower surface level of each of the plurality of source/drain regions 730 may be higher than the level of the upper surface FT of the fin-type active area FA. The bottom insulation structure 854 may contact the source/drain regions 730. A plurality of bottom insulation structures 854 may be disposed on a single fin-type active area FA. One nanosheet stack structure NSS and one gate line 160 may be disposed on a single bottom insulation structure 854 on the single fin-type active area FA. Reference may be made to the detailed description of the bottom insulation structure 154 made above with reference to FIGS. 1 through 3B, in order to describe a material used to form the bottom insulation structure 854.

A semiconductor pattern 804 may be interposed between the upper surface FT of the fin-type active area FA and the source/drain regions 730. A width of the bottom insulation structure 854 in the X direction may be defined by the semiconductor pattern 804. Each source/drain region 730 may be separated from the fin-type active area FA with the semiconductor pattern 804 disposed therebetween. The semiconductor pattern 804 may be formed of a material that is different from that used to form the first nanosheet N1. According to some embodiments, the semiconductor pattern 804 may be formed of SiGe.

In the IC devices 200, 300, 400, 500, 600, 700, and 800 described above with reference to FIGS. 4A through 10, the spaces between the first nanosheets N1 and N31 closest to the fin-type active area FA from among the plurality of nanosheets N1, N2, N3, and N4 and from among the plurality of nanosheets N31, N2, N3, and N4, respectively, and the fin-type active area FA are filled with the bottom insulation structures 154, 254, 454, 554, 654, 754, and 854, and the gate lines 160 and 460 do not include the sub-gate portions disposed between the first nanosheets N1 and N31 and the fin-type active area FA. Accordingly, formation of an unwanted channel around the upper surface FT of the fin-type active area FA facing the first nanosheets N1 and N31 may be suppressed, and thus no unwanted parasitic transistors may be formed. Thus, electrical characteristic degradation may be prevented from occurring due to parasitic transistors.

FIGS. 11 through 28B are cross-sectional views for explaining a method of manufacturing an IC device, according to embodiments. A method of manufacturing the IC device 100 of FIGS. 1 thorough 3B will now be described with reference to FIGS. 11 through 28B. FIGS. 11, 12A, 13A, 14A, 15A, 16A, 17-22, 23A, 24A, 25A, 26A, 27A, and 28A are cross-sectional views for explaining a method of manufacturing a portion of the IC device 100 corresponding to the cross-section taken along the line X-X' of FIG. 1, and FIGS. 12B, 13B, 14B, 15B, 16B, 23B, 24B, 25B, 26B, 27B, and 28B are cross-sectional views for explaining a method of manufacturing a portion of the IC device 100 corresponding to the cross-section taken along the line Y-Y' of FIG. 1. The same reference characters and numerals in FIGS. 11 through 28B as those in FIGS. 1 through 3B denote the same elements, and thus their description will be omitted herein.

Figure 11:
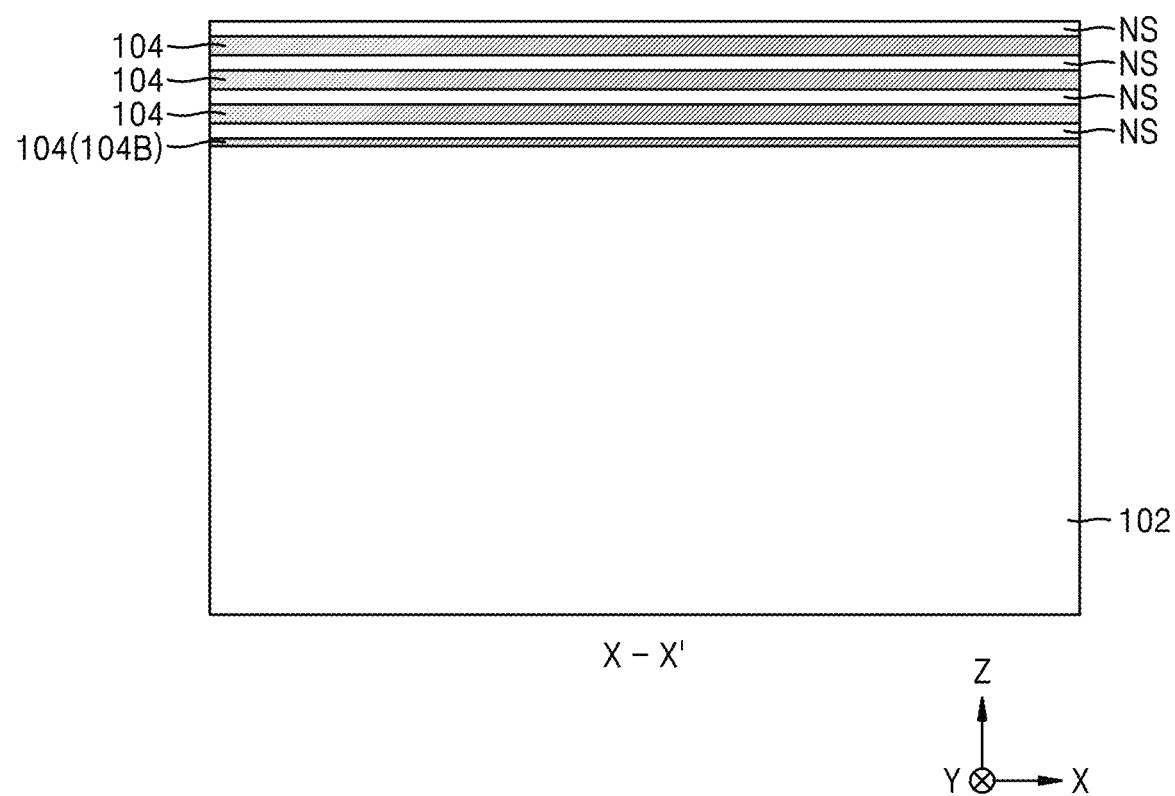

Referring to FIG. 11, a plurality of sacrificial semiconductor layers 104 and a plurality of nanosheet semiconductor layers NS are alternately stacked on the substrate 102.

A height of a sacrificial semiconductor layer 104B closest to the substrate 102 from among the plurality of sacrificial semiconductor layers 104 may be less than that of each of the other sacrificial semiconductor layers 104. According to embodiments, the height of the sacrificial semiconductor layer 104B closest to the substrate 102 may be less than or equal to ½ of each of the other sacrificial semiconductor layers 104.

According to embodiments, a semiconductor material forming the plurality of sacrificial semiconductor layers 104 may be the same or different from a semiconductor material forming the plurality of nanosheet semiconductor layers NS. According to embodiments, the plurality of sacrificial semiconductor layers 104 may be formed of SiGe, and the plurality of nanosheet semiconductor layers NS may be formed of Si. According to embodiments, the sacrificial semiconductor layer 104B closest to the substrate 102 from among the plurality of sacrificial semiconductor layers 104 may be formed of a material having a different etch selectivity from that of each of the other sacrificial semiconductor layers 104. For example, each of the plurality of sacrificial semiconductor layers 104 may be formed of an SiGe layer, but a Ge content ratio of the sacrificial semiconductor layer 104B closest to the substrate 102 may be different from those of the other sacrificial semiconductor layers 104.

Figure 12A:
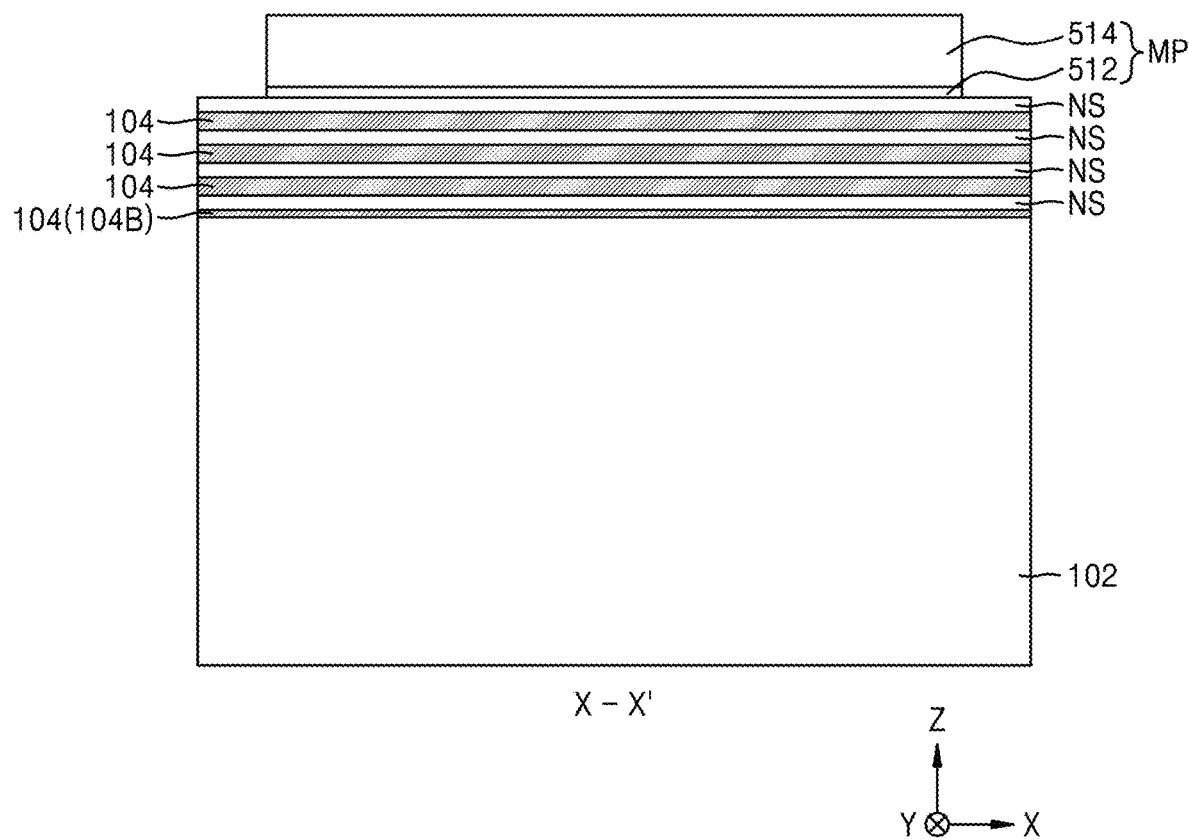
Figure 12B:
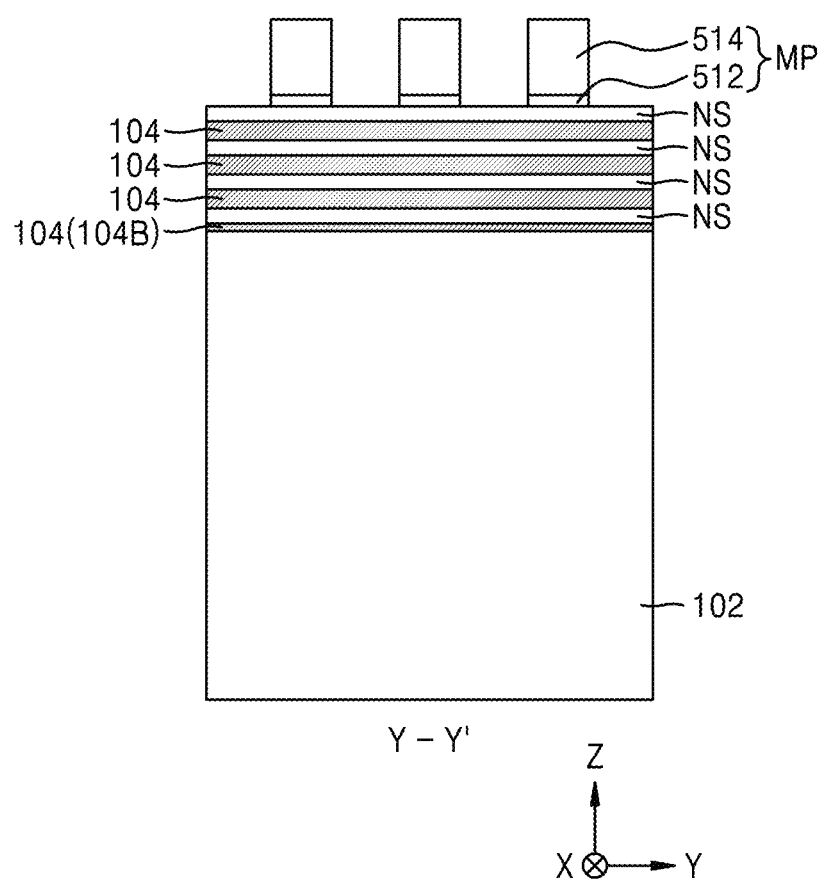

Referring to FIGS. 12A and 12B, a mask pattern MP is formed on a stack of the plurality of sacrificial semiconductor layers 104 and the plurality of nanosheet semiconductor layers NS. The mask pattern MP may be formed of a plurality of line patterns each extending parallel to one another in the X direction. The mask pattern MP may include a pad oxide layer pattern 512 and a hardmask pattern 514. The hard mask pattern 514 may be formed of silicon nitride, polysilicon, a spin on hardmask (SOH) material, or a combination thereof. The SOH material may be formed of a hydrocarbon compound having a relatively high carbon content of about 85% to about 99% by weight based on the overall weight of the SOH material.

Figure 13A:
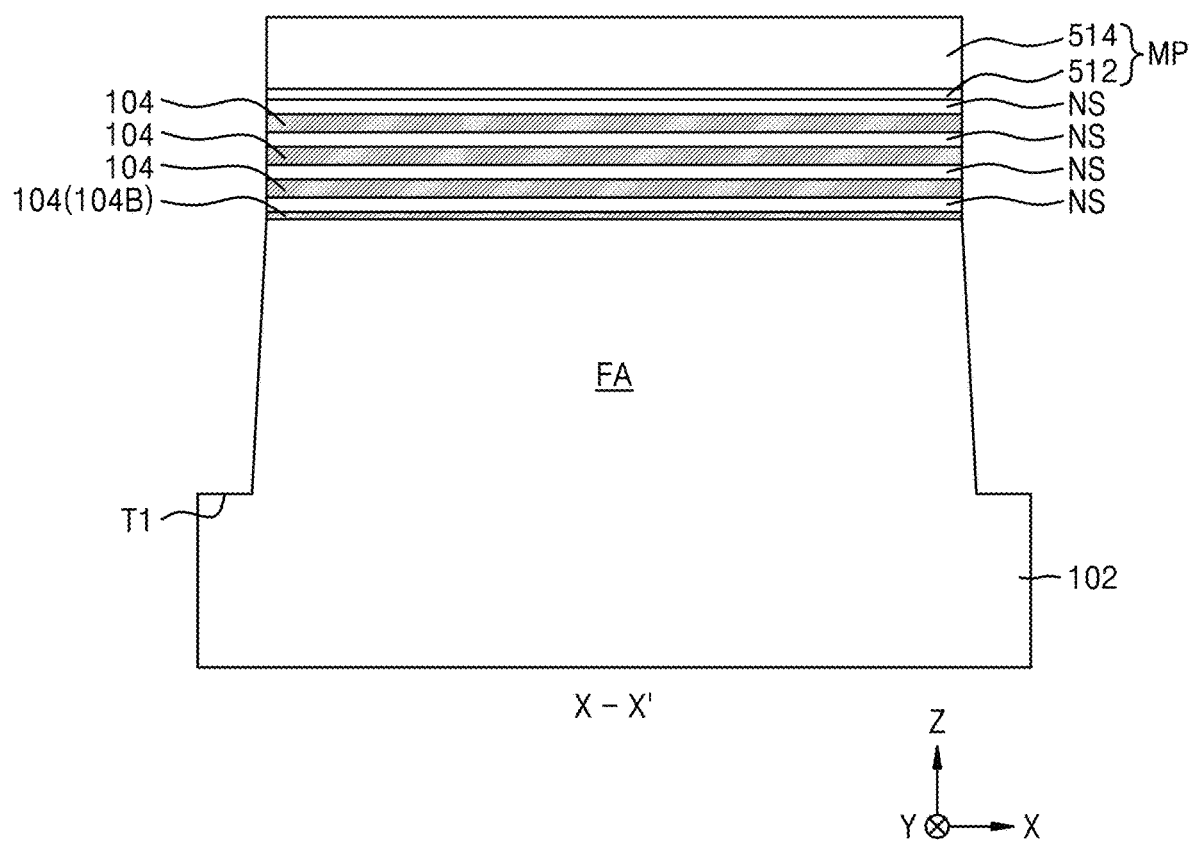
Figure 13B:
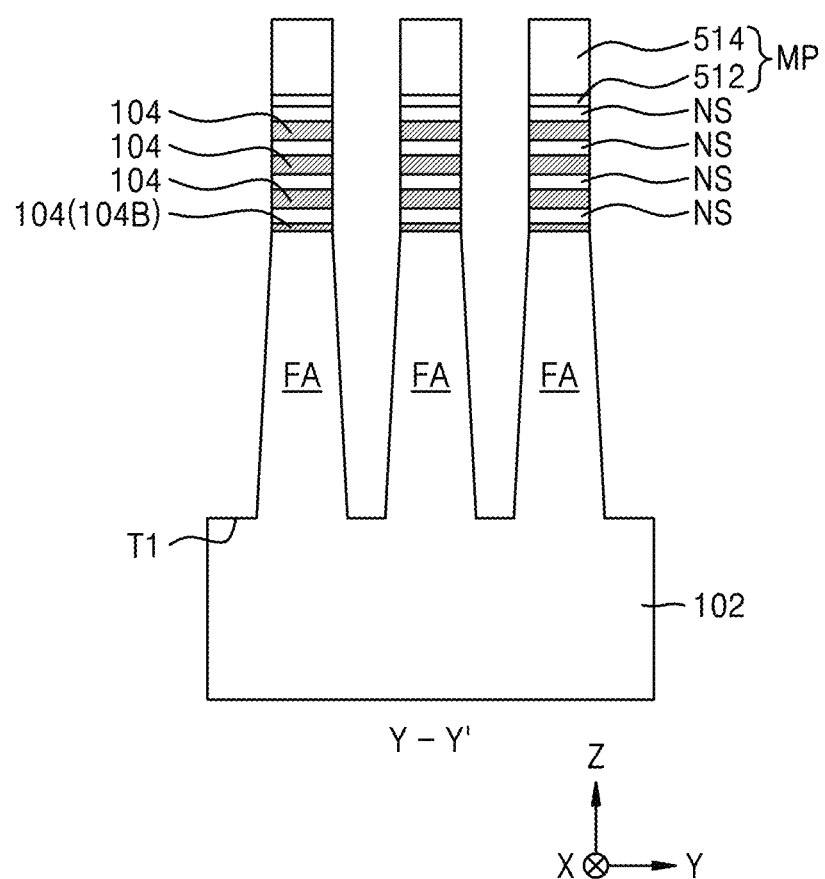

Referring to FIGS. 13A and 13B, the trenches T1 are formed by partially etching the plurality of sacrificial semiconductor layers 104, the plurality of nanosheet semiconductor layers NS, and the substrate 102 by using the mask pattern MP as an etch mask. As a result, the plurality of fin-type active areas FA that are defined by the trenches T1 are formed, and a stack of the plurality of sacrificial semiconductor layer 104 and the plurality of nanosheet semiconductor layers NS remains on each of the plurality of fin-type active areas FA.

Figure 14A:
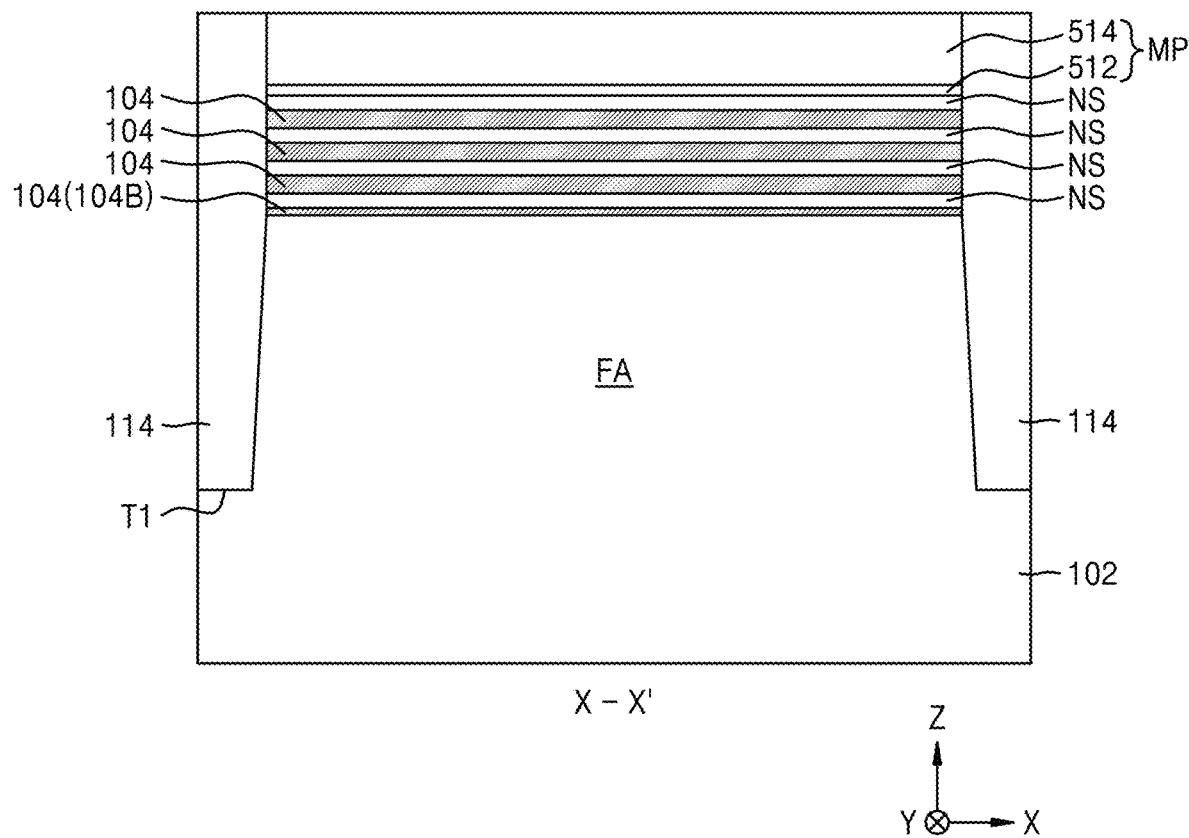
Figure 14B:
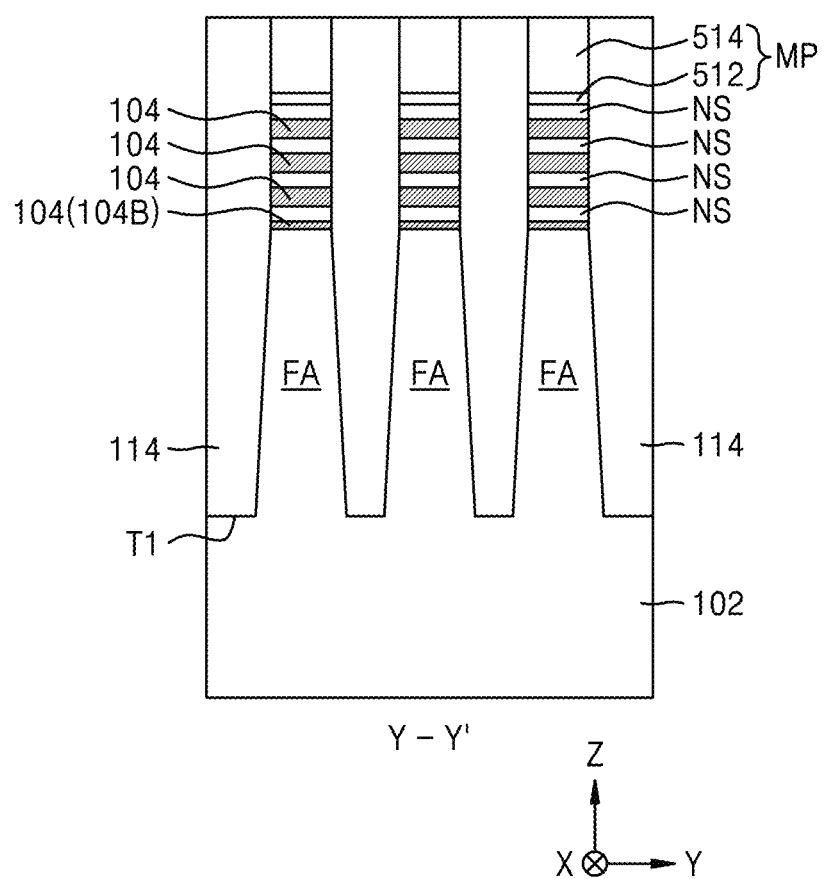

Referring to FIGS. 14A and 14B, the isolation layers 114 are formed within the trenches T1.

Figure 15A:
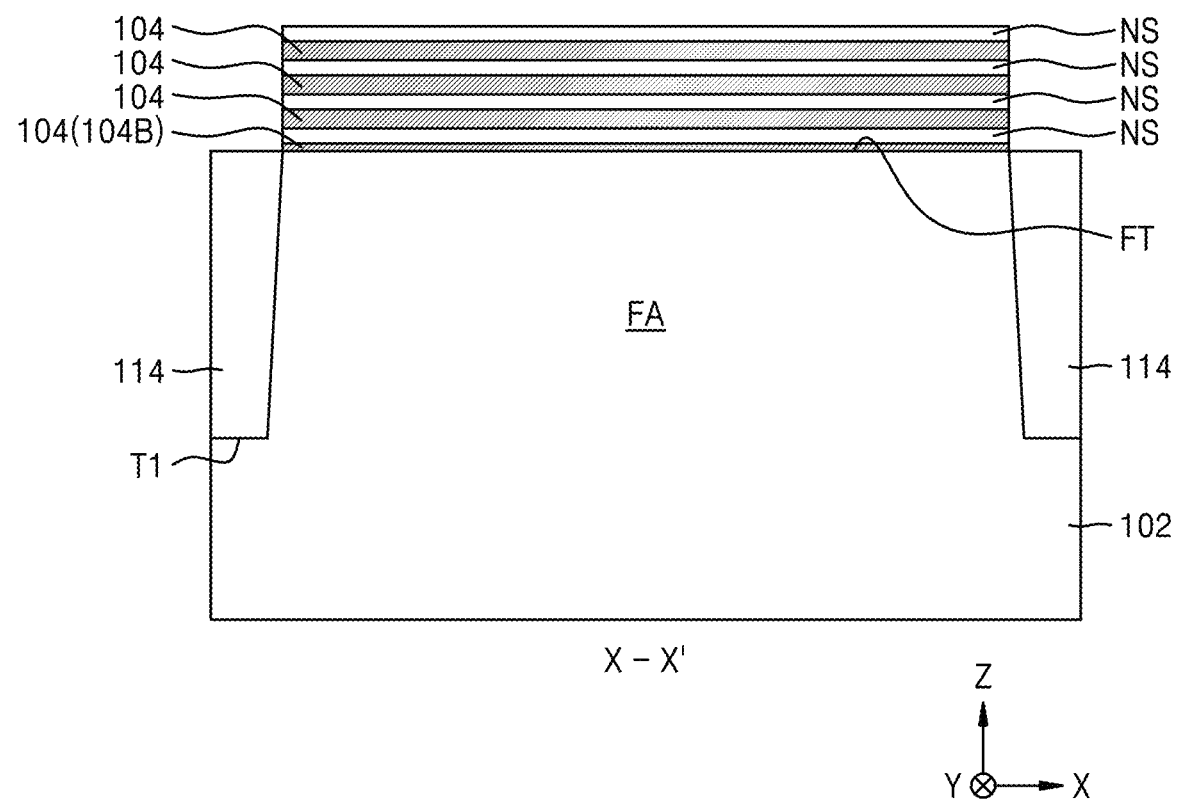
Figure 15B:
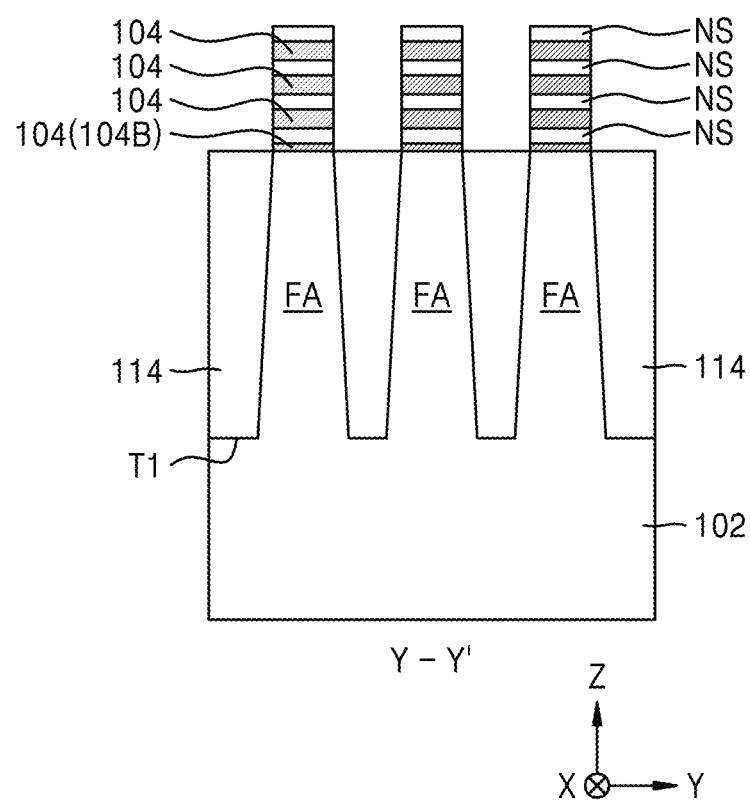

Referring to FIGS. 15A and 15B, the mask pattern MP is removed from a resultant structure of FIGS. 14A and 14B, and a recess process for partially removing the isolation layers 114 is performed such that upper surfaces of the isolation layers 114 may be on a level that is substantially the same as or similar to a level of the upper surface FT of the fin-type active area FA.

Figure 16A:
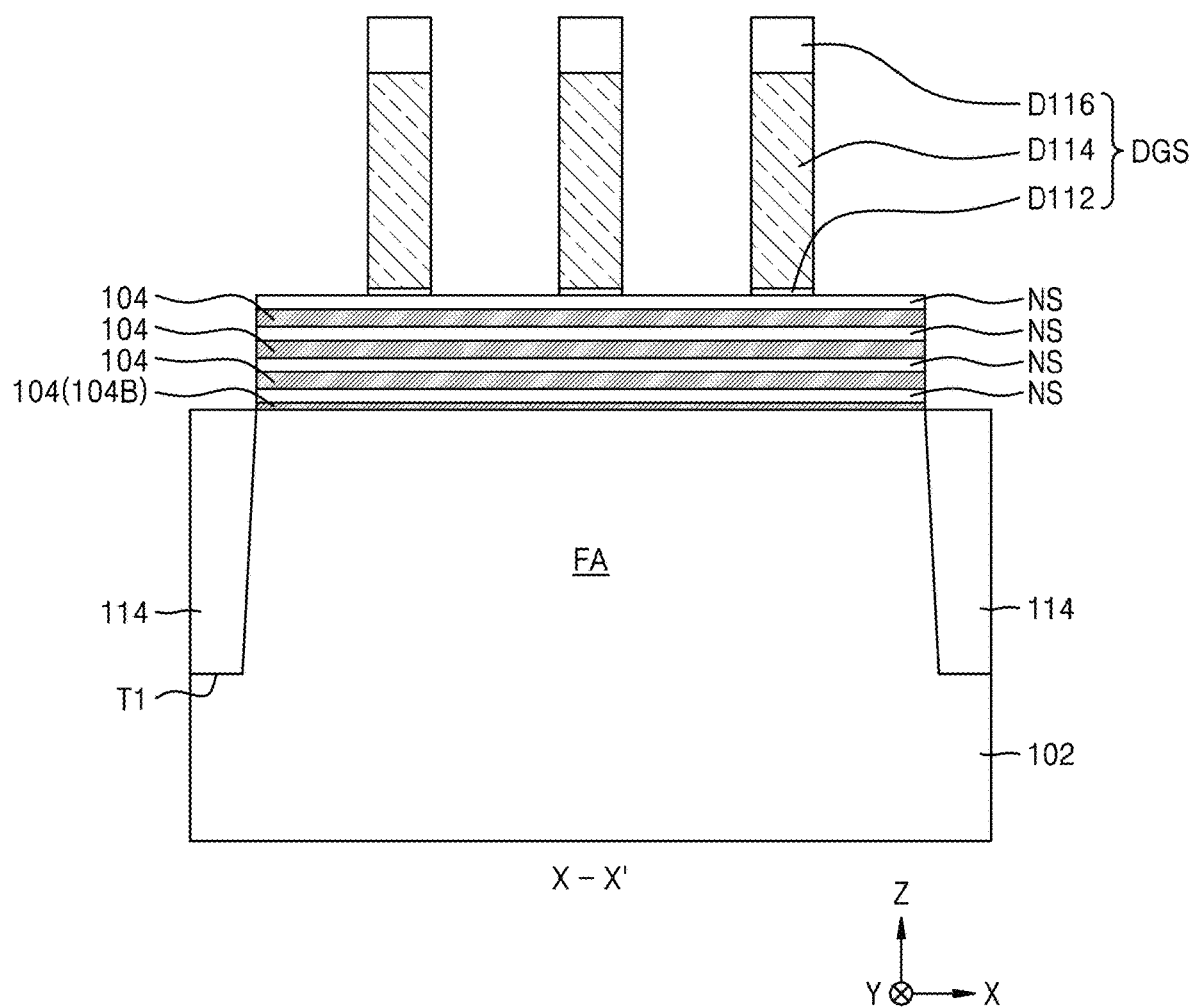
Figure 16B:
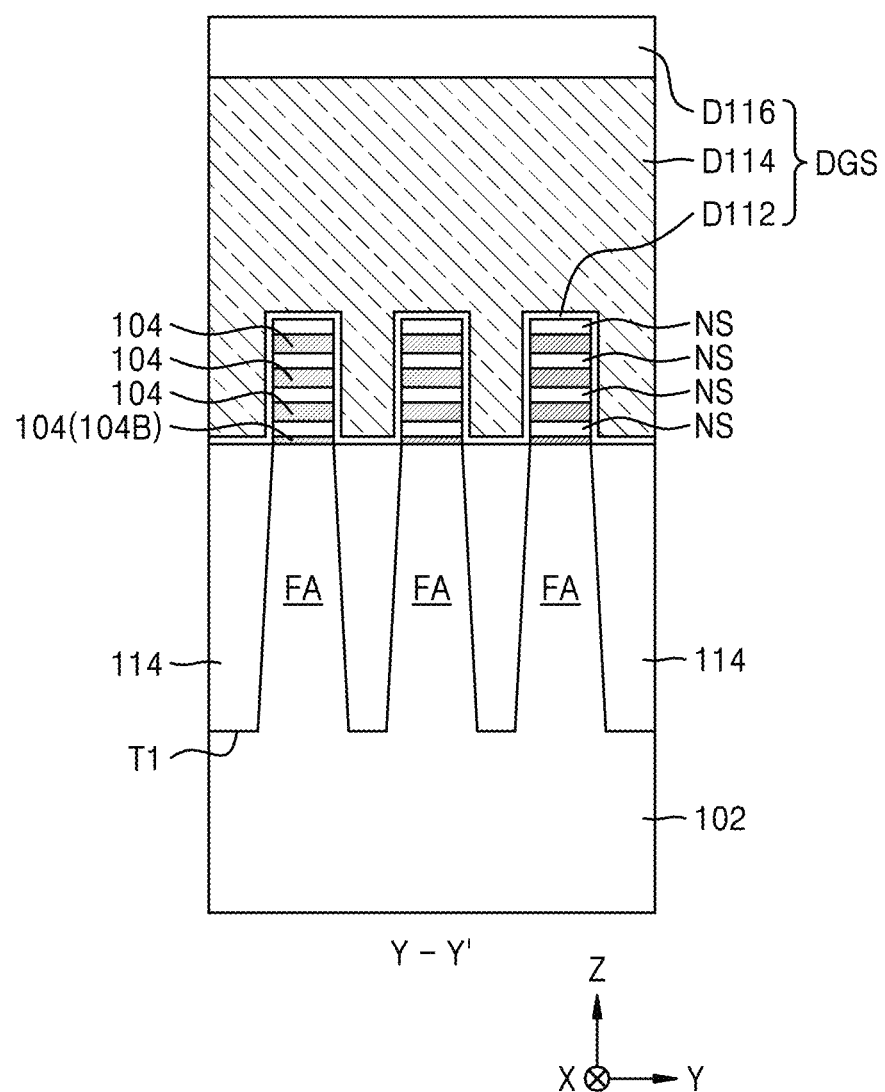

Referring to FIGS. 16A and 16B, a plurality of dummy gate structures DGS are formed on the plurality of fin-type active areas FA. Each of the plurality of dummy gate structures DGS may extend in a direction intersecting with a direction in which each of the plurality of fin-type active areas FA extends. Each of the plurality of dummy gate structures DGS may have a structure in which an oxide layer D112, a dummy gate layer D114, and a capping layer D116 are sequentially stacked. According to some embodiments, the dummy gate layer D114 may be formed of polysilicon, and the capping layer D116 may be formed of a silicon nitride layer.

Figure 17:
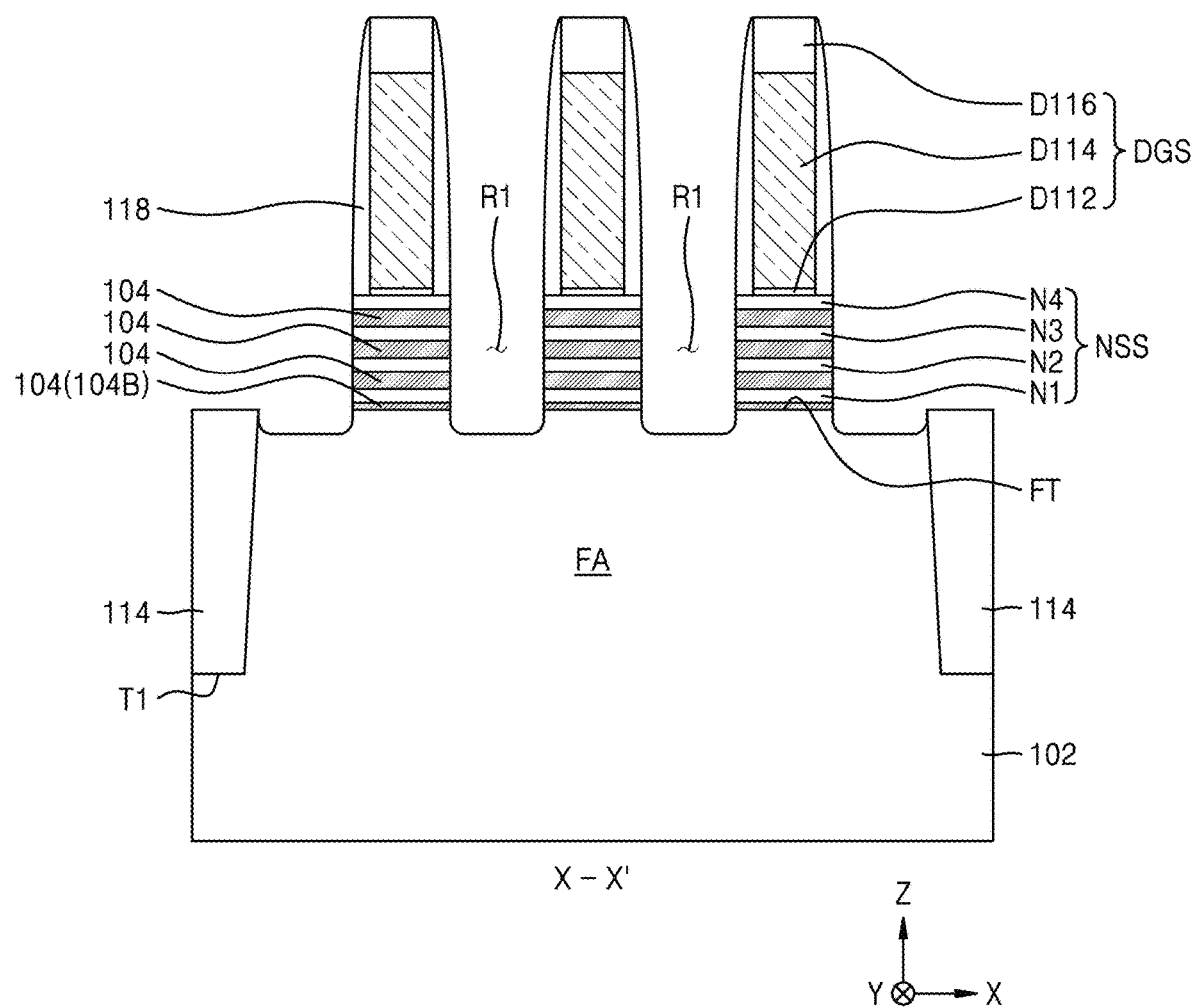

Referring to FIG. 17, the first insulation spacers 118 are formed to cover respective both sidewalls of the plurality of dummy gate structures DGS. The first insulation spacers 118 may be formed of a single layer or multiple layers formed of SiN, SiCN, SiBN, SiON, SiOCN, SiBCN, SiOC, $SiO_2$, or a combination thereof.

A plurality of recess regions R1 exposing the upper surface of the fin-type active area FA are formed by partially etching out the plurality of sacrificial semiconductor layers 104 and the plurality of nanosheet semiconductor layers NS by using the plurality of dummy gate structures DGS and the plurality of first insulation spacers 118 as an etch mask. A lower surface level of each of the plurality of recess regions R1 may be lower than the level of the upper surface FT of the fin-type active area FA.

After the plurality of recess regions R1 are formed, the plurality of nanosheet semiconductor layers NS may be divided into the plurality of nanosheet stack structures NSS each including the plurality of nanosheets N1, N2, N3, and N4.

Figure 18:
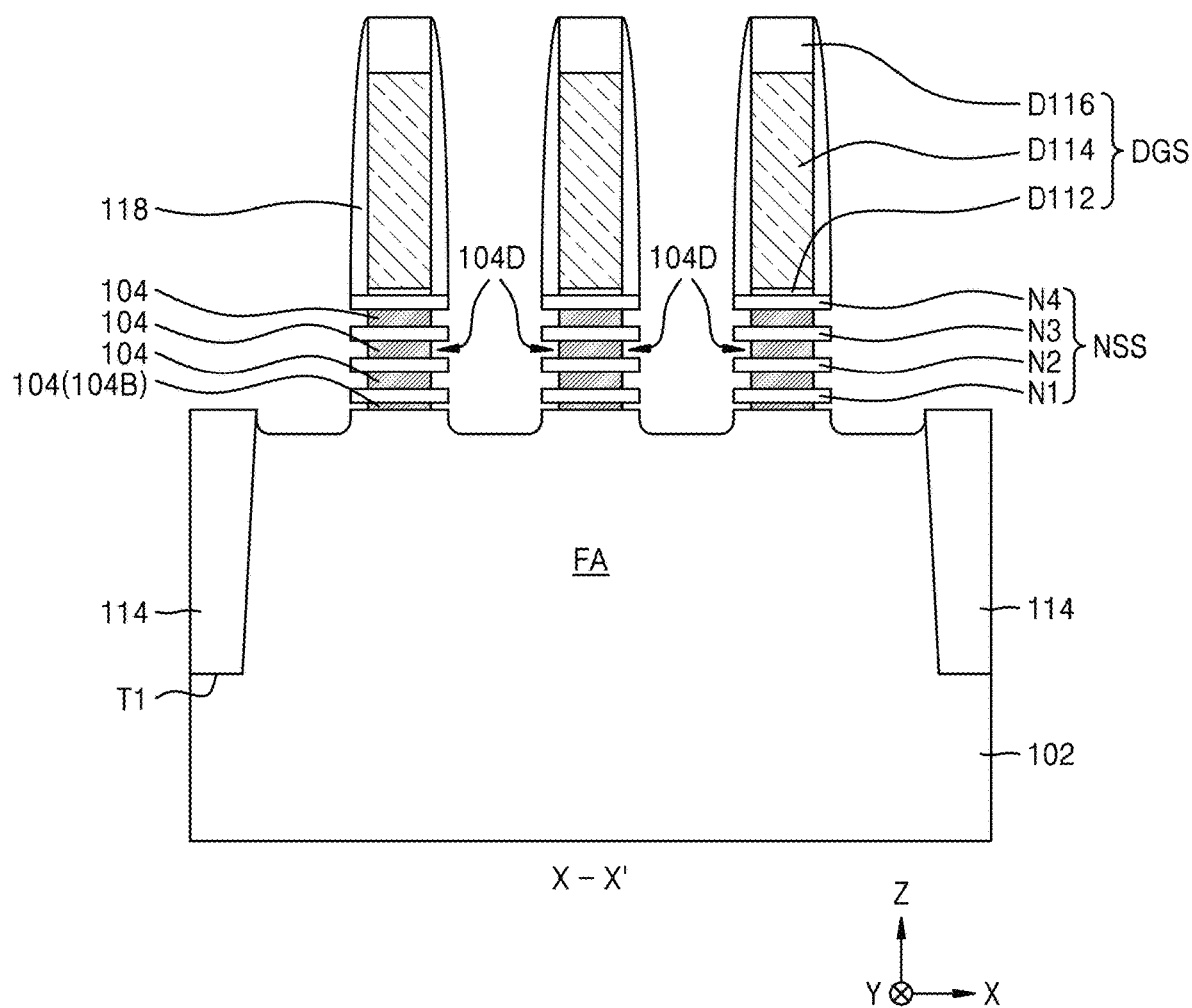

Referring to FIG. 18, indented regions 104D are formed between the plurality of nanosheets N1, N2, N3, and N4 of each nanostructure NSS by partially removing, via isotropic etching, portions of the plurality of sacrificial semiconductor layers 104 that are exposed on respective both sides of the plurality of nanosheet stack structures NSS. A height (size in the Z direction) of an indented region 104D closest to the fin-type active area FA from among the plurality of indented regions 104D may be less than that of each of the other indented regions 104D.

According to some embodiments, during the isotropic etching process for forming the plurality of indented regions 104D, a difference between an etch selectivity of the plurality of sacrificial semiconductor layers 104 and that of the plurality of nanosheets N1, N2, N3, and N4 may be used. The isotropic etching process may be performed in a dry or wet manner.

Figure 19:
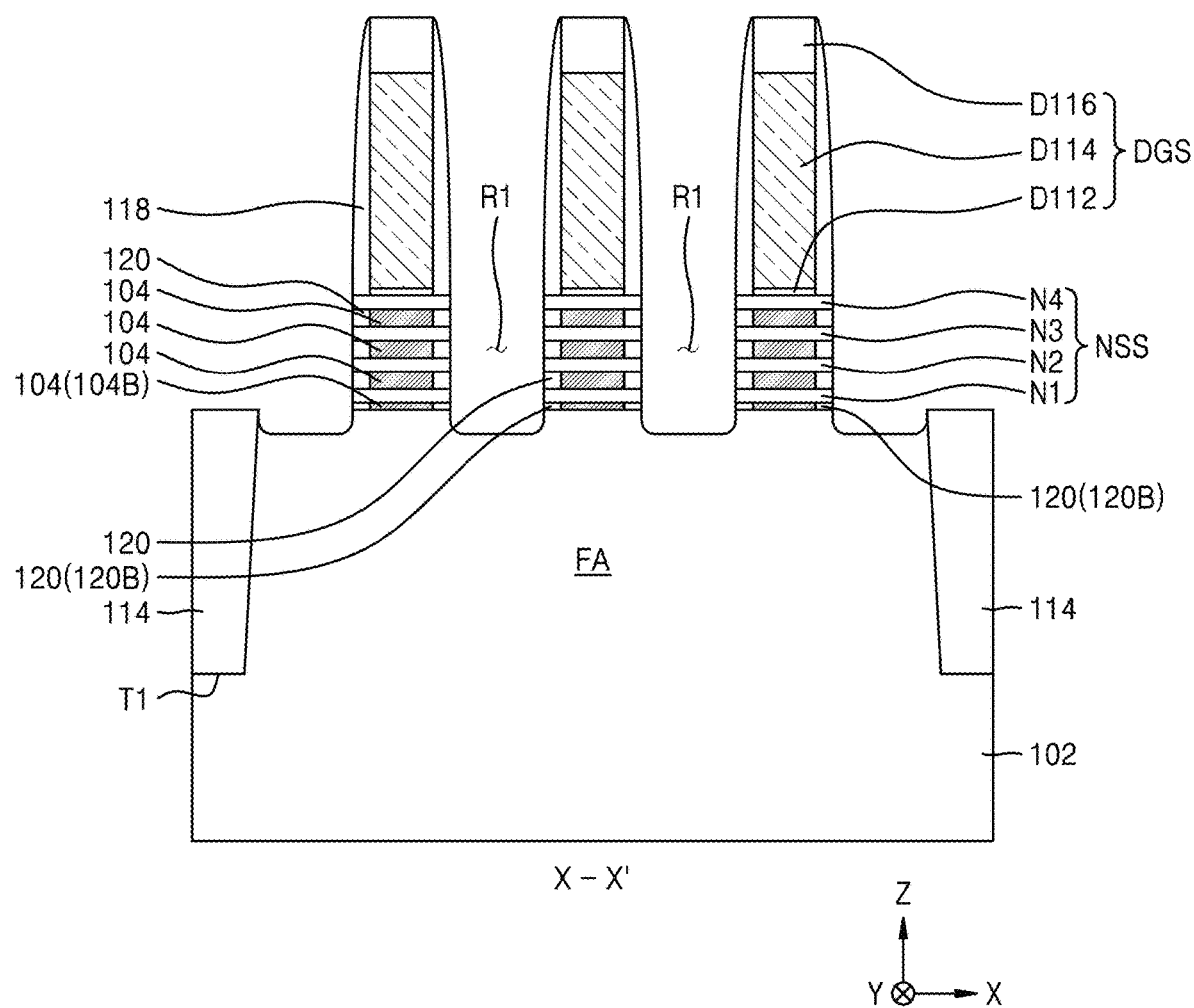

Referring to FIG. 19, the plurality of second insulation spacers 120 are formed to fill the plurality of indented regions 104D of FIG. 18. A height of the second insulation spacer 120B closest to the fin-type active area FA from among the plurality of second insulation spacers 120 may be less than that of each of the other plurality of second insulation spacers 120.

The plurality of second insulation spacers 120 may be formed by atomic layer deposition (ALD), chemical vapor deposition (CVD), oxidation, or a combination thereof.

Figure 20:
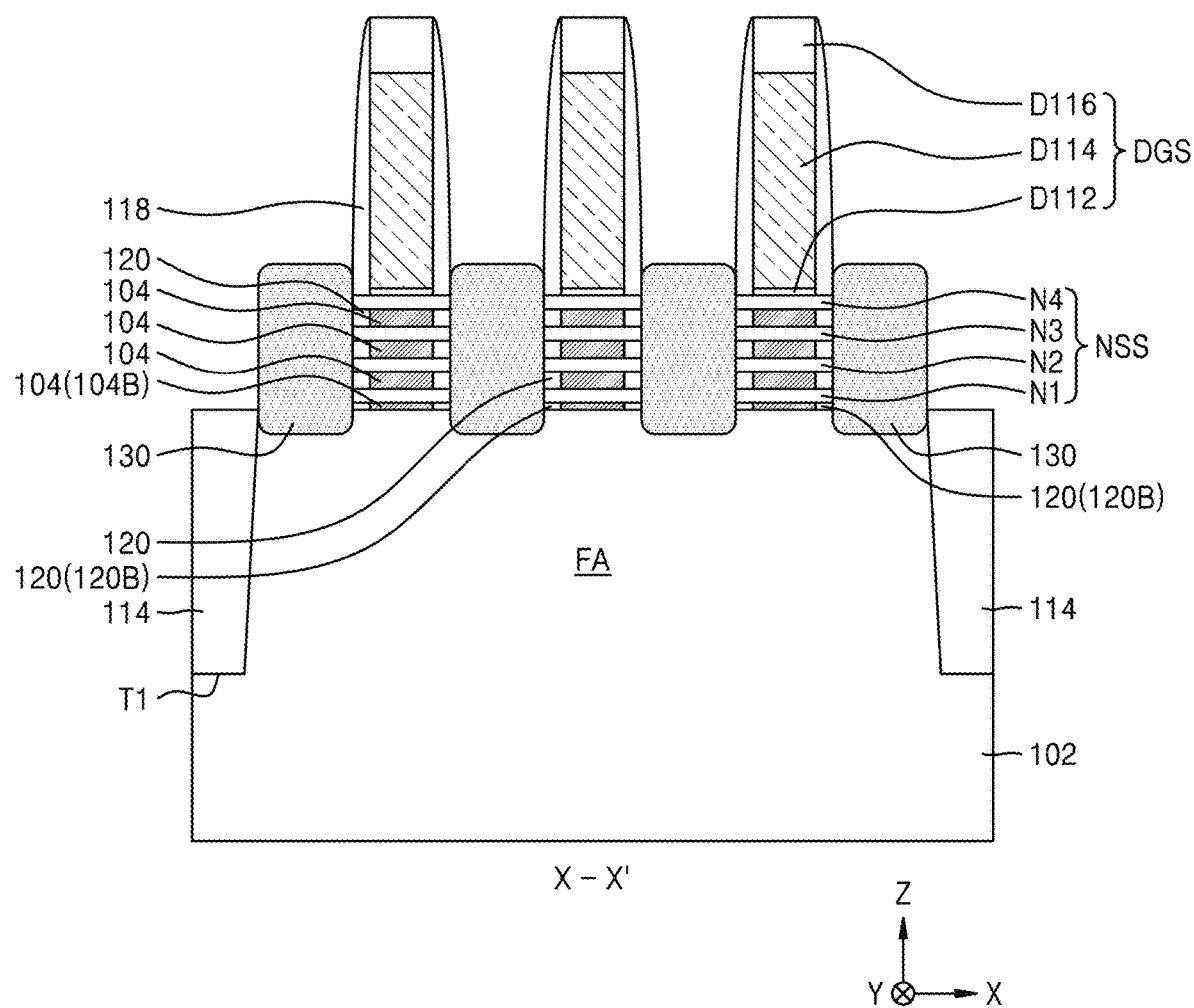

Referring to FIG. 20, the plurality of source/drain regions 130 are formed by epitaxially growing a semiconductor material from respective exposed both sidewalls of the plurality of nanosheets N1, N2, N3, and N4 and exposed surfaces of the fin-type active area FA.

Figure 21:
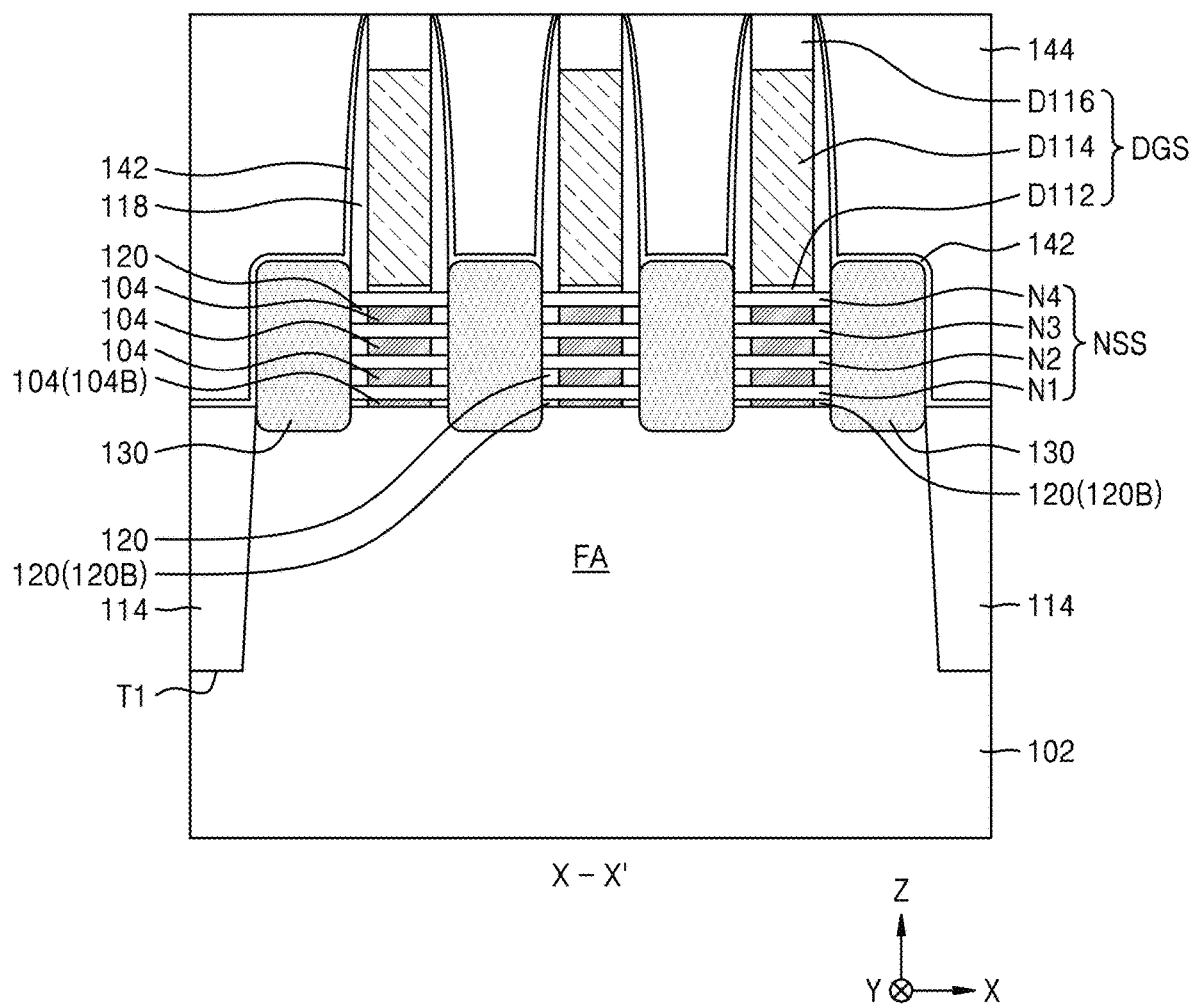

Referring to FIG. 21, the protective insulation layer 142 is formed to cover a resultant structure in which the plurality of source/drain regions 130 have been formed, and the inter-gate insulation layer 144 is formed on the protective insulation layer 142, and then the protective insulation layer 142 and the inter-gate insulation layer 144 are planarized to expose upper surfaces of the capping layers D116.

Figure 22:
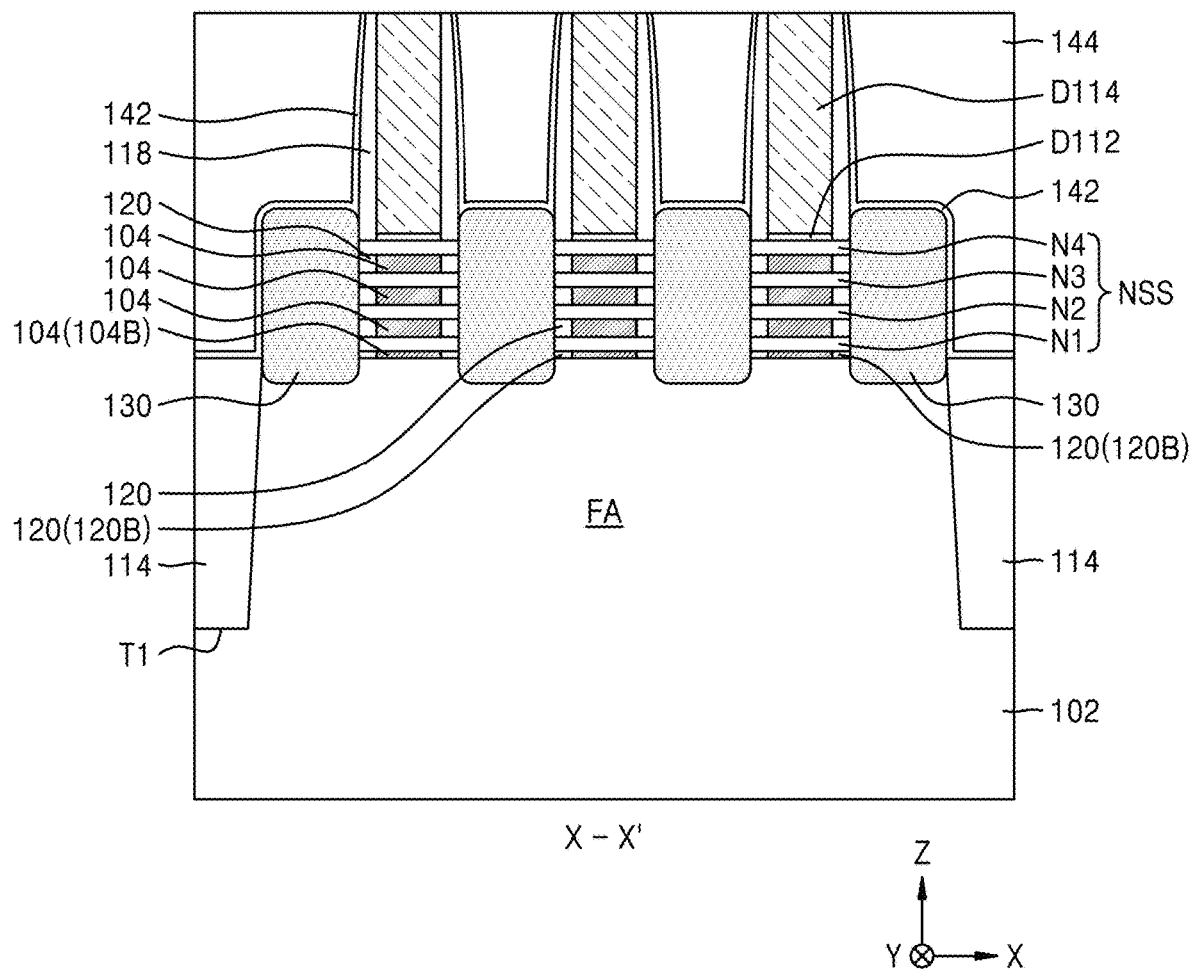

Referring to FIG. 22, the dummy gate layers D114 are exposed by removing the capping layers D116 from a resultant structure of FIG. 21, and the protective insulation layer 142 and the inter-gate insulation layer 144 are partially removed such that an upper surface of the inter-gate insulation layer 144 is on substantially the same level as that of each of the dummy gate layers D114.

Figure 23A:
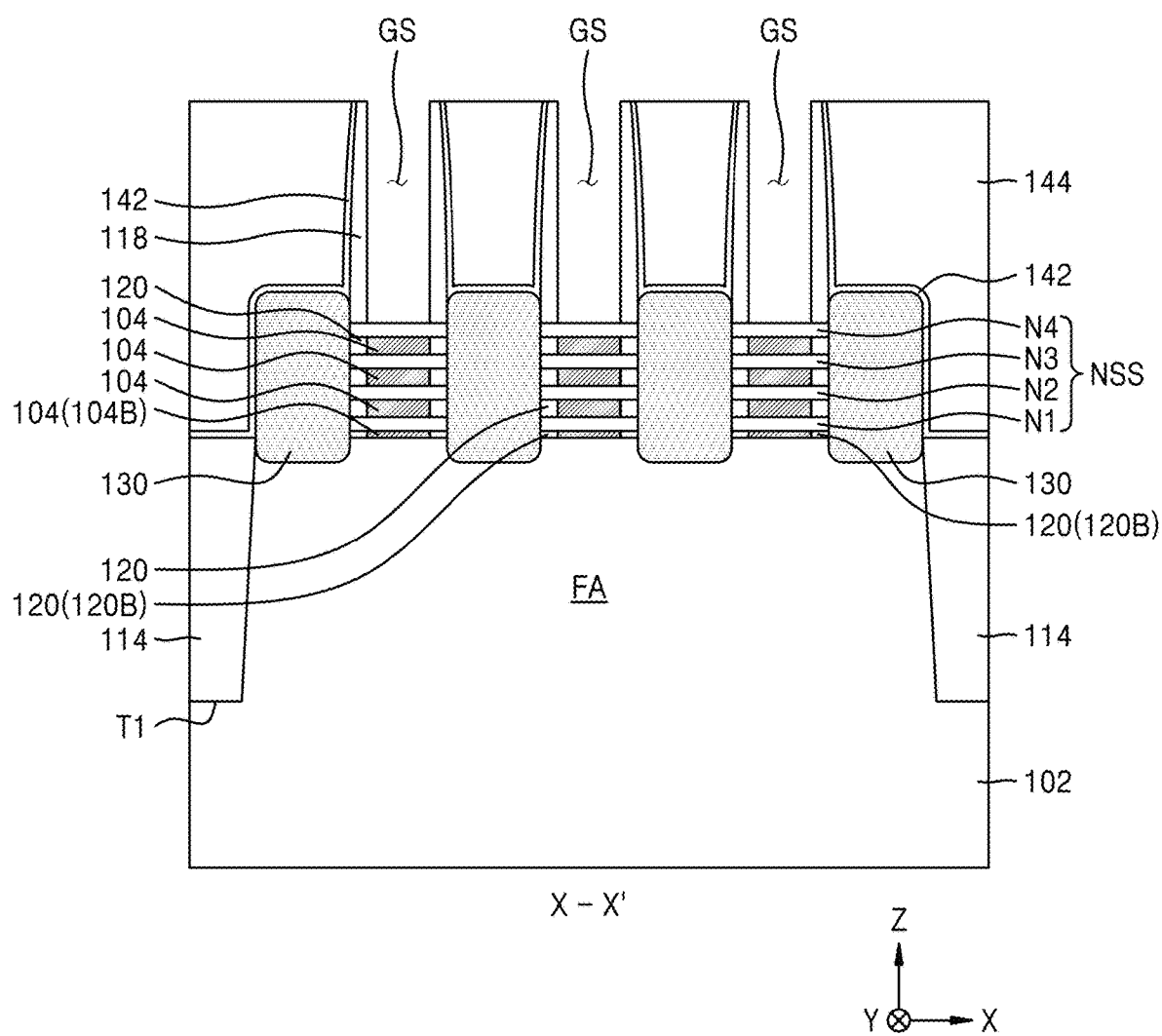
Figure 23B:
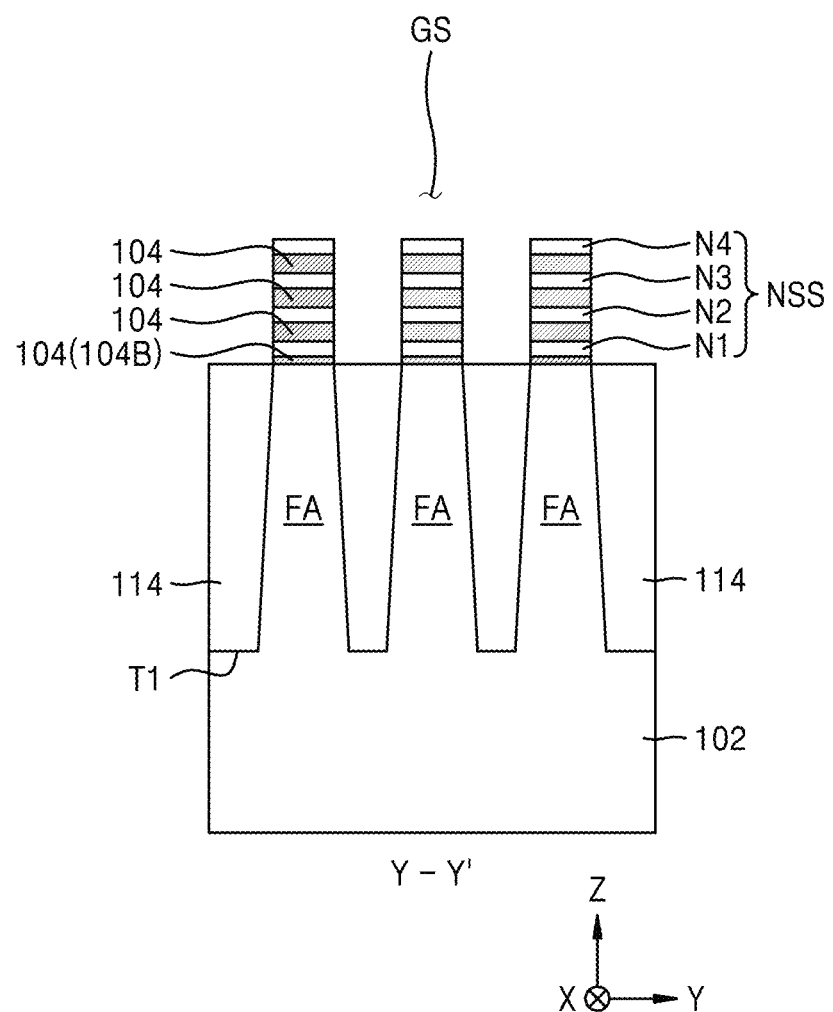

Referring to FIGS. 23A and 23B, gate spaces GS are provided by removing the dummy gate layers D114 and the oxide layers D112 below the dummy gate layers D114 from a resultant structure of FIG. 22, and the plurality of nanosheet stack structures NSS are exposed via the gate spaces GS.

Figure 24A:
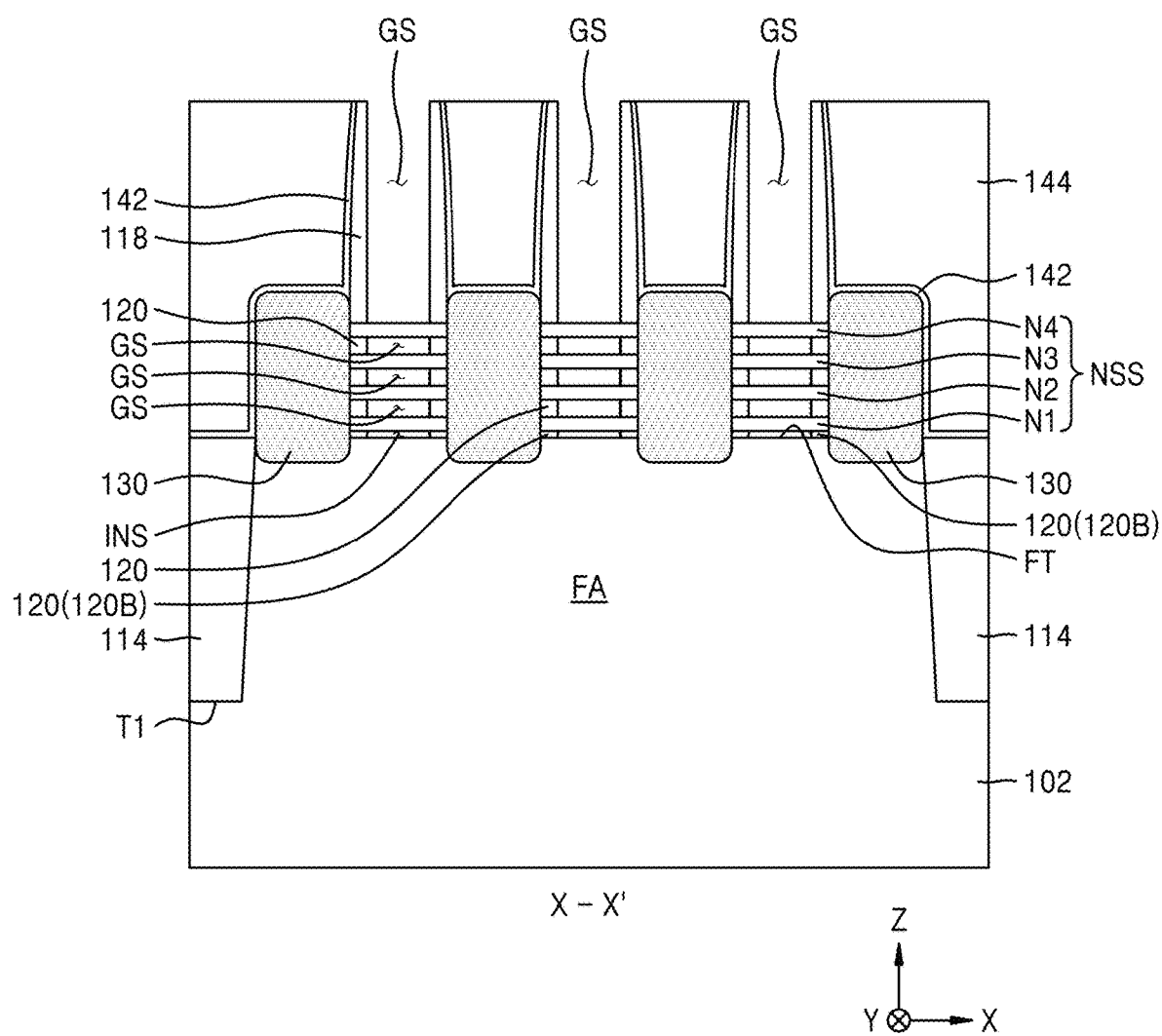
Figure 24B:
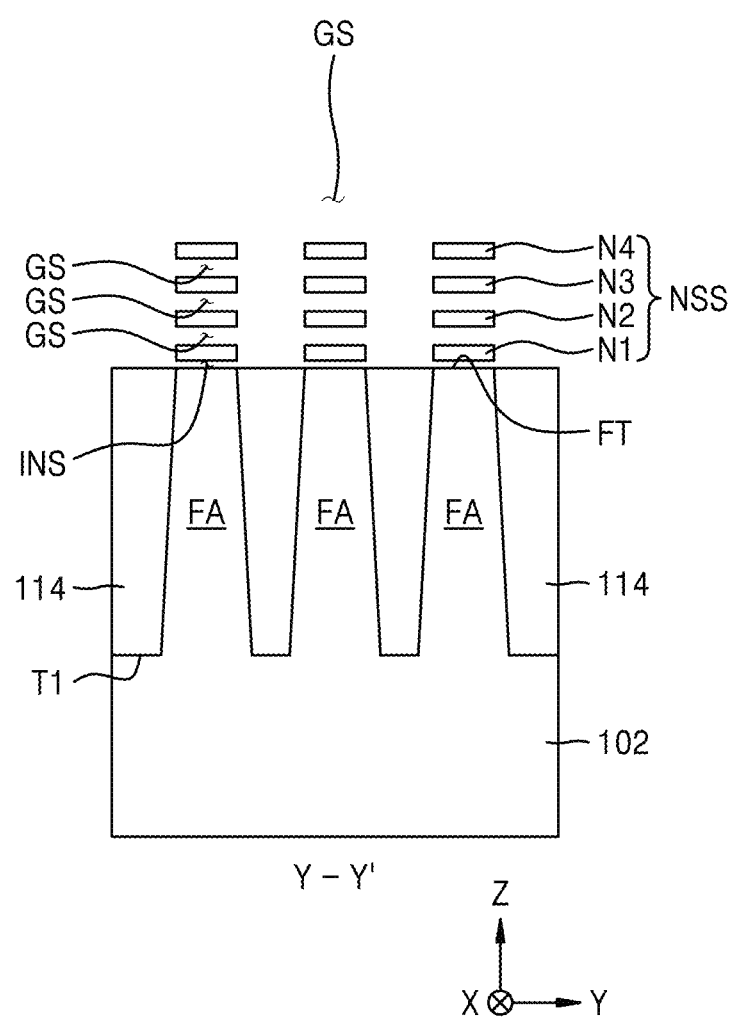

Referring to FIGS. 24A and 24B, the plurality of sacrificial semiconductor layers 104 remaining on the fin-type active area FA are removed via the gate spaces GS, and thus the gate spaces GS are expanded to spaces between the plurality of nanosheets N1, N2, N3, and N4. The plurality of nanosheets N1, N2, N3, and N4 may be exposed via the expanded gate spaces GS. Insulation spaces INS may be formed between lower surfaces of the first nanosheets N1 and the upper surface FT of the fin-type active area FA.

Figure 25A:
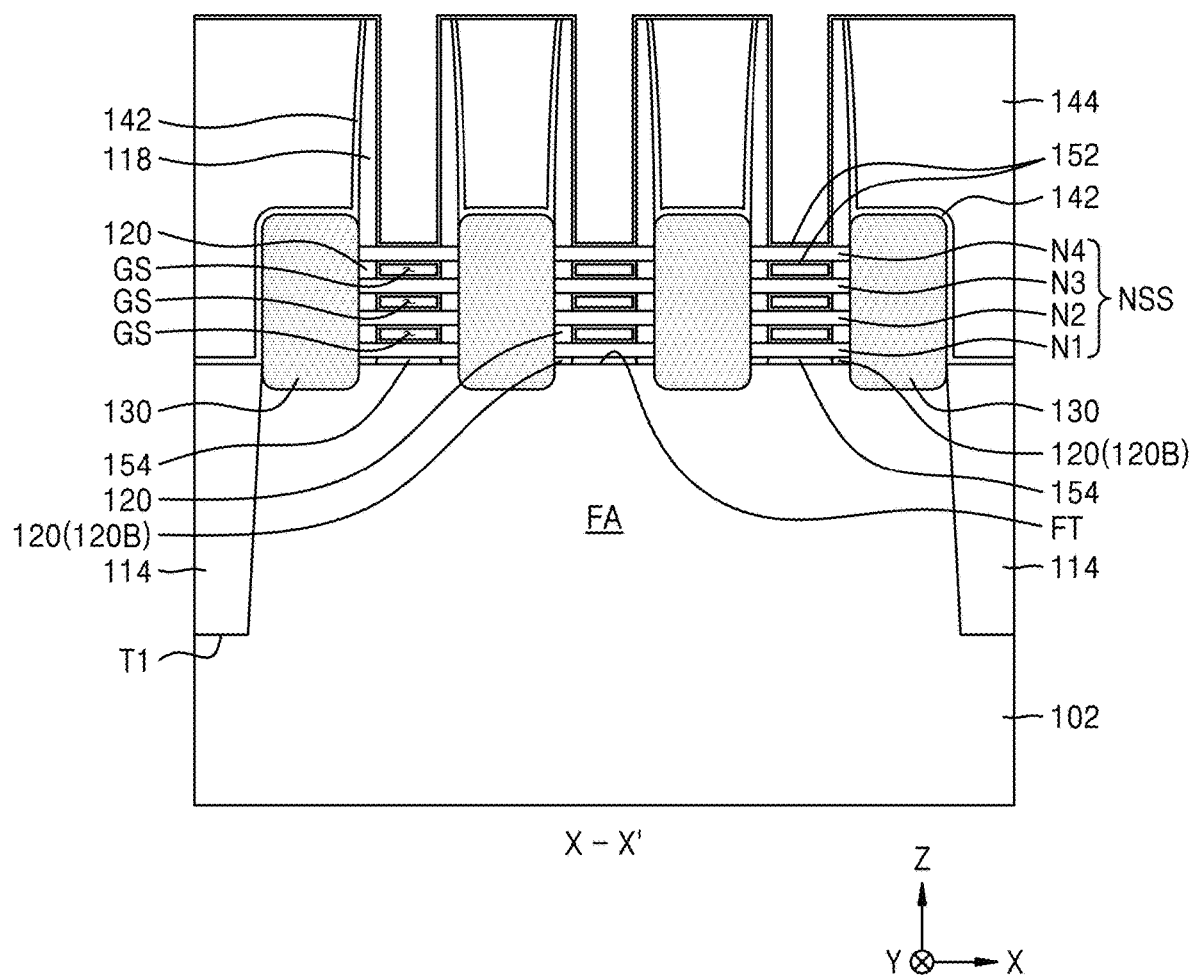
Figure 25B:
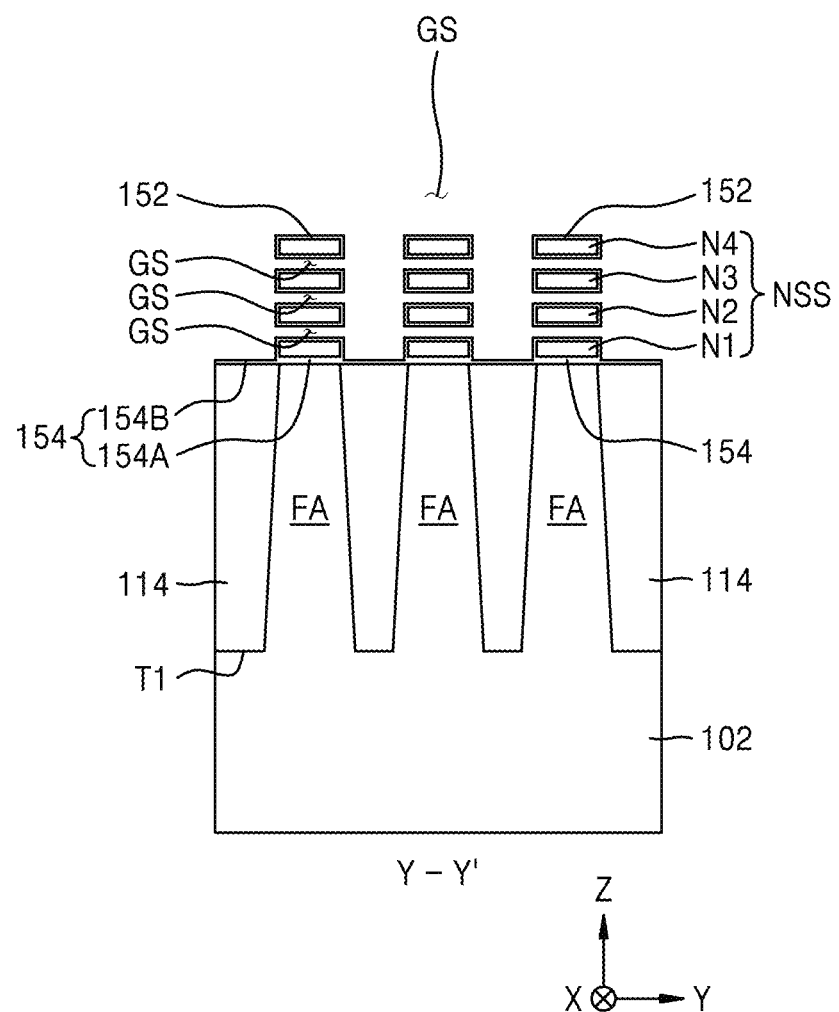

Referring to FIGS. 25A and 25B, the gate dielectric layer 152 and the bottom insulation structure 154 are formed to cover the plurality of nanosheets N1, N2, N3, and N4 and the exposed surfaces of the fin-type active area FA.

According to embodiments, the gate dielectric layer 152 and the bottom insulation structure 154 may be formed simultaneously. At least a portion of the bottom insulation structure 154 may be formed of the same material as that used to form the gate dielectric layer 152. The gate dielectric layer 152 and the bottom insulation structure 154 may be formed via ALD.

When a vertical separation distance between the upper surface of the fin-type active area FA and the first nanosheet N1 is less than or equal to ½ of a vertical separation distance between the first through fourth nanosheets N1, N2, N3, and N4, a separation space between the upper surface FT of the fin-type active area FA and the first nanosheet N1 may be filled with the bottom insulation structure 154 while the gate dielectric layer 152 is being formed between the first through fourth nanosheets N1, N2, N3, and N4. As shown in FIG. 25B, the bottom insulation structure 154 may be formed to include the first insulation portion 154A filling the space between the fin-type active area FA and the first nanosheet N1, and the second insulation portion 154B covering the isolation layers 114.

Figure 26A:
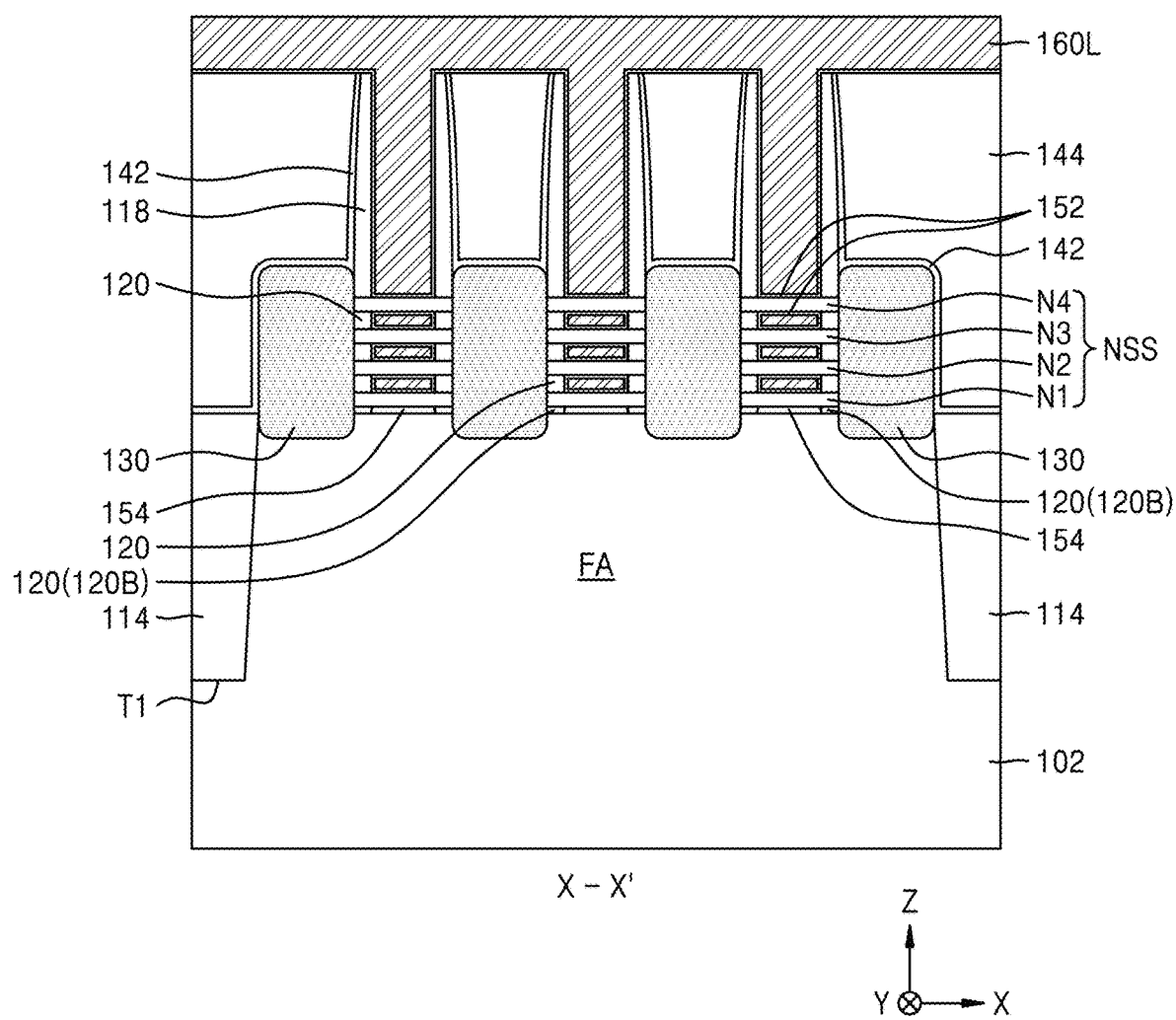
Figure 26B:
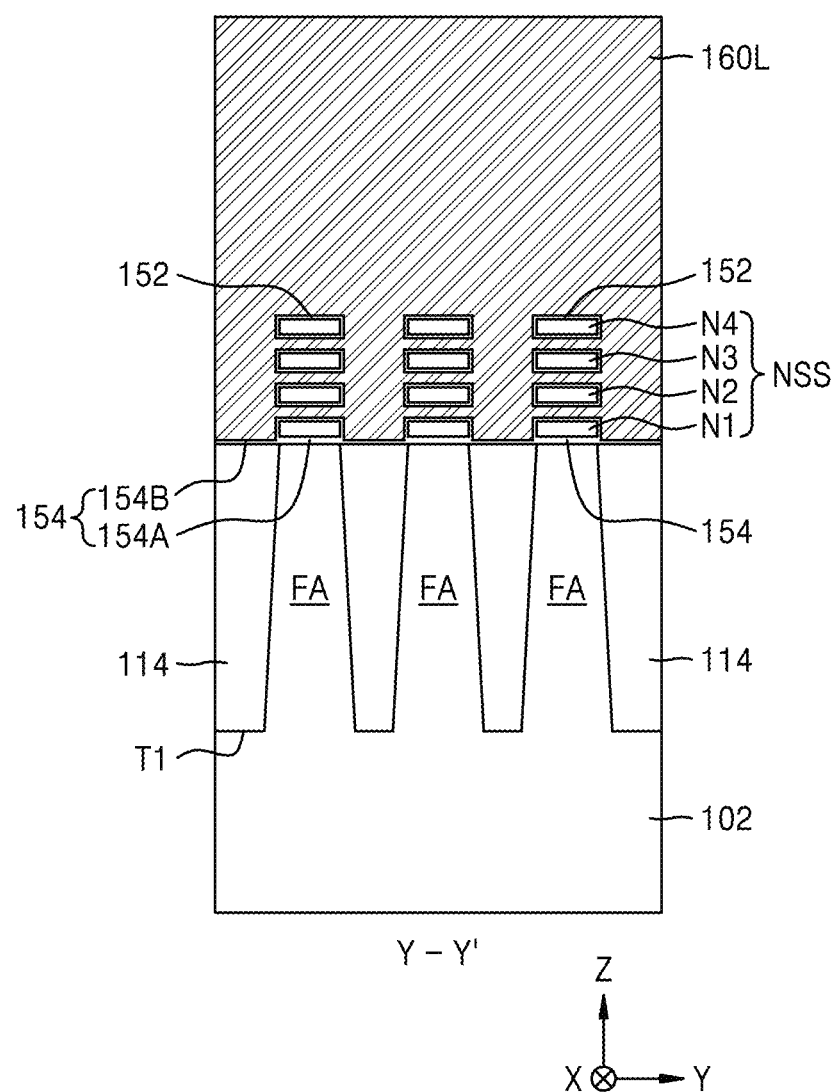

Referring to FIGS. 26A and 26B, a gate forming conductive layer 160L is formed to cover the upper surface of the inter-gate insulation layer 144 while filling the gate spaces GS (see FIGS. 25A and 25B) on the gate dielectric layer 152 and the bottom insulation structure 154.

The gate forming conductive layer 160L may be formed of metal, metal nitride, metal carbide, or a combination thereof. The gate forming conductive layer 160L may be formed via ALD.

Figure 27A:
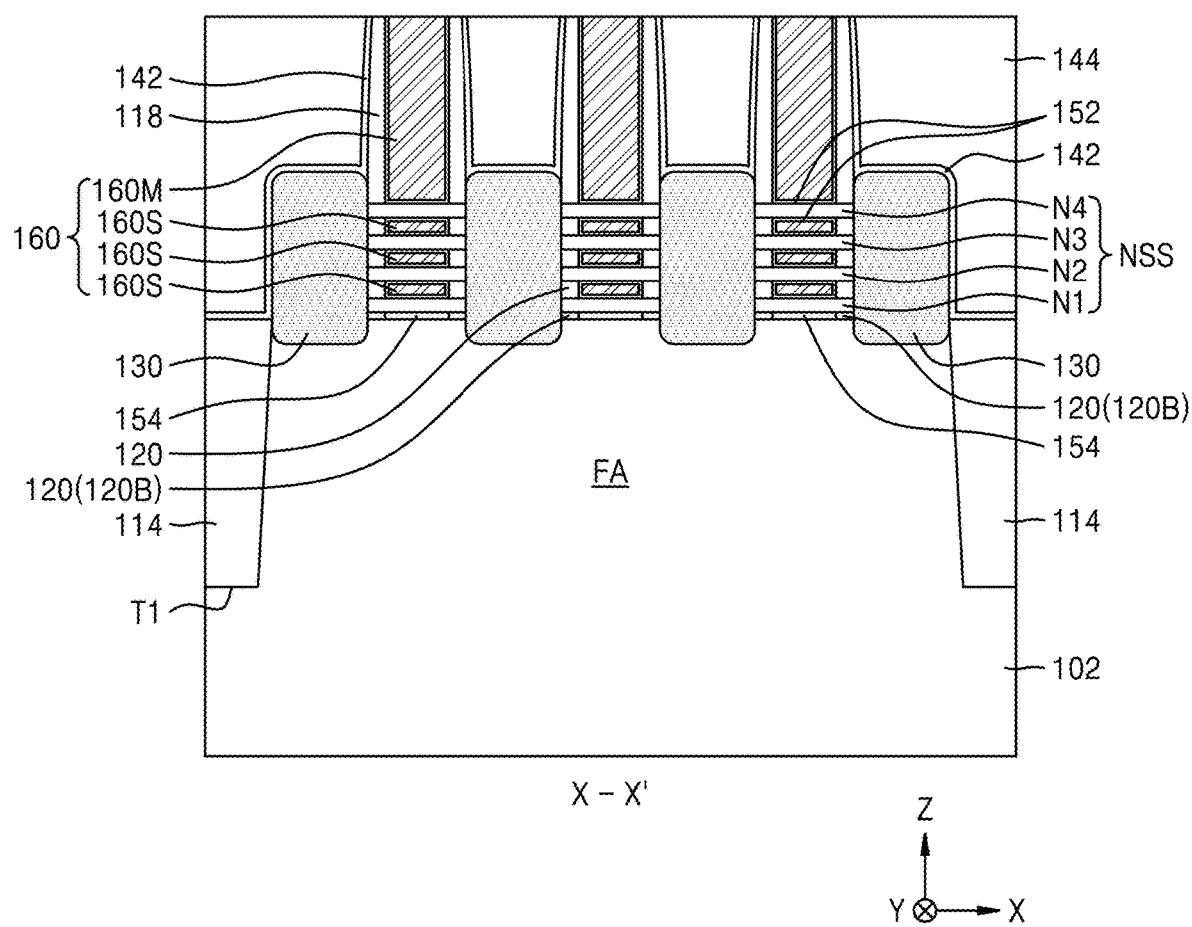
Figure 27B:
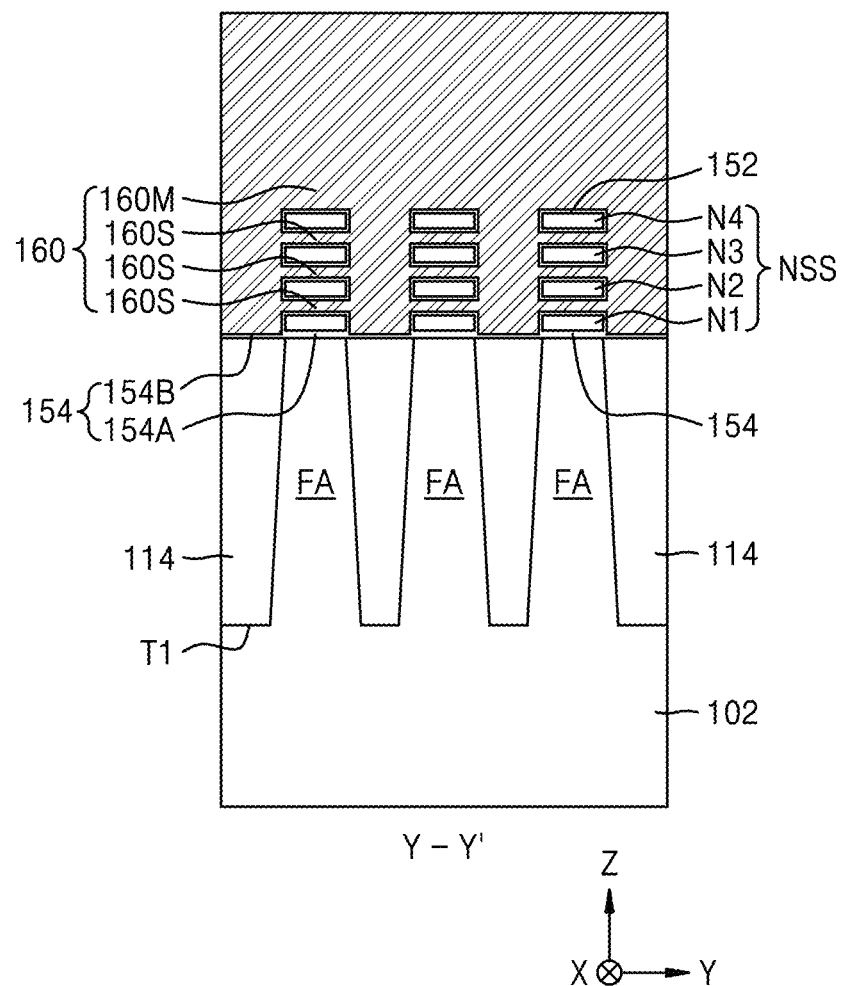

Referring to FIGS. 27A and 27B, the plurality of gate lines 160 are formed by partially removing the gate forming conductive layer 160L, starting from an upper surface thereof, from a resultant structure of FIGS. 26A and 26B until the upper surface of the inter-gate insulation layer 144 is exposed. The plurality of gate lines 160 may include the main gate portion 160M and the plurality of sub-gate portions 160S. Because the space between the fin-type active area FA and the first nanosheet N1 is filled with the bottom insulation structure 154, the gate lines 160 may not extend to the space between the upper surface FT of the fin-type active area FA and the first nanosheet N1. Because planarization is performed while the plurality of gate lines 160 are being formed, respective heights of the protective insulation layer 142 and the inter-gate insulation layer 144 may decrease.

Figure 28A:
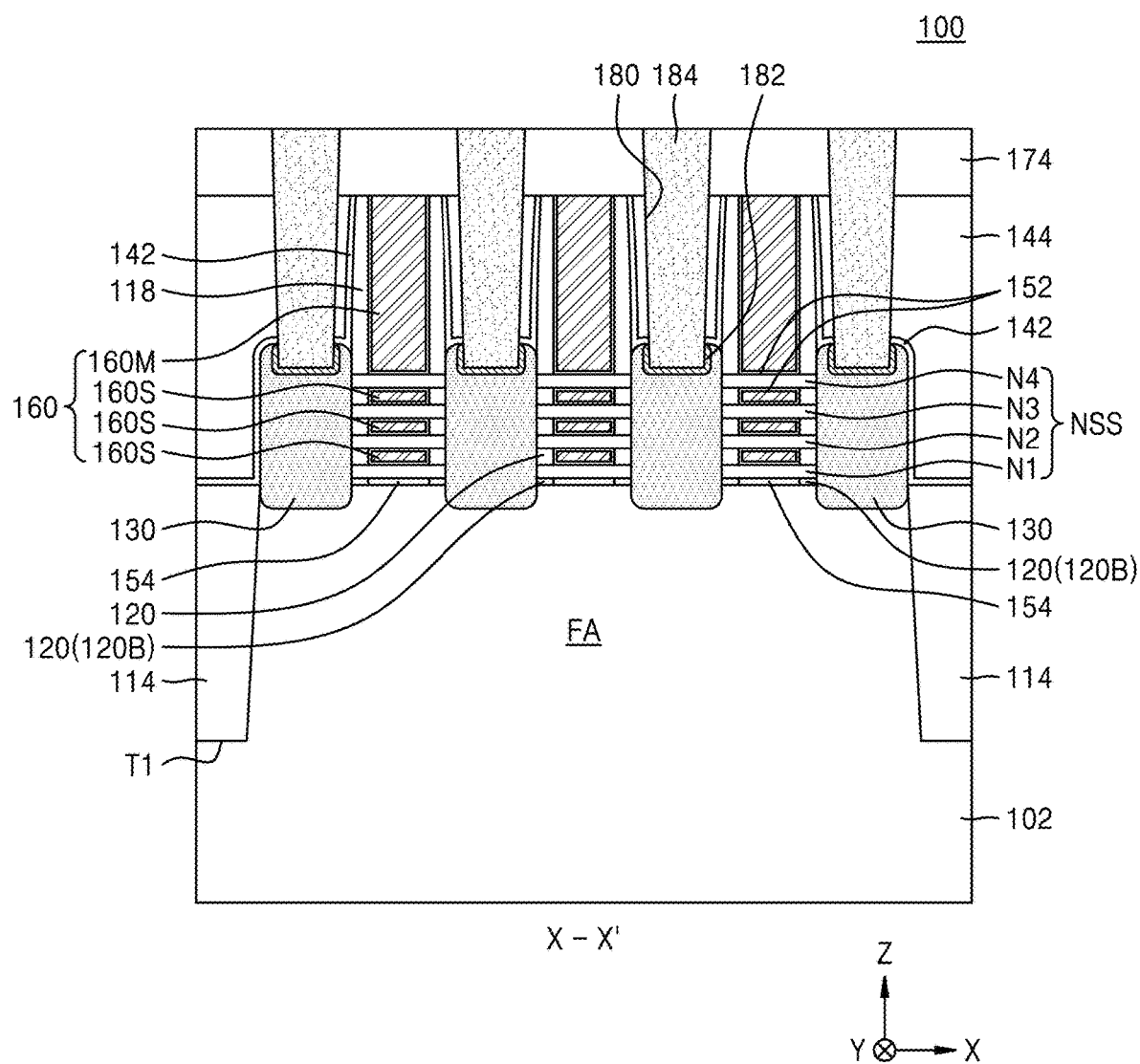
Figure 28B:
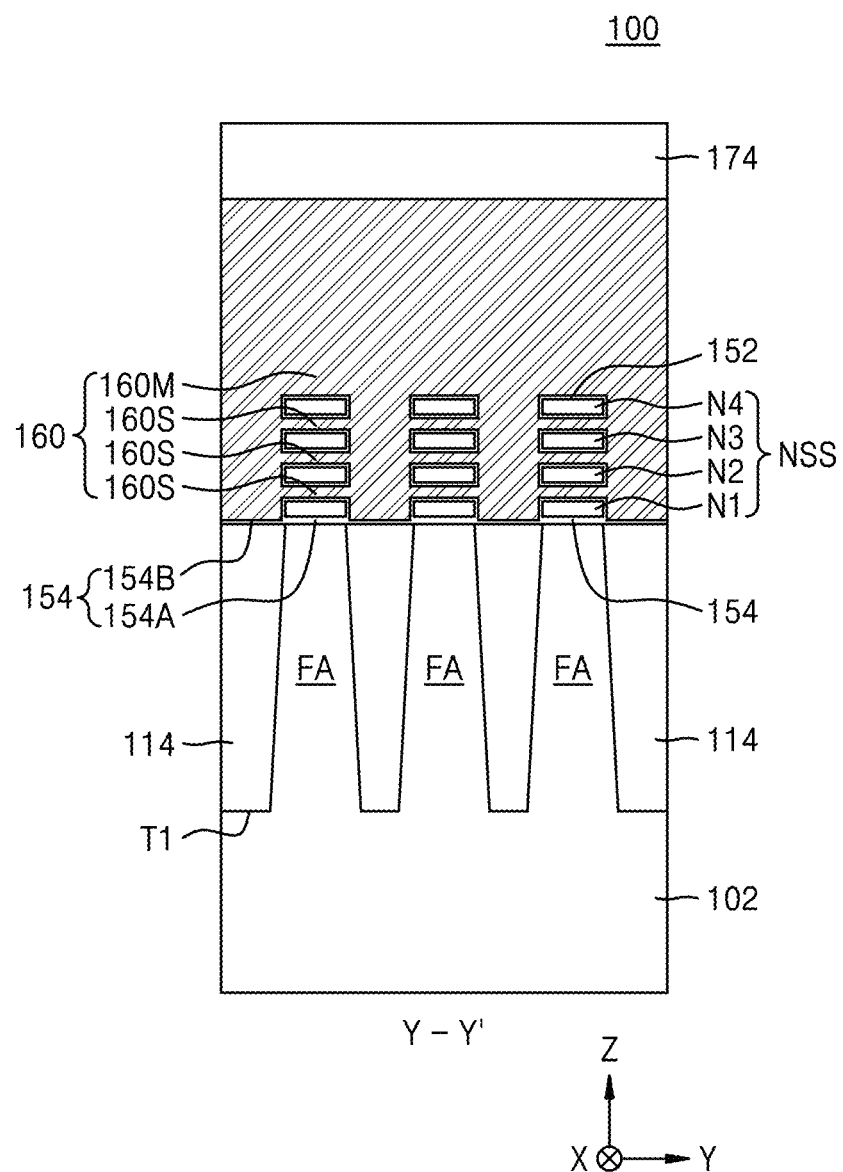

Referring to FIGS. 28A and 28B, a plurality of contact holes 180 exposing the plurality of source/drain regions 130 are formed by forming the interlayer insulation layer 174 covering the plurality of gate lines 160 and then partially etching the interlayer insulation layer 174 and the inter-gate insulation layer 144. The metal silicide layers 182 are formed on respective upper surfaces of the plurality of source/drain regions 130 exposed via the plurality of contact holes 180, and the contact plugs 184 are formed to fill the contact holes 180. In this way, the IC device 100 of FIGS. 1 through 3B may be formed.

According to the IC device manufacturing method described above with reference to FIGS. 11 through 28B, while the gate dielectric layer 152 is being formed on respective surfaces of the first through fourth nanosheets N1, N2, N3, and N4, the bottom insulation structure 154 having a larger thickness in a vertical direction than the gate dielectric layer 152 may be easily formed within a space between the fin-type active area FA and the first nanosheet N1. Accordingly, formation of an unwanted channel around the upper surface FT of the fin-type active area FA facing the lower surface of the first nanosheet N1 may be suppressed, and thus degradation of electrical characteristics may be suppressed.

The IC device 200 of FIGS. 4A and 4B may be manufactured according to the method described above with reference to FIGS. 11 through 28B. However, in the process of FIG. 11, the sacrificial semiconductor layer 104B closest to the substrate 102 from among the plurality of sacrificial semiconductor layers 104 may be formed to have a height that is less than that of each of the other sacrificial semiconductor layers 104 and is greater than two times the first thickness TH11 of the gate dielectric layer 152. Moreover, in the process of FIGS. 25A and 25B, the bottom insulation structure 254 of FIGS. 4A and 4B may be formed instead of the bottom insulation structure 154. The first insulation portion 254A and the second insulation portion 254B may be formed simultaneously with the formation of the gate dielectric layer 152. While the first insulation portion 254A is being formed, the air gap 254AG of which the upper limit and the lower limit are defined by the first insulation portion 254A may be formed in the space between the first nanosheet N1 and the fin-type active area FA. Thereafter, the gate lines 160 may be formed according to the method described above with reference to FIGS. 26A through 27B. While each of the gate lines 160 is being formed, a portion of the material used to form the gate line 160 flows toward an empty space between the lower surface of the first nanosheet N1 and the fin-type active area FA, and thus the protrusion 160P of the gate line 160 is formed. Consequently, the Y direction width of the air gap 254AG may be defined by the protrusion 160P.

The IC device 300 of FIGS. 5A and 5B may be manufactured according to the method described above with reference to FIGS. 11 through 28B. However, in the process of FIG. 11, the nanosheet semiconductor layer NS closest to the substrate 102 from among the plurality of nanosheet semiconductor layers NS may be formed to have a height (size in the Z direction) that is less than that of each of the other nanosheet semiconductor layers 104.

Figure 29A:
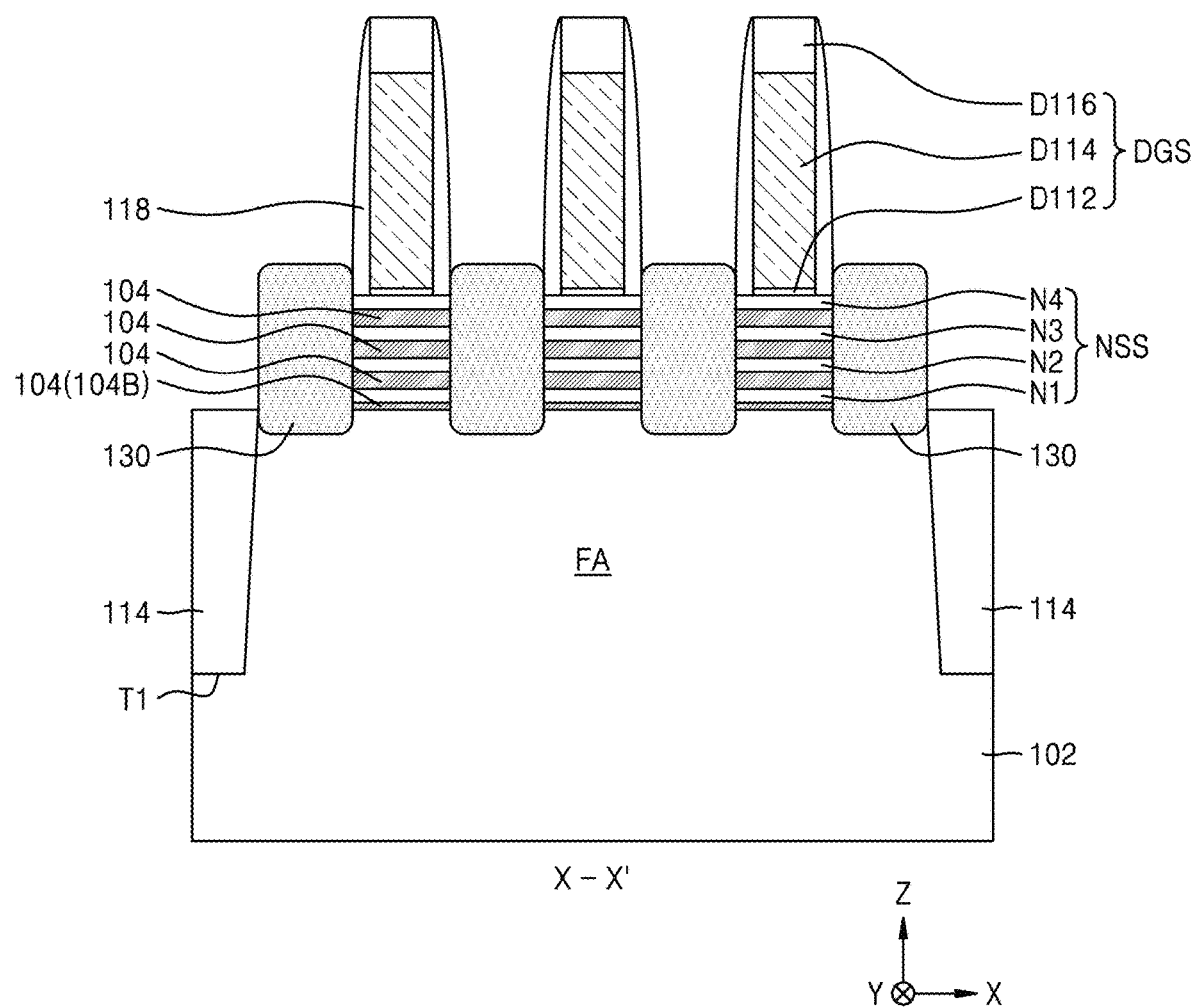
FIGS. 29A through 29C are cross-sectional views for explaining a method of manufacturing an IC device, according to embodiments.
Figure 29B:
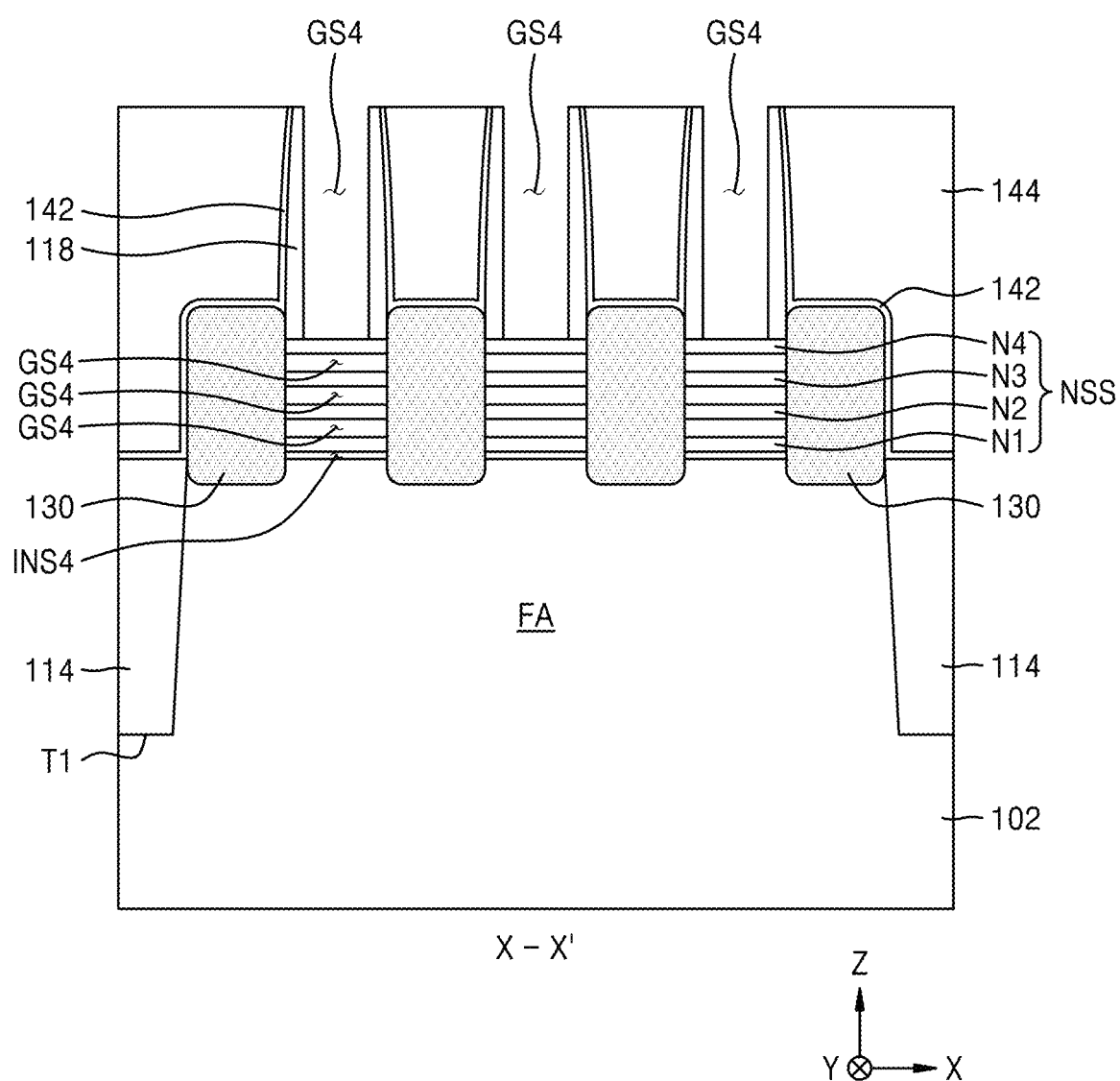
Figure 29C:
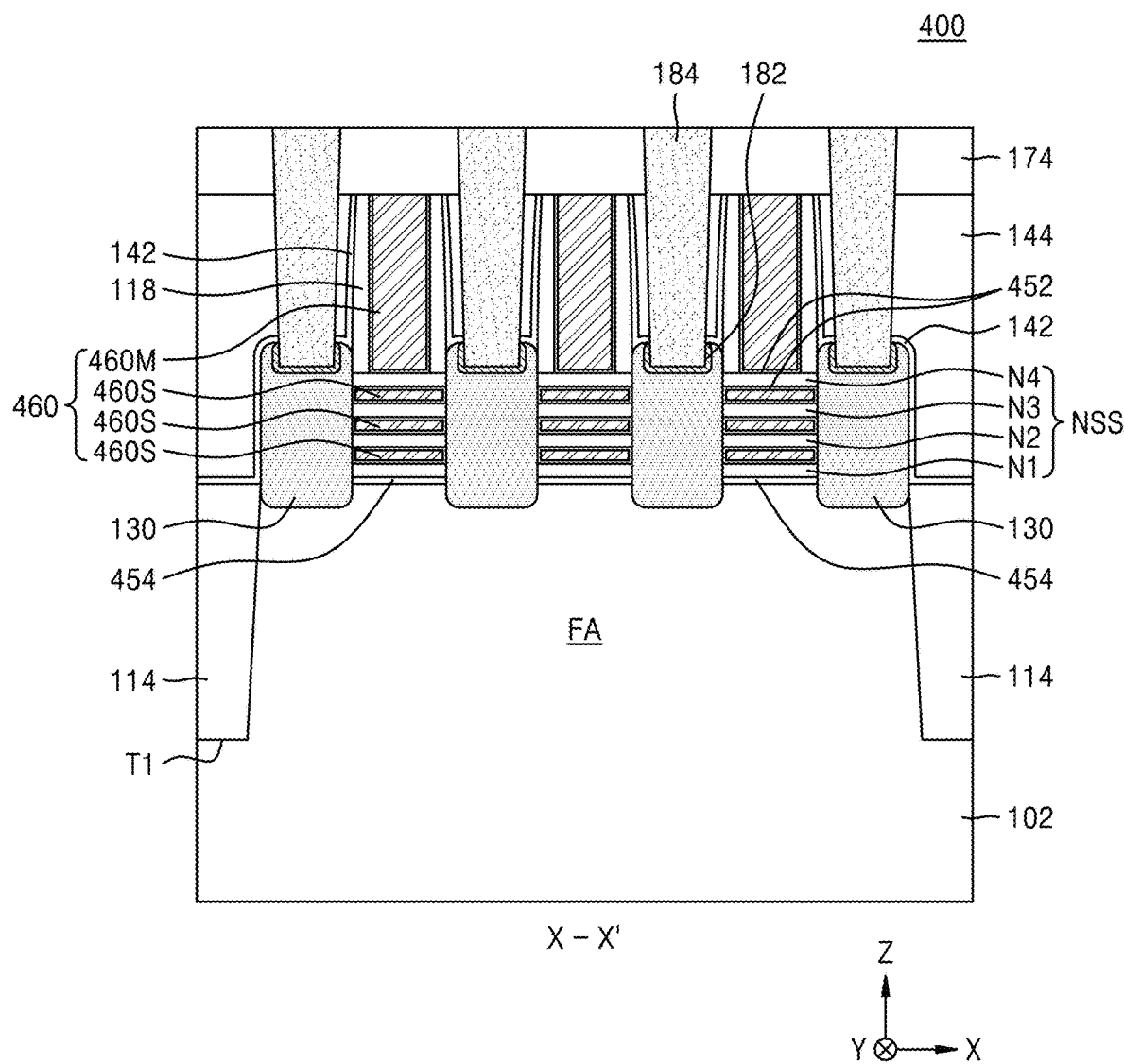

FIGS. 29A through 29C are cross-sectional views for explaining a method of manufacturing an IC device, according to embodiments. A method of manufacturing the IC device 400 of FIG. 6 will now be described with reference to FIGS. 29A through 29C. FIGS. 29A through 29C illustrate cross-sectional structures of a portion of the IC device 400 corresponding to the cross-section taken along line X-X' of FIG. 1, according to manufacturing processes. The same reference characters and numerals in FIGS. 29A through 29C as those in FIGS. 1 through 28B denote the same elements, and thus their description will be omitted herein.

Referring to FIG. 29A, the first insulation spacers 118 covering respective both sidewalls of the plurality of dummy gate structures DGS are formed according to the method described above with reference to FIGS. 11 through 17, the plurality of recess regions R1 are formed to expose the upper surface of the fin-type active area FA, and then the plurality of source/drain regions 130 are formed on the fin-type active area FA within the plurality of recess regions R1 according to the method described above with reference to FIG. 20.

The plurality of source/drain regions 130 may be formed to contact respectively sidewalls of the plurality of sacrificial semiconductor layers 104.

Referring to FIG. 29B, gate spaces GS4 are formed by performing the processes described above with reference to FIGS. 21 through 24B with respect to a resultant structure of FIG. 29A, and the plurality of nanosheets N1, N2, N3, and N4 are exposed via the gate spaces GS4. Insulation spaces INS4 may be formed between the first nanosheets N1 and the fin-type active area FA.

Referring to FIG. 29C, the bottom insulation structure 454 filling the insulation spaces INS4 of FIG. 29B, and the gate dielectric layer 452 are simultaneously formed by performing the processes described above with reference to FIGS. 25A through 27B with respect to a resultant structure of FIG. 29B, and the plurality of gate lines 460 are formed. Thereafter, the IC device 400 of FIG. 6 may be manufactured according to the process described above with reference to FIGS. 28A and 28B.

FIGS. 30A through 30D are cross-sectional views for explaining a method of manufacturing an IC device, according to embodiments of the inventive concept. A method of manufacturing the IC device 500 of FIG. 7 will now be described with reference to FIGS. 30A through 30D. FIGS. 30A through 30D illustrate cross-sectional structures of a portion of the IC device 500 corresponding to the cross-section taken along line X-X' of FIG. 1, according to manufacturing processes. The same reference characters and numerals in FIGS. 30A through 30D as those in FIGS. 1 through 28B denote the same elements, and thus their description will be omitted herein.

Figure 30A:
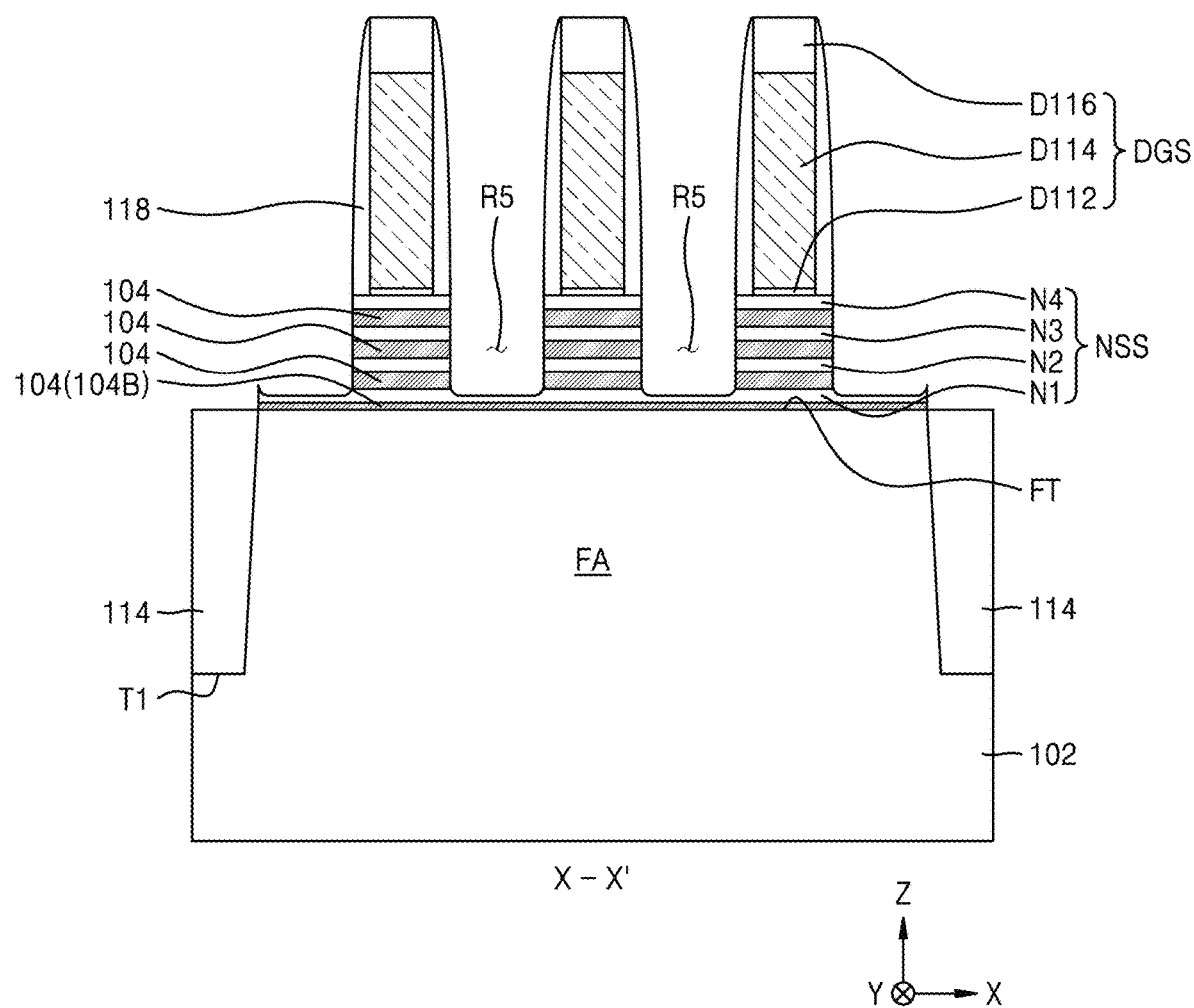
FIGS. 30A through 30D are cross-sectional views for explaining a method of manufacturing an IC device, according to embodiments.

Referring to FIG. 30A, the first insulation spacers 118 covering respective both sidewalls of the plurality of dummy gate structures DGS are formed according to a similar method to the method described above with reference to FIGS. 11 through 17, and a plurality of recess regions R5 are formed to expose the upper surface of the fin-type active area FA. However, in contrast with the plurality of recess regions R1 of FIG. 17, a lower surface level of each of the plurality of recess regions R5 may be higher than that of the first nanosheet N1 closest to the fin-type active area FA from among the plurality of nanosheets N1, N2, N3, and N4. The first nanosheet N1 may be exposed on the lower surface of each of the plurality of recess regions R5.

Figure 30B:
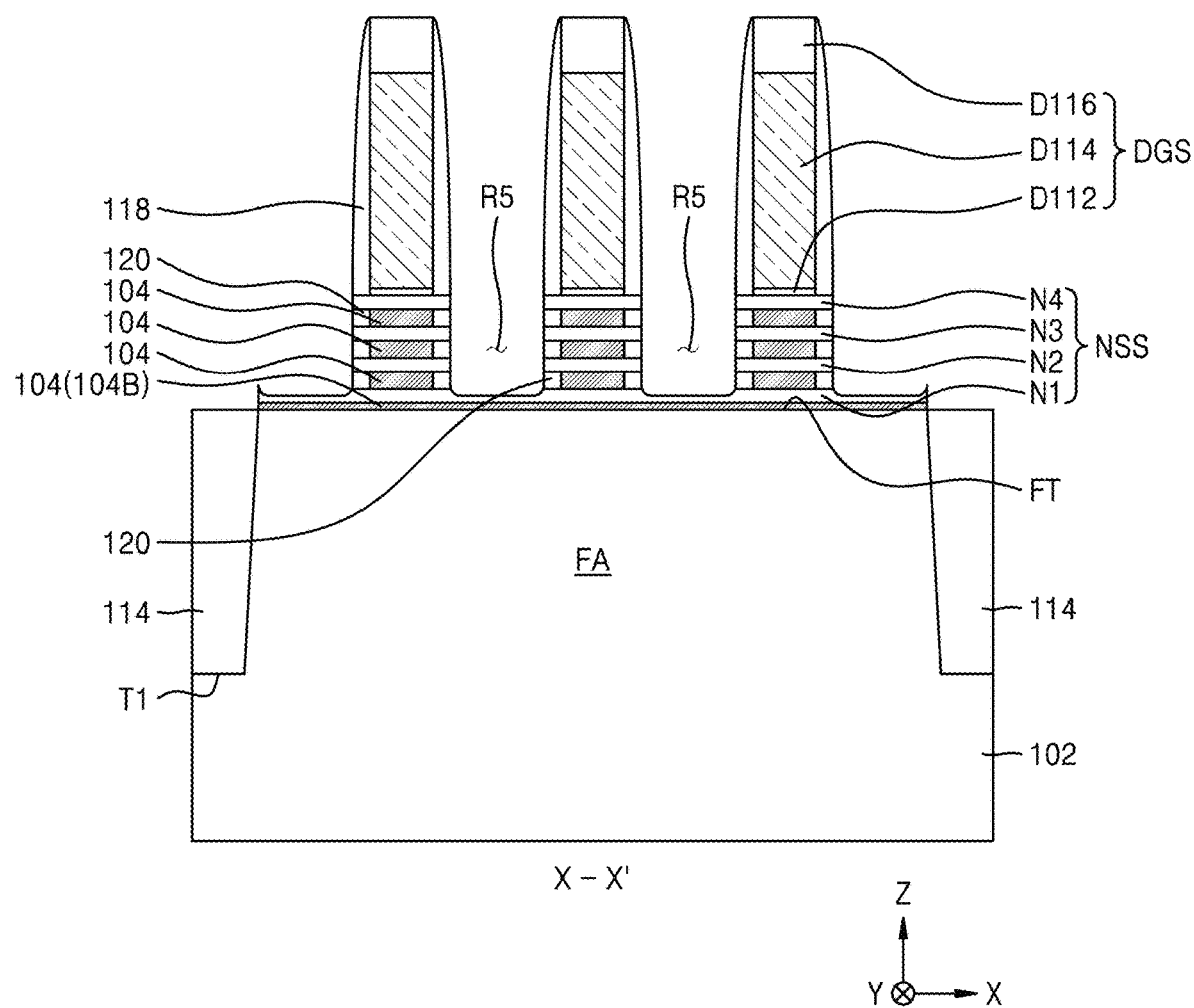

Referring to FIG. 30B, the plurality of second insulation spacers 120 are formed according to a similar method to the method described above with reference to FIGS. 18 and 19. However, the second insulation spacers 120B are not formed between the fin-type active area FA and the first nanosheet N1.

Figure 30C:
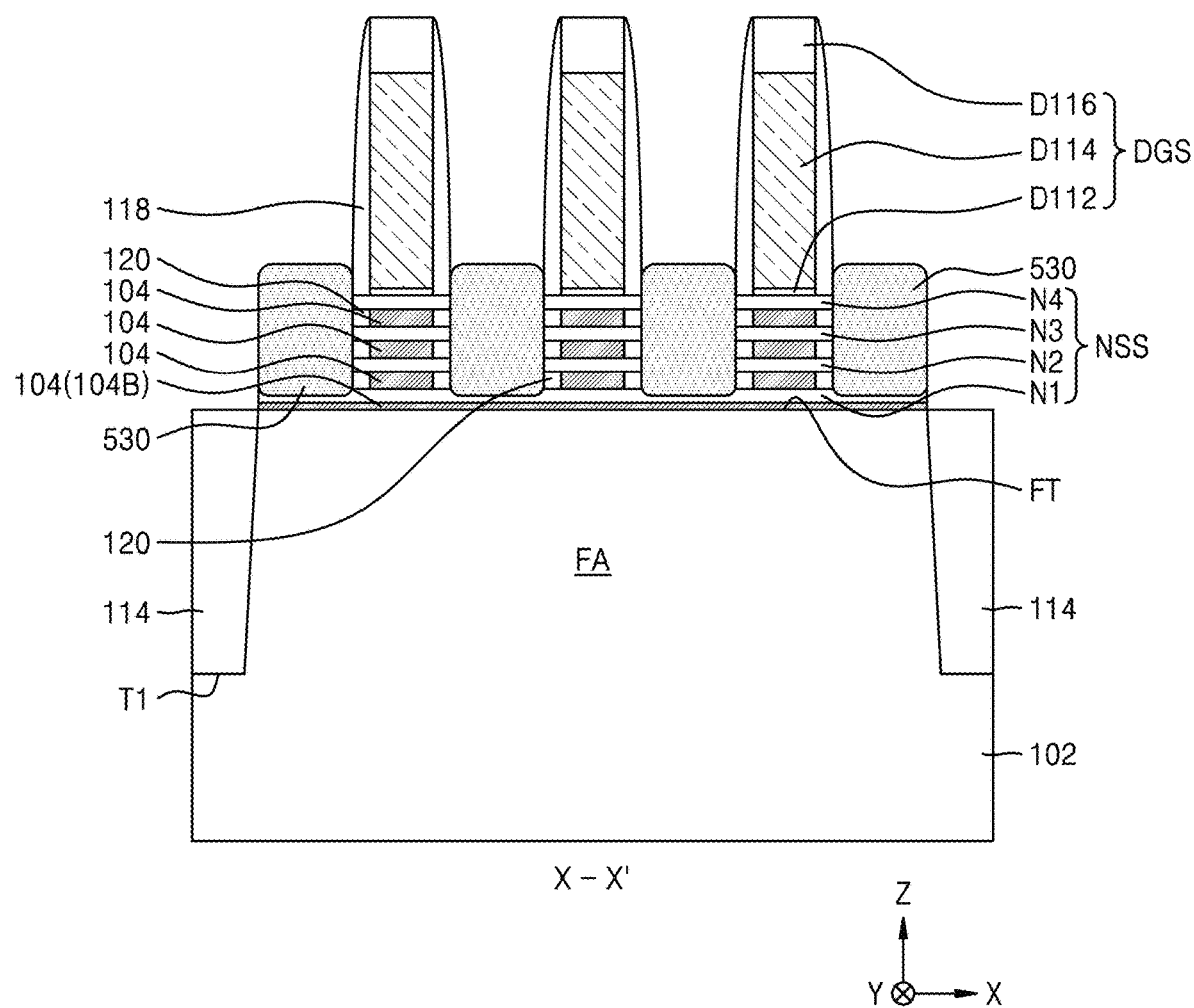

Referring to FIG. 30C, according to a similar method as the method described above with reference to FIG. 20, the plurality of source/drain regions 530 are formed on the first nanosheet N1, within the plurality of recess regions R5.

Figure 30D:
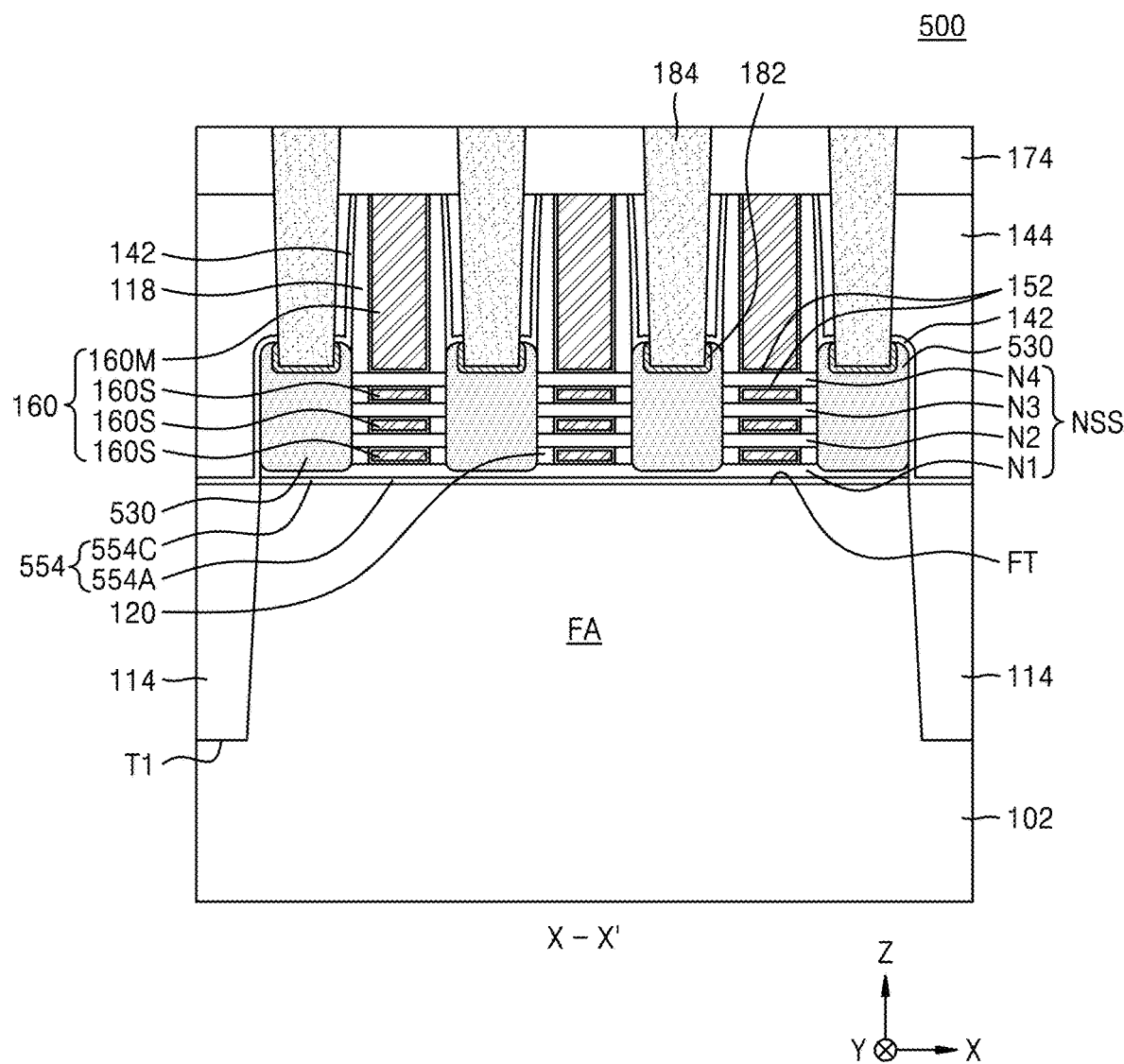

Referring to FIG. 30D, the IC device 500 of FIG. 7 may be manufactured by performing similar processes to those described above with reference to FIGS. 21 through 28B with respect to a resultant structure of FIG. 30C. In particular, while the plurality of sacrificial semiconductor layers 104 remaining on the fin-type active area FA are being removed via the gate spaces GS according to the process described above FIGS. 24A and 24B, the sacrificial semiconductor layer 104B remaining in a resultant structure of FIG. 30C is removed, and thus an insulation space (not shown) exposing the upper surface FT of the fin-type active area FA may be formed. The insulation space may extend to a portion of a region between the fin-type active area FA and the first nanosheet N1, the portion vertically overlapping each source/drain region 530. While the gate dielectric layer 152 is being formed according to the process described above with reference to FIGS. 25A and 25B, the bottom insulation structure 554 may be formed within the insulation space. The bottom insulation structure 554 may be formed to extend to the portion of the region between the fin-type active area FA and the first nanosheet N1, the portion vertically overlapping each source/drain region 530.

The IC device 600 of FIG. 8 may be manufactured according to the processes described above with reference to FIGS. 30A through 30D. However, the bottom insulation structure 654 instead of the bottom insulation structure 554 may be formed in the process described above with reference to FIG. 30D. To this end, while the plurality of sacrificial semiconductor layers 104 remaining on the fin-type active area FA are being removed via the gate spaces GS according to the process described above FIGS. 24A and 24B, only a portion of the sacrificial semiconductor layer 104B remaining in the resultant structure of FIG. 30C may be removed, and the remaining portion of the sacrificial semiconductor layer 104B may remain as the semiconductor pattern 604 between the fin-type active area FA and the source/drain regions 530. As a result, a plurality of insulation spaces (not shown) of which widths in the X direction are defined by a plurality of semiconductor patterns 604 may be formed between the fin-type active area FA and the first nanosheets N1. The insulation spaces may extend to portions of regions between the fin-type active area FA and the first nanosheets N1, the portions vertically overlapping the source/drain regions 530. While the gate dielectric layer 152 is being formed according to the process described above with reference to FIGS. 25A and 25B, a plurality of bottom insulation structures 654 may be formed within the plurality of insulation spaces.

FIGS. 31A through 31D are cross-sectional views for explaining a method of manufacturing an IC device, according to embodiments. A method of manufacturing the IC device 700 of FIG. 9 will now be described with reference to FIGS. 31A through 31D. FIGS. 31A through 31D illustrate cross-sectional structures of a portion of the IC device 500 corresponding to the cross-section taken along line X-X' of FIG. 1, according to manufacturing processes. The same reference characters and numerals in FIGS. 31A through 31D as those in FIGS. 1 through 28B denote the same elements, and thus their description will be omitted herein.

Figure 31A:
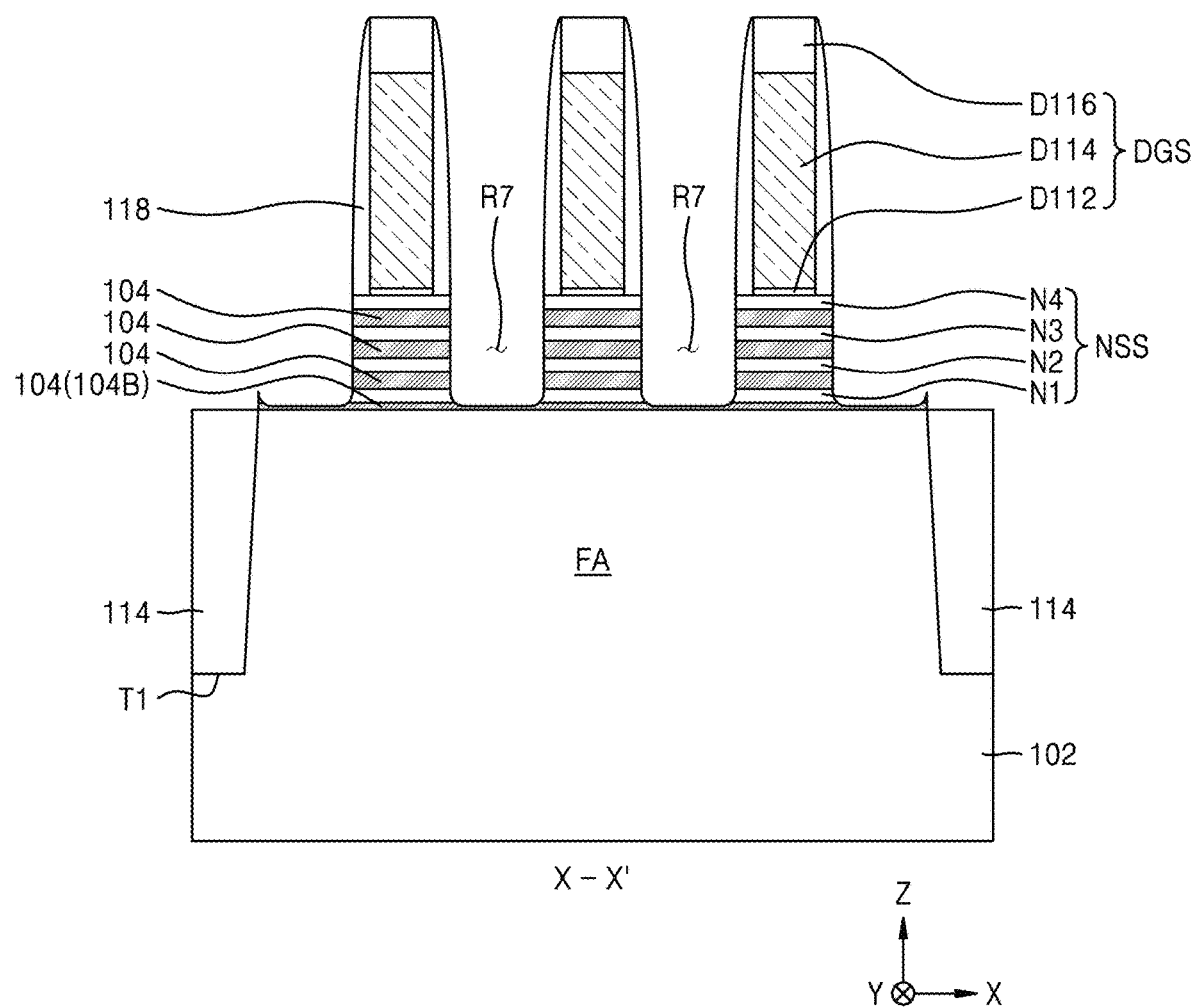
FIGS. 31A through 31D are cross-sectional views for explaining a method of manufacturing an IC device, according to embodiments.

Referring to FIG. 31A, the first insulation spacers 118 covering respective both sidewalls of the plurality of dummy gate structures DGS are formed according to a similar method to the method described above with reference to FIGS. 11 through 17, and a plurality of recess regions R7 are formed to expose the upper surface of the fin-type active area FA. However, in contrast with the plurality of recess regions R1 of FIG. 17, a lower surface level of each of the plurality of recess regions R7 may be higher than that of the upper surface FT of the fin-type active area FA. The sacrificial semiconductor layer 104B closest to the substrate 102 from among the plurality of sacrificial semiconductor layers 104 may be exposed on the lower surface of each of the plurality of recess regions R7.

Figure 31B:
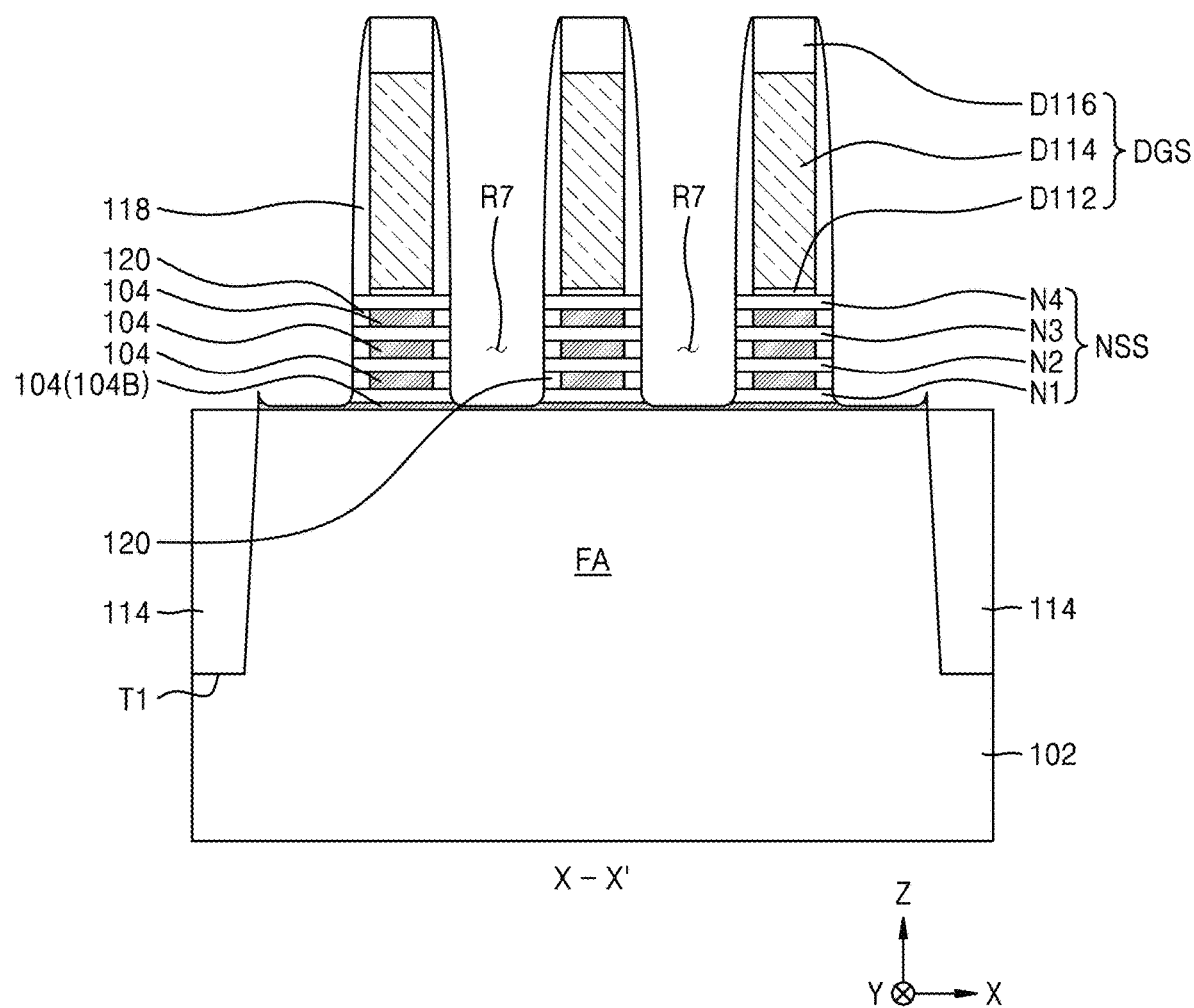

Referring to FIG. 31B, the plurality of second insulation spacers 120 are formed according to a similar method to the method described above with reference to FIGS. 18 and 19. However, the second insulation spacers 120B are not formed between the fin-type active area FA and the first nanosheets N1.

According to embodiments, the sacrificial semiconductor layer 104B closest to the substrate 102 from among the plurality of sacrificial semiconductor layers 104 may be formed of a material having a different etch selectivity from that of each of the other sacrificial semiconductor layers 104. In this case, while the plurality of indented regions 104D are being formed between the plurality of nanosheets N1, N2, N3, and N4 as described above with reference to FIG. 18 in order to form the plurality of second insulation spacers 120, the amount of consumption of the sacrificial semiconductor layer 104B exposed on the lower surface of each of the recess regions R7 may be minimized, and thus the fin-type active area FA may not be exposed on the lower surface of each of the recess regions R7.

According to embodiments, the sacrificial semiconductor layer 104B closest to the substrate 102 from among the plurality of sacrificial semiconductor layers 104 may be formed of the same material as that used to form the other sacrificial semiconductor layers 104. In this case, while the plurality of indented regions 104D are being formed between the plurality of nanosheets N1, N2, N3, and N4 as described above with reference to FIG. 18, the sacrificial semiconductor layer 104B exposed on the lower surface of each of the recess regions R7 may also be etched, and thus the fin-type active area FA may be exposed on the lower surface of each of the recess regions R7. In this case, in a process which will be described later with reference to FIG. 31C, source/drain regions (not shown) having lower surfaces that contact the fin-type active area FA may be obtained instead of the source/drain regions 730.

Figure 31C:
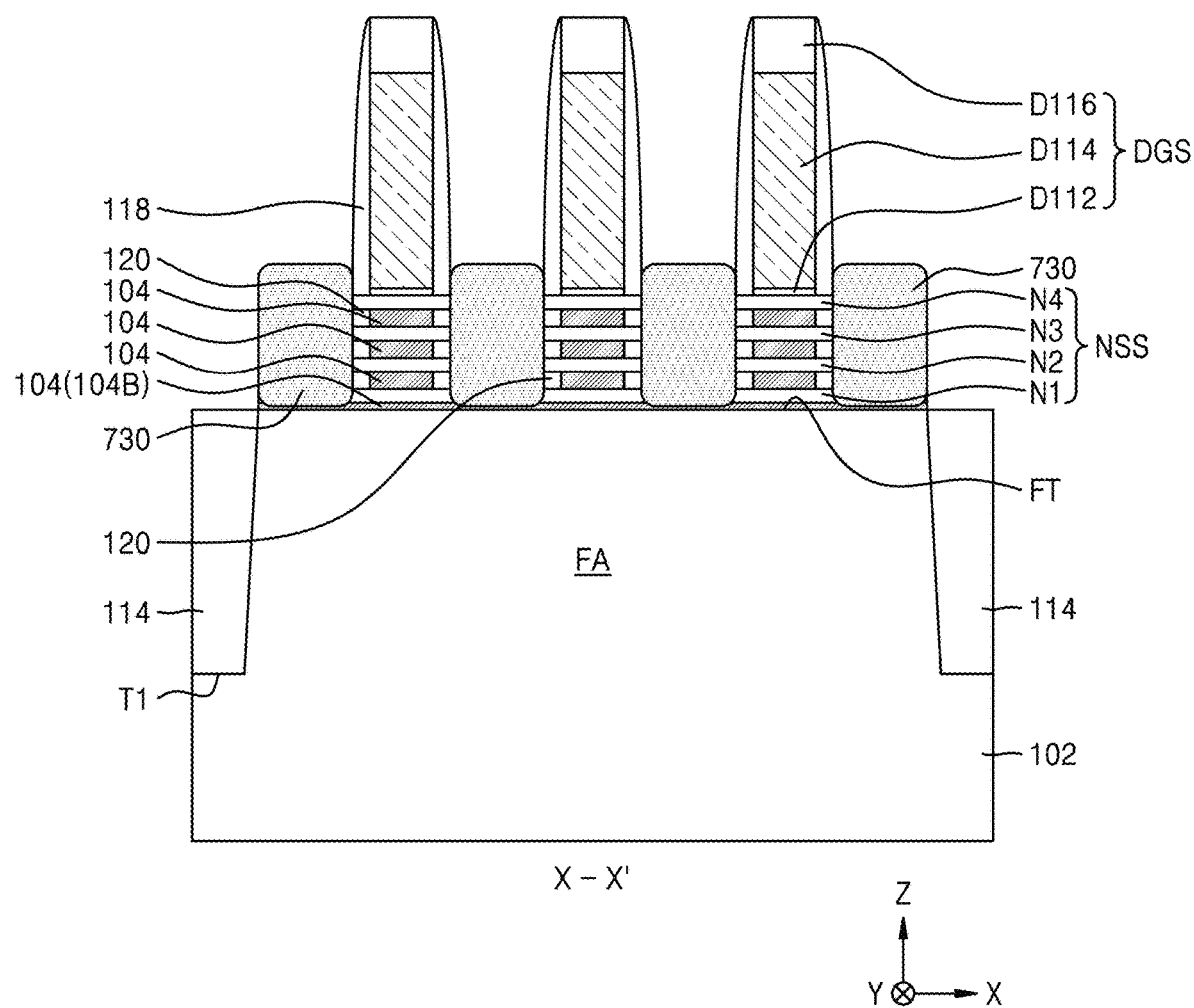

Referring to FIG. 31C, by performing a similar method as the method described above with reference to FIG. 20 with respect to a resultant structure of FIG. 31B, the plurality of source/drain regions 730 are formed on the sacrificial semiconductor layer 104B, within the plurality of recess regions R7.

Figure 31D:
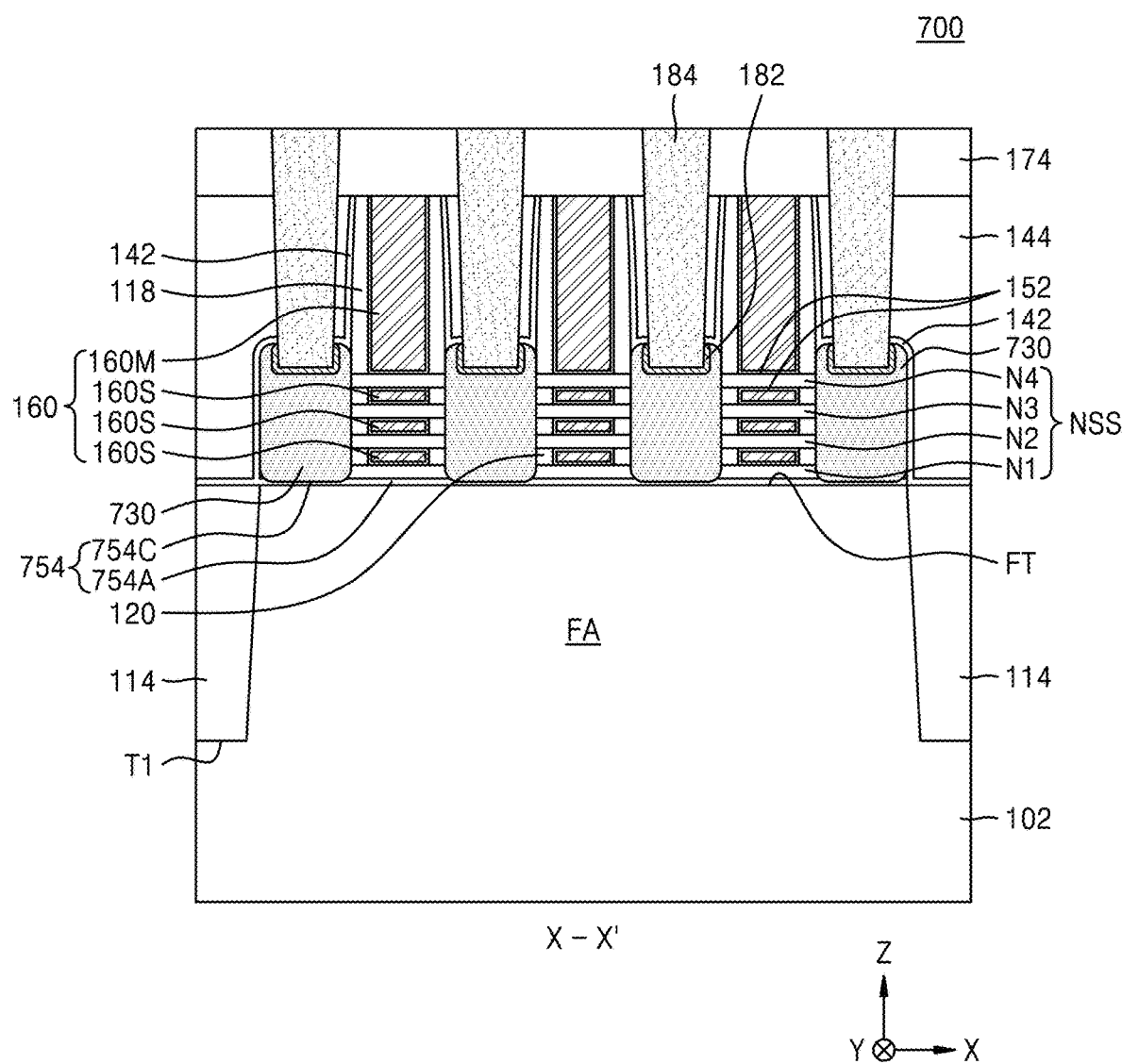

Referring to FIG. 31D, the IC device 700 of FIG. 9 may be manufactured by performing similar processes to those described above with reference to FIGS. 21 through 28B with respect to a resultant structure of FIG. 31C. In particular, while the plurality of sacrificial semiconductor layers 104 remaining on the fin-type active area FA are being removed via the gate spaces GS according to the process described above FIGS. 24A and 24B, the sacrificial semiconductor layer 104B remaining in the resultant structure of FIG. 31C is removed, and thus an insulation space (not shown) exposing the upper surface FT of the fin-type active area FA may be formed. The insulation space may extend to a region between the source/drain regions 730 and the fin-type active area FA. While the gate dielectric layer 152 is being formed according to the process described above with reference to FIGS. 25A and 25B, the bottom insulation structure 754 may be formed within the insulation space. The bottom insulation structure 754 may be formed to extend to portions of regions between the source/drain regions 730 and the fin-type active area FA, the portions vertically overlapping the source/drain regions 730.

The IC device 800 of FIG. 10 may be manufactured according to the processes described above with reference to FIGS. 31A through 31D. However, the bottom insulation structure 854 instead of the bottom insulation structure 754 may be formed in the process described above with reference to FIG. 31D. To this end, while the plurality of sacrificial semiconductor layers 104 remaining on the fin-type active area FA are being removed via the gate spaces GS according to the process described above FIGS. 24A and 24B, only a portion of the sacrificial semiconductor layer 104B remaining in the resultant structure of FIG. 31C may be removed, and the remaining portion of the sacrificial semiconductor layer 104B may remain as the semiconductor pattern 804 between the upper surface FT of the fin-type active area FA and the source/drain regions 730. As a result, a plurality of insulation spaces (not shown) of which widths in the X direction are defined by a plurality of semiconductor patterns 804 may be formed between the fin-type active area FA and the first nanosheets N1. The insulation space may extend to a portion of the region between the source/drain regions 730 and the fin-type active area FA. While the gate dielectric layer 152 is being formed according to the process described above with reference to FIGS. 25A and 25B, a plurality of bottom insulation structures 854 may be formed within the plurality of insulation spaces.

According to the IC device manufacturing methods described above with reference to FIGS. 29A through 31B, a structure capable of suppressing degradation of electrical characteristics by suppressing formation of an unwanted channel around an upper surface of a fin-type active area may be provided.

Although the methods of manufacturing the IC devices 100 through 700 of FIGS. 1 through 10 have been described above with reference to FIGS. 11 through 31D, other IC devices having various structures may be manufactured via various modifications made within the technical spirit of the inventive concept.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a fin-type active area protruding from a substrate and extending in a first horizontal direction;
a first nanosheet disposed above an upper surface of the fin-type active area with a first separation space therebetween;
a second nanosheet disposed above the first nanosheet with a second separation space therebetween;
a gate line extending on the substrate in a second horizontal direction intersecting the first horizontal direction, the gate line having a sub-gate portion disposed in the second separation space;
a source/drain region disposed on the fin-type active area and in contact with the first nanosheet and the second nanosheet, a first level of a lower surface of the source/drain region being higher than a second level of the upper surface of the fin-type active area; and
a bottom insulation structure disposed in the first separation space,
wherein no portion of the gate line is disposed in the first separation space.

2. The integrated circuit device of claim 1, wherein the bottom insulation structure includes:
a first insulation portion that fills the first separation space between the first nanosheet and the fin-type active area; and
a second insulation portion extending from a side of the first insulation portion in the first horizontal direction and interposed between the fin-type active area and the source/drain region.

3. The integrated circuit device of claim 2, wherein the first insulation portion and the second insulation portion are integrally connected to each other, and have the same thickness as each other.

4. The integrated circuit device of claim 1, wherein an upper surface of the first nanosheet contacts the lower surface of the source/drain region.

5. The integrated circuit device of claim 1, wherein the first level of the lower surface of the source/drain region is higher than a third level of an upper surface of the bottom insulation structure.

6. The integrated circuit device of claim 1, wherein the first nanosheet includes a first portion that is vertically overlapped by the source/drain region and a second portion that is vertically overlapped by the gate line, and a first thickness of the first portion of the first nanosheet is less than a second thickness of the second portion of the first nanosheet.

7. The integrated circuit device of claim 1, wherein the lower surface of the source/drain region is spaced apart from the upper surface of the fin-type active area with the first nanosheet and the bottom insulation structure between the source/drain region and the fin-type active area.

8. The integrated circuit device of claim 1, further comprising:
a semiconductor pattern interposed between the upper surface of the fin-type active area and the source/drain region,
wherein a width of the bottom insulation structure in the first horizontal direction is defined by the semiconductor pattern.

9. The integrated circuit device of claim 8, wherein the source/drain region is separated from the fin-type active area with the semiconductor pattern and the first nanosheet between the source/drain region and the fin-type active area, and
wherein the semiconductor pattern and the first nanosheet are formed of different materials.

10. The integrated circuit device of claim 8, wherein the source/drain region is separated from the fin-type active area with the semiconductor pattern between the source/drain region and the fin-type active area, and
wherein a width of the semiconductor pattern in the first horizontal direction is less than a width of the source/drain region in the first horizontal direction.

11. The integrated circuit device of claim 1, wherein the bottom insulation structure includes:
a first insulation portion that fills the first separation space between the first nanosheet and the fin-type active area; and
a second insulation portion extending from a side of the first insulation portion in the first horizontal direction and interposed between the fin-type active area and the source/drain region,
wherein the first insulation portion has a first thickness in a vertical direction, and the second insulation portion has a second thickness in the vertical direction, the second thickness being less than the first thickness.

12. The integrated circuit device of claim 1, wherein the bottom insulation structure includes a first portion that is vertically overlapped by the source/drain region and a second portion that is vertically overlapped by the gate line, and a first thickness of the first portion of the bottom insulation structure is less than a second thickness of the second portion of the bottom insulation structure.

13. An integrated circuit device comprising:
a fin-type active area protruding from a substrate and extending in a first horizontal direction;
a pair of source/drain regions disposed on the fin-type active area, a first level of a lower surface of each of the pair of source/drain regions being higher than a second level of an upper surface of the fin-type active area;
a nanosheet stack structure facing the upper surface of the fin-type active area with a first separation space between the nanosheet stack structure and the upper surface of the fin-type active area, the nanosheet stack structure comprising a plurality of nanosheets disposed between the pair of source/drain regions;
a gate line extending on the fin-type active area in a second horizontal direction intersecting the first horizontal direction and having a sub-gate portion disposed in a second separation space between two nanosheets from among the plurality of nanosheets;
a gate dielectric layer interposed between the plurality of nanosheets and the gate line; and
a bottom insulation structure in the first separation space, wherein no portion of the gate line is disposed in the first separation space.

14. The integrated circuit device of claim 13, wherein the bottom insulation structure includes:
a first insulation portion that fills the first separation space between the nanosheet stack structure and the fin-type active area; and
a second insulation portion extending from a side of the first insulation portion in the first horizontal direction and interposed between the fin-type active area and each of the pair of source/drain regions.

15. The integrated circuit device of claim 13, wherein an upper surface of the first nanosheet contacts the lower surface of each of the pair of source/drain regions.

16. The integrated circuit device of claim 13, wherein the nanosheet stack structure includes a first nanosheet closest to the fin-type active area from among the plurality of nanosheets,
wherein the first nanosheet includes a pair of first portions that are vertically overlapped by the pair of source/drain regions, respectively, and a second portion that is vertically overlapped by the gate line, and
wherein a first thickness of each of the pair of first portions of the first nanosheet is less than a second thickness of the second portion of the first nanosheet.

17. The integrated circuit device of claim 13, further comprising:
a pair of semiconductor patterns interposed between the upper surface of the fin-type active area and the pair of source/drain regions,
wherein a width of the bottom insulation structure in the first horizontal direction is defined by the pair of semiconductor patterns.

18. The integrated circuit device of claim 13, wherein the bottom insulation structure includes:
a first insulation portion that fills the first separation space between the nanosheet stack structure and the fin-type active area; and
a second insulation portion extending from a side of the first insulation portion in the first horizontal direction and interposed between the fin-type active area and one of the pair of source/drain regions,
wherein the first insulation portion has a first thickness in a vertical direction, and the second insulation portion has a second thickness in the vertical direction, the second thickness being less than the first thickness.

19. An integrated circuit device comprising:
a fin-type active area extending on a substrate in a first horizontal direction;
a source/drain region disposed on the fin-type active area;

a nanosheet stack structure disposed on the fin-type active area, the nanosheet stack structure comprising a first nanosheet and a second nanosheet, wherein the first nanosheet is closer to the fin-type active area than the second nanosheet;

a gate line covering the nanosheet stack structure on the fin-type active area, and extending in a second horizontal direction intersecting the first horizontal direction;

a gate dielectric layer disposed between the nanosheet stack structure and the gate line; and a bottom insulation structure interposed between the fin-type active area and the first nanosheet, and integrally connected to the gate dielectric layer, wherein a first level of a lower surface of the source/drain region being higher than a second level of an upper surface of the fin-type active area, and wherein no portion of the gate line is disposed between the fin-type active area and the first nanosheet.

20. The integrated circuit device of claim 19, wherein the bottom insulation structure includes:

a first insulation portion that fills a space between the first nanosheet and the fin-type active area; and a second insulation portion extending from a side of the first insulation portion in the first horizontal direction and interposed between the fin-type active area and the source/drain region.

* * * * *